United States Patent
Khlat

(10) Patent No.: US 9,247,496 B2
(45) Date of Patent: Jan. 26, 2016

(54) POWER LOOP CONTROL BASED ENVELOPE TRACKING

(71) Applicant: RF Micro Devices, Inc., Greensboro, NC (US)

(72) Inventor: Nadim Khlat, Cugnaux (FR)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 14/072,120

(22) Filed: Nov. 5, 2013

(65) Prior Publication Data

US 2014/0057684 A1 Feb. 27, 2014

Related U.S. Application Data

(63) Continuation-in-part of application No. PCT/US2012/036858, filed on May 7, 2015, which is a continuation-in-part of application No. 13/218,400, filed as application No. PCT/US2011/049243 on Aug.

(Continued)

(51) Int. Cl.
*H03C 1/02* (2006.01)
*H04W 52/02* (2009.01)
(Continued)

(52) U.S. Cl.
CPC ............ *H04W 52/0209* (2013.01); *H02M 3/07* (2013.01); *H03F 1/02* (2013.01); *H03F 1/025* (2013.01); *H03F 1/0244* (2013.01); *H03F 1/0277* (2013.01); *H03F 1/42* (2013.01); *H03F 3/195* (2013.01); *H03F 3/245* (2013.01); *H03F 3/3022* (2013.01); *H03F 3/45475* (2013.01);

(Continued)

(58) Field of Classification Search
CPC ............... H04B 2001/0408; H04B 2001/0416; H04B 2001/0433; H04L 27/02; H04W 52/52
USPC ..................................... 455/69, 522
See application file for complete search history.

(56) References Cited

U.S. PATENT DOCUMENTS 3,969,682 A 7/1976 Rossum
3,980,964 A 9/1976 Grodinsky
(Continued)

FOREIGN PATENT DOCUMENTS

CN 1211355 A 3/1999
CN 1518209 A 8/2004
(Continued)

OTHER PUBLICATIONS

Notice of Allowance for U.S. Appl. No. 13/948,291, mailed Feb. 11, 2015, 7 pages.

(Continued)

*Primary Examiner* — Tu X Nguyen
(74) *Attorney, Agent, or Firm* — Withrow & Terranova, P.L.L.C.

(57) ABSTRACT

Configuration-feedback circuitry and transceiver circuitry are disclosed. The configuration-feedback circuitry regulates an output power from a radio frequency power amplifier based on a difference between a target output power from the radio frequency power amplifier and a measured output power from the radio frequency power amplifier. The transceiver circuitry regulates a modulated power supply voltage, which is used by the radio frequency power amplifier to provide power for amplification, based on the difference between the target output power from the radio frequency power amplifier and the measured output power from the radio frequency power amplifier.

27 Claims, 16 Drawing Sheets

Related U.S. Application Data 25, 2011, now Pat. No. 8,519,788, said application No. PCT/US2012/036858 is a continuation-in-part of application No. PCT/US2011/054106, filed on Sep. 29, 2011, and a continuation-in-part of application No. 13/316,229, filed as application No. PCT/US2011/064255 on Dec. 9, 2011, now Pat. No. 8,633,766, and a continuation-in-part of application No. 13/218,400, said application No. PCT/US2012/036858 is a continuation-in-part of application No. 13/367,973, filed as application No. PCT/US2012/024124 on Feb. 7, 2012, said application No. PCT/US2012/036858 is a continuation-in-part of application No. 13/423,649, filed on Mar. 19, 2012, now Pat. No. 8,624,760, and a continuation-in-part of application No. 13/363,888, filed as application No. PCT/US2012/023495 on Feb. 1, 2012, now Pat. No. 8,611,402.

(60) Provisional application No. 61/482,702, filed on May 5, 2011, provisional application No. 61/484,613, filed on May 10, 2011, provisional application No. 61/508,202, filed on Jul. 15, 2011, provisional application No. 61/530,625, filed on Sep. 2, 2011, provisional application No. 61/544,051, filed on Oct. 6, 2011, provisional application No. 61/551,605, filed on Oct. 26, 2011, provisional application No. 61/565,138, filed on Nov. 30, 2011, provisional application No. 61/576,520, filed on Dec. 16, 2011.

(51) Int. Cl.
*H03F 1/02* (2006.01)
*H02M 3/07* (2006.01)
*H03F 1/42* (2006.01)
*H03F 3/195* (2006.01)
*H03F 3/24* (2006.01)
*H03F 3/30* (2006.01)
*H03F 3/45* (2006.01)
*H03F 3/50* (2006.01)
*H03F 3/72* (2006.01)
*H03G 3/30* (2006.01)

(52) U.S. Cl.
CPC .......... *H03F 3/505* (2013.01); *H03F 3/72* (2013.01); *H03G 3/3042* (2013.01); *H03F 2200/102* (2013.01); *H03F 2200/204* (2013.01); *H03F 2200/36* (2013.01); *H03F 2200/375* (2013.01); *H03F 2200/451* (2013.01); *H03F 2200/555* (2013.01); *H03F 2200/78* (2013.01); *H03F 2203/45526* (2013.01); *H03F 2203/45544* (2013.01); *H03F 2203/45594* (2013.01); *H03F 2203/45694* (2013.01); *H03F 2203/45712* (2013.01); *H03F 2203/45718* (2013.01); *H03F 2203/7221* (2013.01)

(56) References Cited

U.S. PATENT DOCUMENTS

| | | |
|---|---|---|
| 4,587,552 A | 5/1986 | Chin |
| 4,692,889 A | 9/1987 | McNeely |
| 4,831,258 A | 5/1989 | Paulk et al. |
| 4,996,500 A | 2/1991 | Larson et al. |
| 5,099,203 A | 3/1992 | Weaver et al. |
| 5,146,504 A | 9/1992 | Pinckley |
| 5,187,396 A | 2/1993 | Armstrong, II et al. |
| 5,311,309 A | 5/1994 | Ersoz et al. |
| 5,317,217 A | 5/1994 | Rieger et al. |
| 5,351,087 A | 9/1994 | Christopher et al. |
| 5,414,614 A | 5/1995 | Fette et al. |
| 5,420,643 A | 5/1995 | Romesburg et al. |
| 5,457,620 A | 10/1995 | Dromgoole |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow et al. |
| 6,133,777 A | 10/2000 | Savelli |
| 6,141,541 A | 10/2000 | Midya et al. |
| 6,147,478 A | 11/2000 | Skelton et al. |
| 6,166,598 A | 12/2000 | Schlueter |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,400,775 B1 | 6/2002 | Gourgue et al. |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,703,080 B2 | 3/2004 | Reyzelman et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,885,176 B2 | 4/2005 | Librizzi |
| 6,958,596 B1 | 10/2005 | Sferrazza et al. |
| 6,995,995 B2 | 2/2006 | Zeng et al. |
| 7,038,536 B2 | 5/2006 | Cioffi et al. |
| 7,043,213 B2 | 5/2006 | Robinson et al. |
| 7,053,718 B2 | 5/2006 | Dupuis et al. |
| 7,058,373 B2 | 6/2006 | Grigore |
| 7,099,635 B2 | 8/2006 | McCune |
| 7,164,893 B2 | 1/2007 | Leizerovich et al. |
| 7,170,341 B2 | 1/2007 | Conrad et al. |
| 7,200,365 B2 | 4/2007 | Watanabe et al. |
| 7,233,130 B1 | 6/2007 | Kay |
| 7,253,589 B1 | 8/2007 | Potanin et al. |
| 7,254,157 B1 | 8/2007 | Crotty et al. |
| 7,262,658 B2 | 8/2007 | Ramaswamy et al. |
| 7,279,875 B2 | 10/2007 | Gan et al. |
| 7,304,537 B2 | 12/2007 | Kwon et al. |
| 7,348,847 B2 | 3/2008 | Whittaker |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 | 8/2008 | Chen |
| 7,454,238 B2 | 11/2008 | Vinayak et al. |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 | 3/2010 | Li |
| 7,684,216 B2 | 3/2010 | Choi et al. |

(56) References Cited

U.S. PATENT DOCUMENTS

| | | |
|---|---|---|
| 7,696,735 B2 | 4/2010 | Oraw et al. |
| 7,715,811 B2 | 5/2010 | Kenington |
| 7,724,837 B2 | 5/2010 | Filimonov et al. |
| 7,755,431 B2 | 7/2010 | Sun |
| 7,764,060 B2 | 7/2010 | Wilson |
| 7,773,691 B2 | 8/2010 | Khlat et al. |
| 7,773,965 B1 | 8/2010 | Van Brunt et al. |
| 7,777,459 B2 | 8/2010 | Williams |
| 7,782,036 B1 | 8/2010 | Wong et al. |
| 7,783,269 B2 | 8/2010 | Vinayak et al. |
| 7,800,427 B2 | 9/2010 | Chae et al. |
| 7,805,115 B1 | 9/2010 | McMorrow et al. |
| 7,852,150 B1 | 12/2010 | Arknaes-Pedersen |
| 7,856,048 B1 | 12/2010 | Smaini et al. |
| 7,859,336 B2 | 12/2010 | Markowski et al. |
| 7,880,547 B2 | 2/2011 | Lee et al. |
| 7,884,681 B1 | 2/2011 | Khlat et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,920,023 B2 | 4/2011 | Witchard |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 | 9/2011 | Drogi et al. |
| 8,026,765 B2 | 9/2011 | Giovannotto |
| 8,044,639 B2 | 10/2011 | Tamegai et al. |
| 8,054,126 B2 | 11/2011 | Yang et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,253,485 B2 | 8/2012 | Clifton |
| 8,253,487 B2 | 8/2012 | Hou et al. |
| 8,274,332 B2 | 9/2012 | Cho et al. |
| 8,289,084 B2 | 10/2012 | Morimoto et al. |
| 8,362,837 B2 | 1/2013 | Koren et al. |
| 8,493,141 B2 | 7/2013 | Khlat et al. |
| 8,519,788 B2 | 8/2013 | Khlat |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,571,498 B2 | 10/2013 | Khlat |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,633,766 B2 | 1/2014 | Khlat et al. |
| 8,638,165 B2 | 1/2014 | Shah et al. |
| 8,648,657 B1 | 2/2014 | Rozenblit |
| 8,659,355 B2 | 2/2014 | Henshaw et al. |
| 8,717,100 B2 | 5/2014 | Reisner et al. |
| 8,718,579 B2 | 5/2014 | Drogi |
| 8,718,582 B2 | 5/2014 | See et al. |
| 8,725,218 B2 | 5/2014 | Brown et al. |
| 8,744,382 B2 | 6/2014 | Hou et al. |
| 8,749,307 B2 | 6/2014 | Zhu et al. |
| 8,760,228 B2 | 6/2014 | Khlat |
| 8,782,107 B2 | 7/2014 | Myara et al. |
| 8,792,840 B2 | 7/2014 | Khlat et al. |
| 8,803,605 B2 | 8/2014 | Fowers et al. |
| 8,824,978 B2 | 9/2014 | Briffa et al. |
| 8,829,993 B2 | 9/2014 | Briffa et al. |
| 8,878,606 B2 | 11/2014 | Khlat et al. |
| 8,884,696 B2 | 11/2014 | Langer |
| 8,909,175 B1 | 12/2014 | McCallister |
| 8,942,313 B2 | 1/2015 | Khlat et al. |
| 8,942,652 B2 | 1/2015 | Khlat et al. |
| 8,947,161 B2 | 2/2015 | Khlat et al. |
| 8,947,162 B2 | 2/2015 | Wimpenny et al. |
| 8,952,710 B2 | 2/2015 | Retz et al. |
| 8,957,728 B2 | 2/2015 | Gorisse |
| 8,975,959 B2 | 3/2015 | Khlat |
| 8,981,839 B2 | 3/2015 | Kay et al. |
| 8,981,847 B2 | 3/2015 | Balteanu |
| 8,981,848 B2 | 3/2015 | Kay et al. |
| 8,994,345 B2 | 3/2015 | Wilson |
| 9,019,011 B2 | 4/2015 | Hietala et al. |
| 9,020,451 B2 | 4/2015 | Khlat |
| 9,024,688 B2 | 5/2015 | Kay et al. |
| 9,041,364 B2 | 5/2015 | Khlat |
| 9,041,365 B2 | 5/2015 | Kay et al. |
| 2002/0071497 A1 | 6/2002 | Bengtsson et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0146791 A1 | 8/2003 | Shvarts et al. |
| 2003/0153289 A1 | 8/2003 | Hughes et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0127173 A1 | 7/2004 | Leizerovich |
| 2004/0132424 A1 | 7/2004 | Aytur et al. |
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1 | 12/2004 | Kobayashi |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0079835 A1 | 4/2005 | Takabayashi et al. |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0200407 A1 | 9/2005 | Arai et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0097711 A1 | 5/2006 | Brandt |
| 2006/0128324 A1 | 6/2006 | Tan et al. |
| 2006/0154637 A1 | 7/2006 | Eyries et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0024365 A1 | 2/2007 | Ramaswamy et al. |
| 2007/0063681 A1 | 3/2007 | Liu |
| 2007/0082622 A1 | 4/2007 | Leinonen et al. |
| 2007/0146076 A1 | 6/2007 | Baba |
| 2007/0159256 A1 | 7/2007 | Ishikawa et al. |
| 2007/0182392 A1 | 8/2007 | Nishida |
| 2007/0183532 A1 | 8/2007 | Matero |
| 2007/0184794 A1* | 8/2007 | Drogi et al. ............ 455/127.1 |
| 2007/0249304 A1 | 10/2007 | Snelgrove et al. |
| 2007/0259628 A1 | 11/2007 | Carmel et al. |
| 2007/0290749 A1 | 12/2007 | Woo et al. |
| 2008/0003950 A1 | 1/2008 | Haapoja et al. |

(56) References Cited

U.S. PATENT DOCUMENTS

| | | |
|---|---|---|
| 2008/0044041 A1 | 2/2008 | Tucker et al. |
| 2008/0081572 A1 | 4/2008 | Rofougaran |
| 2008/0104432 A1 | 5/2008 | Vinayak et al. |
| 2008/0150619 A1 | 6/2008 | Lesso et al. |
| 2008/0205095 A1 | 8/2008 | Pinon et al. |
| 2008/0224769 A1 | 9/2008 | Markowski et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0259656 A1 | 10/2008 | Grant |
| 2008/0280577 A1 | 11/2008 | Beukema et al. |
| 2009/0004981 A1 | 1/2009 | Eliezer et al. |
| 2009/0045872 A1 | 2/2009 | Kenington |
| 2009/0082006 A1 | 3/2009 | Pozsgay et al. |
| 2009/0097591 A1 | 4/2009 | Kim |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1 | 7/2009 | Markowski et al. |
| 2009/0190699 A1 | 7/2009 | Kazakevich et al. |
| 2009/0191826 A1 | 7/2009 | Takinami et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2010/0001793 A1 | 1/2010 | Van Zeijl et al. |
| 2010/0002473 A1 | 1/2010 | Williams |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0045247 A1 | 2/2010 | Blanken et al. |
| 2010/0171553 A1 | 7/2010 | Okubo et al. |
| 2010/0253309 A1 | 10/2010 | Xi et al. |
| 2010/0266066 A1 | 10/2010 | Takahashi |
| 2010/0289568 A1 | 11/2010 | Eschauzier et al. |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2010/0327971 A1 | 12/2010 | Kumagai |
| 2011/0018626 A1 | 1/2011 | Kojima |
| 2011/0058601 A1 | 3/2011 | Kim et al. |
| 2011/0084760 A1 | 4/2011 | Guo et al. |
| 2011/0109387 A1 | 5/2011 | Lee |
| 2011/0148375 A1 | 6/2011 | Tsuji |
| 2011/0234182 A1 | 9/2011 | Wilson |
| 2011/0235827 A1 | 9/2011 | Lesso et al. |
| 2011/0260706 A1 | 10/2011 | Nishijima |
| 2011/0279180 A1 | 11/2011 | Yamanouchi et al. |
| 2011/0298433 A1 | 12/2011 | Tam |
| 2011/0298539 A1 | 12/2011 | Drogi et al. |
| 2012/0025907 A1 | 2/2012 | Koo et al. |
| 2012/0025919 A1 | 2/2012 | Huynh |
| 2012/0034893 A1 | 2/2012 | Baxter et al. |
| 2012/0049894 A1 | 3/2012 | Berchtold et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0098595 A1 | 4/2012 | Stockert |
| 2012/0119813 A1 | 5/2012 | Khlat et al. |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0170690 A1 | 7/2012 | Ngo et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0236444 A1 | 9/2012 | Srivastava et al. |
| 2012/0244916 A1 | 9/2012 | Brown et al. |
| 2012/0269240 A1* | 10/2012 | Balteanu et al. ............ 375/219 |
| 2012/0299647 A1 | 11/2012 | Honjo et al. |
| 2013/0024142 A1 | 1/2013 | Folkmann et al. |
| 2013/0034139 A1 | 2/2013 | Khlat et al. |
| 2013/0094553 A1 | 4/2013 | Paek et al. |
| 2013/0106378 A1 | 5/2013 | Khlat |
| 2013/0107769 A1 | 5/2013 | Khlat et al. |
| 2013/0134956 A1 | 5/2013 | Khlat |
| 2013/0135043 A1 | 5/2013 | Hietala et al. |
| 2013/0141064 A1 | 6/2013 | Kay et al. |
| 2013/0141068 A1 | 6/2013 | Kay et al. |
| 2013/0141072 A1 | 6/2013 | Khlat et al. |
| 2013/0141169 A1 | 6/2013 | Khlat et al. |
| 2013/0147445 A1 | 6/2013 | Levesque et al. |
| 2013/0154728 A1 | 6/2013 | Basaran et al. |
| 2013/0154729 A1 | 6/2013 | Folkmann et al. |
| 2013/0169245 A1 | 7/2013 | Kay et al. |
| 2013/0181521 A1 | 7/2013 | Khlat |
| 2013/0214858 A1 | 8/2013 | Tournatory et al. |
| 2013/0229235 A1 | 9/2013 | Ohnishi |
| 2013/0238913 A1 | 9/2013 | Huang et al. |
| 2013/0271221 A1 | 10/2013 | Levesque et al. |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |
| 2014/0028370 A1 | 1/2014 | Wimpenny |
| 2014/0028392 A1 | 1/2014 | Wimpenny |
| 2014/0049321 A1 | 2/2014 | Gebeyehu et al. |
| 2014/0055197 A1 | 2/2014 | Khlat et al. |
| 2014/0062590 A1 | 3/2014 | Khlat et al. |
| 2014/0077787 A1 | 3/2014 | Gorisse et al. |
| 2014/0097895 A1 | 4/2014 | Khlat et al. |
| 2014/0099906 A1 | 4/2014 | Khlat |
| 2014/0099907 A1 | 4/2014 | Chiron |
| 2014/0103995 A1 | 4/2014 | Langer |
| 2014/0111178 A1 | 4/2014 | Khlat et al. |
| 2014/0125408 A1 | 5/2014 | Kay et al. |
| 2014/0139199 A1 | 5/2014 | Khlat et al. |
| 2014/0184335 A1 | 7/2014 | Nobbe et al. |
| 2014/0203868 A1 | 7/2014 | Khlat et al. |
| 2014/0203869 A1 | 7/2014 | Khlat et al. |
| 2014/0225674 A1 | 8/2014 | Folkmann et al. |
| 2014/0266427 A1 | 9/2014 | Chiron |
| 2014/0306769 A1 | 10/2014 | Khlat et al. |
| 2015/0048891 A1 | 2/2015 | Rozek et al. |

FOREIGN PATENT DOCUMENTS

| | | |
|---|---|---|
| CN | 1898860 A | 1/2007 |
| CN | 101106357 A | 1/2008 |
| CN | 101201891 A | 6/2008 |
| CN | 101379695 A | 3/2009 |
| CN | 101405671 A | 4/2009 |
| CN | 101416385 A | 4/2009 |
| CN | 101427459 A | 5/2009 |
| CN | 101548476 A | 9/2009 |
| CN | 101626355 A | 1/2010 |
| CN | 101635697 A | 1/2010 |
| CN | 101669280 A | 3/2010 |
| CN | 101867284 A | 10/2010 |
| CN | 201674399 U | 12/2010 |
| EP | 0755121 A2 | 1/1997 |
| EP | 1047188 A2 | 10/2000 |
| EP | 1317105 A1 | 6/2003 |
| EP | 1492227 A1 | 12/2004 |
| EP | 1557955 A1 | 7/2005 |
| EP | 1569330 A1 | 8/2005 |
| EP | 2214304 A1 | 8/2010 |
| EP | 2244366 A1 | 10/2010 |
| EP | 2372904 A1 | 10/2011 |
| EP | 2579456 A1 | 4/2013 |
| GB | 2398648 A | 8/2004 |
| GB | 2462204 A | 2/2010 |
| GB | 2465552 A | 5/2010 |
| GB | 2484475 A | 4/2012 |
| TW | 461168 B | 10/2001 |
| WO | 0048306 A1 | 8/2000 |
| WO | 2004002006 A1 | 12/2003 |
| WO | 2004082135 A2 | 9/2004 |

(56) References Cited

FOREIGN PATENT DOCUMENTS

| | | |
|---|---|---|
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |
| WO | 2012151594 A2 | 11/2012 |
| WO | 2012172544 A1 | 12/2012 |

OTHER PUBLICATIONS

First Office Action for Chinese Patent Application No. 2011800302735, issued Dec. 3, 2014, 15 pages (with English translation).
Notice of Allowance for U.S. Appl. No. 14/022,858, mailed Feb. 17, 2015, 7 pages.
Notice of Allowance for U.S. Appl. No. 14/072,225, mailed Jan. 22, 2015, 7 pages.
Final Office Action for U.S. Appl. No. 13/661,227, mailed Feb. 6, 2015, 24 pages.
International Preliminary Report on Patentability for PCT/US20131052277, mailed Feb. 5, 2015, 9 pages.
Non-Final Office Action for U.S. Appl. No. 14/048,109, mailed Feb. 18, 2015, 8 pages.
Notice of Allowance for U.S. Appl. No. 13/747,725, mailed Feb. 2, 2015, 10 pages.
Final Office Action for U.S. Appl. No. 13/297,470, mailed Oct. 25, 2013, 17 pages.
Non-Final Office Action for U.S. Appl. No. 13/297,470, mailed Feb. 20, 2014, 16 pages.
International Search Report for PCT/US2011/061009, mailed Feb. 8, 2012, 14 pages.
International Preliminary Report on Patentability for PCT/US2011/061009, mailed May 30, 2013, 10 pages.
Notice of Allowance for U.S. Appl. No. 14/022,858, mailed Oct. 25, 2013, 9 pages.
Notice of Allowance for U.S. Appl. No. 14/022,858, mailed May 27, 2014, 6 pages.
Notice of Allowance for U.S. Appl. No. 13/343,840, mailed Jul. 1, 2013, 8 pages.
International Search Report for PCT/US2012/023495, mailed May 7, 2012, 13 pages.
International Preliminary Report on Patentability for PCT/US2012/023495, mailed Aug. 15, 2013, 10 pages.
Notice of Allowance for U.S. Appl. No. 13/363,888, mailed Jul. 18, 2013, 9 pages.
Non-final Office Action for U.S. Appl. No. 13/222,453, mailed Dec. 6, 2012, 13 pages.
Notice of Allowance for U.S. Appl. No. 13/222,453, mailed Feb. 21, 2013, 7 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Non-Final Office Action for U.S. Appl. No. 13/367,973, mailed Apr. 25, 2014, 5 pages.
Invitation to Pay Additional Fees and Where Applicable Protest Fee for PCT/US2012/024124, mailed Jun. 1, 2012, 7 pages.
International Search Report for PCT/US2012/024124, mailed Aug. 24, 2012, 14 pages.
International Preliminary Report on Patentability for PCT/US2012/024124, mailed Aug. 22, 2013, 8 pages.
Non-Final Office Action for U.S. Appl. No. 13/423,649, mailed May 22, 2013, 7 pages.
Notice of Allowance for U.S. Appl. No. 13/423,649, mailed Aug. 30, 2013, 8 pages.
Notice of Allowance for U.S. Appl. No. 14/072,140, mailed Aug. 27, 2014, 8 pages.
Notice of Allowance for U.S. Appl. No. 13/316,229, mailed Nov. 14, 2012, 9 pages.
Notice of Allowance for U.S. Appl. No. 13/316,229, mailed Aug. 29, 2013, 8 pages.
International Search Report for PCT/US2011/064255, mailed Apr. 3, 2012, 12 pages.
International Preliminary Report on Patentability for PCT/US2011/064255, mailed Jun. 20, 2013, 7 pages.
Non-Final Office Action for U.S. Appl. No. 14/072,225, mailed Aug. 15, 2014, 4 pages.
International Search Report for PCT/US2012/40317, mailed Sep. 7, 2012, 7 pages.
International Preliminary Report on Patentability for PCT/US2012/040317, mailed Dec. 12, 2013, 5 pages.
Non-Final Office Action for U.S. Appl. No. 13/486,012, mailed Jul. 28, 2014, 7 pages.
Quayle Action for U.S. Appl. No. 13/531,719, mailed Oct. 10, 2013, 5 pages.
Notice of Allowance for U.S. Appl. No. 13/531,719, mailed Dec. 30, 2013, 7 pages.
Notice of Allowance for U.S. Appl. No. 13/548,283, mailed Sep. 3, 2014, 7 pages.
Non-Final Office Action for U.S. Appl. No. 13/550,049, mailed Nov. 25, 2013, 6 pages.
Notice of Allowance for U.S. Appl. No. 13/550,049, mailed Mar. 6, 2014, 5 pages.
International Search Report for PCT/US2012/046887, mailed Dec. 21, 2012, 12 pages.
International Preliminary Report on Patentability for PCT/US2012/046887, mailed Jan. 30, 2014, 8 pages.
Notice of Allowance for U.S. Appl. No. 13/550,060, mailed Aug. 16, 2013, 8 pages.
Non-final Office Action for U.S. Appl. No. 13/222,484, mailed Nov. 8, 2012, 9 pages.
Final Office Action for U.S. Appl. No. 13/222,484, mailed Apr. 10, 2013, 10 pages.
Advisory Action for U.S. Appl. No. 13/222,484, mailed Jun. 14, 2013, 3 pages.
Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.
International Search Report and Written Opinion for PCT/US2012/053654, mailed Feb. 15, 2013, 11 pages.
International Preliminary Report on Patentability for PCT/US2012/053654, mailed Mar. 13, 2014, 7 pages.
Non-Final Office Action for U.S. Appl. No. 13/647,815, mailed May 2, 2014, 6 pages.
Non-Final Office Action for U.S. Appl. No. 13/689,883, mailed Mar. 27, 2014, 13 pages.
47 Non-Final Office Action for U.S. Appl. No. 13/689,883, mailed Aug. 27, 2014, 12 pages.
International Search Report and Written Opinion for PCT/US2012/062070, mailed Jan. 21, 2013, 12 pages.
International Preliminary Report on Patentability for PCT/US2012/062070, mailed May 8, 2014, 8 pages.
Non-Final Office Action for U.S. Appl. No. 13/661,552, mailed Feb. 21, 2014, 5 pages.
Notice of Allowance for U.S. Appl. No. 14/072,140, mailed Dec. 2, 2014, 8 pages.
First Office Action for Chinese Patent Application No. 201280026559.0, issued Nov. 3, 2014, 14 pages (with English translation).
Notice of Allowance for U.S. Appl. No. 13/486,012, mailed Nov. 21, 2014, 8 pages.
Final Office Action for U.S. Appl. No. 13/689,883, mailed Jan. 2, 2015, 13 pages.
Notice of Allowance for U.S. Appl. No. 13/690,187, mailed Dec. 19, 2014, 8 pages.
Notice of Allowance for U.S. Appl. No. 13/747,694, mailed Dec. 22, 2014, 9 pages.
Notice of Allowance for U.S. Appl. No. 13/951,976, mailed Dec. 26, 2014, 9 pages.

(56) References Cited

OTHER PUBLICATIONS

Non-Final Office Action for U.S. Appl. No. 13/747,749, mailed Nov. 12, 2014, 32 pages.
Non-Final Office Action for U.S. Appl. No. 12/836,307, mailed Sep. 25, 2014, 5 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/367,973, mailed Sep. 15, 2014, 7 pages.
Extended European Search Report for European Patent Application No. 12794149.0, issued Oct. 29, 2014, 6 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Notice of Allowance for U.S. Appl. No. 13/914,888, mailed Oct. 17, 2014, 10 pages.
Non-Final Office Action for U.S. Appl. No. 13/747,725, mailed Oct. 7, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.
Notice of Allowance for U.S. Appl. No. 13/661,552, mailed Jun. 13, 2014, 5 pages.
International Search Report and Written Opinion for PCT/US2012/062110, issued Apr. 8, 2014, 12 pages.
International Preliminary Report on Patentability for PCT/US2012/062110, mailed May 8, 2014, 9 pages.
Non-Final Office Action for U.S. Appl. No. 13/692,084, mailed Apr. 10, 2014, 6 pages.
Notice of Allowance for U.S. Appl. No. 13/692,084, mailed Jul. 23, 2014, 7 pages.
Notice of Allowance for U.S. Appl. No. 13/690,187, mailed Sep. 3, 2014, 9 pages.
International Search Report and Written Opinion for PCT/US2012/067230, mailed Feb. 21, 2013, 10 pages.
International Preliminary Report on Patentability and Written Opinion for PCT/US2012/067230, mailed Jun. 12, 2014, 7 pages.
Non-Final Office Action for U.S. Appl. No. 13/684,826, mailed Apr. 3, 2014, 5 pages.
Notice of Allowance for U.S. Appl. No. 13/684,826, mailed Jul. 18, 2014, 7 pages.
Non-Final Office Action for U.S. Appl. No. 14/022,940, mailed Dec. 20, 2013, 5 pages.
Notice of Allowance for U.S. Appl. No. 14/022,940, mailed Jun. 10, 2014, 7 pages.
Non-Final Office Action for U.S. Appl. No. 13/714,600, mailed May 9, 2014, 14 pages.
Non-Final Office Action for U.S. Appl. No. 13/782,142, mailed Sep. 4, 2014, 6 pages.
Non-Final Office Action for U.S. Appl. No. 13/951,976, mailed Apr. 4, 2014, 7 pages.
International Search Report and Written Opinion for PCT/US2013/052277, mailed Jan. 7, 2014, 14 pages.
International Search Report and Written Opinion for PCT/US2013/065403, mailed Feb. 5, 2014, 11 pages.
International Search Report and Written Opinion for PCT/US2014/028089, mailed Jul. 17, 2014, 10 pages.
Invitation to Pay Additional Fees and Partial International Search Report for PCT/US2014/028178, mailed Jul. 24, 2014, 7 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
Dixon, N., "Standardisation Boosts Momentum for Envelope Tracking," Microwave Engineering, Europe, Apr. 20, 2011, 2 pages, http://www.mwee.com/en/standardisation-boosts-momentum-for-envelope-tracking.html?cmp_ids=71&news_ids=222901746.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 2012, pp. 1185-1198.
Hekkala, A. et al., "Adaptive Time Misalignment Compensation in Envelope Tracking Amplifiers," 2008 IEEE International Symposium on Spread Spectrum Techniques and Applications, Aug. 2008, pp. 761-765.
Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.
Kim, N. et al, "Ripple Feedback Filter Suitable for Analog/Digital Mixed-Mode Audio Amplifier for Improved Efficiency and Stability," 2002 IEEE Power Electronics Specialists Conference, vol. 1, Jun. 23, 2002, pp. 45-49.
Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm²at 81% Efficiency," 2010 IEEE International Solid State Circuits Conference, Feb. 7-11, 2010, pp. 210-212.
Li, Y. et al., "A Highly Efficient SiGe Differential Power Amplifier Using an Envelope-Tracking Technique for 3GPP LTE Applications," 2010 IEEE Bipolar/BiCMOS Circuits and Technology Meeting (BCTM), Oct. 4-6, 2010, pp. 121-124.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown Author, "Nujira Files 100th Envelope Tracking Patent," CS: Compound Semiconductor, Apr. 11, 2011, 1 page, http://www.compoundsemiconductor.net/csc/news-details.php?cat=news&id=19733338&key=Nujira%20Files%20100th%20Envelope%20Tracking%20Patent&type=n.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
Non-final Office Action for U.S. Appl. No. 11/113,873, now U.S. Pat. No. 7,773,691, mailed Feb. 1, 2008, 17 pages.
Final Office Action for U.S. Appl. No. 11/113,873, now U.S. Pat. No. 7,773,691, mailed Jul. 30, 2008, 19 pages.
Non-final Office Action for U.S. Appl. No. 11/113,873, now U.S. Pat. No. 7,773,691, mailed Nov. 26, 2008, 22 pages.

(56) References Cited

OTHER PUBLICATIONS

Final Office Action for U.S. Appl. No. 11/113,873, now U.S. Pat. No. 7,773,691, mailed May 4, 2009, 20 pages.
Non-final Office Action for U.S. Appl. No. 11/113,873, now U.S. Pat. No. 7,773,691, mailed Feb. 3, 2010, 21 pages.
Notice of Allowance for U.S. Appl. No. 11/113,873, now U.S. Pat. No. 7,773,691, mailed Jun. 9, 2010, 7 pages.
International Search Report for PCT/US06/12619, mailed May 8, 2007, 2 pages.
Extended European Search Report for application 06740532.4, mailed Dec. 7, 2010, 7 pages.
Non-final Office Action for U.S. Appl. No. 12/112,006, mailed Apr. 5, 2010, 6 pages.
Notice of Allowance for U.S. Appl. No. 12/112,006, mailed Jul. 19, 2010, 6 pages.
Non-Final Office Action for U.S. Appl. No. 12/836,307, mailed Nov. 5, 2013, 6 pages.
Notice of Allowance for U.S. Appl. No. 12/836,307, mailed May 5, 2014, 6 pages.
Non-final Office Action for U.S. Appl. No. 13/089,917, mailed Nov. 23, 2012, 6 pages.
Examination Report for European Patent Application No. 11720630, mailed Aug. 16, 2013, 5 pages.
Examination Report for European Patent Application No. 11720630.0, issued Mar. 18, 2014, 4 pages.
European Search Report for European Patent Application No. 14162682.0, issued Aug. 27, 2014, 7 pages.
International Search Report for PCT/US11/033037, mailed Aug. 9, 2011, 10 pages.
International Preliminary Report on Patentability for PCT/US2011/033037, mailed Nov. 1, 2012, 7 pages.
Non-Final Office Action for U.S. Appl. No. 13/188,024, mailed Feb. 5, 2013, 8 pages.
Notice of Allowance for U.S. Appl. No. 13/188,024, mailed Jun. 18, 2013, 8 pages.
International Search Report for PCT/US2011/044857, mailed Oct. 24, 2011, 10 pages.
International Preliminary Report on Patentability for PCT/US2011/044857, mailed Mar. 7, 2013, 6 pages.
Non-final Office Action for U.S. Appl. No. 13/218,400, mailed Nov. 8, 2012, 7 pages.
Notice of Allowance for U.S. Appl. No. 13/218,400, mailed Apr. 11, 2013, 7 pages.
International Search Report for PCT/US11/49243, mailed Dec. 22, 2011, 9 pages.
International Preliminary Report on Patentability for PCT/US11/49243, mailed Nov. 13, 2012, 33 pages.
International Search Report for PCT/US2011/054106, mailed Feb. 9, 2012, 11 pages.
International Preliminary Report on Patentability for PCT/US2011/054106, mailed Apr. 11, 2013, 8 pages.
Notice of Allowance for U.S. Appl. No. 13/297,490, mailed Feb. 27, 2014, 7 pages.
Invitation to Pay Additional Fees for PCT/US2011/061007, mailed Feb. 13, 2012, 7 pages.
International Search Report for PCT/US2011/061007, mailed Aug. 16, 2012, 16 pages.
International Preliminary Report on Patentability for PCT/US2011/061007, mailed May 30, 2013, 11 pages.
Non-Final Office Action for U.S. Appl. No. 13/297,470, mailed May 8, 2013, 15 pages.
European Examination Report for European Patent Application No. 14162682.0, mailed May 22, 2015, 5 pages.
Corrected Notice of Allowance for U.S. Appl. No. 13/297,470, mailed Jun. 5, 2015, 11 pages.
Advisory Action for U.S. Appl. No. 13/689,883, mailed Apr. 20, 2015, 3 pages.
Advisory Action for U.S. Appl. No. 13/661,227, mailed May 12, 2015, 3 pages.
Advisory Action for U.S. Appl. No. 13/714,600, mailed May 26, 2015, 3 pages.
Notice of Allowance for U.S. Appl. No. 13/747,725, mailed May 13, 2015, 9 pages.
Notice of Allowance for U.S. Appl. No. 13/747,749, mailed Jun. 4, 2015, 8 pages.
Non-Final Office Action for U.S. Appl. No. 13/552,768, mailed Apr. 20, 2015, 12 pages.
Non-Final Office Action for U.S. Appl. No. 13/689,922, mailed Apr. 20, 2015, 19 pages.
Non-Final Office Action for U.S. Appl. No. 13/727,911, mailed Apr. 20, 2015, 10 pages.
Non-Final Office Action for U.S. Appl. No. 14/163,229, mailed Apr. 23, 2015, 9 pages.
Non-Final Office Action for U.S. Appl. No. 14/163,256, mailed Apr. 23, 2015, 9 pages.
Notice of Allowance for U.S. Appl. No. 14/176,611, mailed Apr. 27, 2015, 7 pages.
International Preliminary Report on Patentability for PCT/US2013/065403, mailed Apr. 30, 2015, 8 pages.
Quayle Action for U.S. Appl. No. 13/689,940, mailed May 14, 2015, 7 pages.
Notice of Allowance for U.S. Appl. No. 13/661,164, mailed Jun. 3, 2015, 6 pages.
Non-Final Office Action for U.S. Appl. No. 14/082,629, mailed Jun. 18, 2015, 15 pages.
First Office Action for Chinese Patent Application No. 201280052694.2, issued Mar. 24, 2015, 35 pages.
Notice of Allowance for U.S. Appl. No. 12/836,307, mailed Mar. 2, 2015, 6 pages.
Notice of Allowance for U.S. Appl. No. 13/297,470, mailed Feb. 25, 2015, 15 pages.
Corrected Notice of Allowance for U.S. Appl. No. 13/297,470, mailed Apr. 6, 2015, 11 pages.
Non-Final Office Action for U.S. Appl. No. 14/122,852, mailed Feb. 27, 2015, 5 pages.
Final Office Action for U.S. Appl. No. 13/714,600, mailed Mar. 10, 2015, 14 pages.
Non-Final Office Action for U.S. Appl. No. 14/056,292, mailed Mar. 6, 2015, 8 pages.
Final Office Action for U.S. Appl. No. 13/747,749, mailed Mar. 20, 2015, 35 pages.
European Search Report for European Patent Application No. 14190851.7, issued Mar. 5, 2015, 6 pages.
Notice of Allowance for U.S. Appl. No. 13/948,291, mailed Jul. 17, 2015, 8 pages.
Non-Final Office Action for U.S. Appl. No. 13/689,883, mailed Jul. 24, 2015, 13 pages.
Non-Final Office Action for U.S. Appl. No. 13/661,227, mailed Jul. 27, 2015, 25 pages.
Non-Final Office Action for U.S. Appl. No. 13/714,600, mailed Jul. 17, 2015, 14 pages.
Notice of Allowance for U.S. Appl. No. 14/212,154, mailed Jul. 17, 2015, 8 pages.
Notice of Allowance for U.S. Appl. No. 14/212,199, mailed Jul. 20, 2015, 8 pages.
Notice of Allowance for U.S. Appl. No. 13/689,940, mailed Aug. 3, 2015, 6 pages.
First Office Action and Search Report for Chinese Patent Application No. 201280007941.7, issued May 13, 2015, 13 pages.
Yun, Hu et al., "Study of envelope tracking power amplifier design," Journal of Circuits and Systems, vol. 15, No. 6, Dec. 2010, pp. 6-10.
International Preliminary Report on Patentability for PCT/US2014/012927, mailed Aug. 6, 2015, 9 pages.
First Office Action and Search Report for Chinese Patent Application No. 201210596632.X, mailed Jun. 25, 2015, 16 pages.
Notice of Allowance for U.S. Appl. No. 14/072,140, mailed Aug. 20, 2015, 6 pages.
Non-Final Office Action for U.S. Appl. No. 141072,225, mailed Aug. 18, 2015, 4 pages.
Notice of Allowance for U.S. Appl. No. 13/747,725, mailed Sep. 1, 2015, 9 pages.

(56) References Cited

OTHER PUBLICATIONS

Notice of Allowance for U.S. Appl. No. 14/027,416, mailed Aug. 11, 2015, 9 pages.

Second Office Action for Chinese Patent Application No. 201180030273.5, issued Aug. 14, 2015, 8 pages.

International Preliminary Report on Patentability for PCT/US2014/028089, mailed Sep. 24, 2015, 8 pages.

International Preliminary Report on Patentability for PCT/US2014/028178, mailed Sep. 24, 2015, 11 pages.

First Office Action for Chinese Patent Application No. 201180067293.X, mailed Aug. 6, 2015, 13 pages.

Notice of Allowance for U.S. Appl. No. 13/747,749, mailed Oct. 2, 2015, 8 pages.

Notice of Allowance for U.S. Appl. No. 13/552,768, mailed Sep. 22, 2015, 9 pages.

Final Office Action for U.S. Appl. No. 13/689,922, mailed Oct. 6, 2015, 20 pages.

Notice of Allowance for U.S. Appl. No. 13/727,911, mailed Sep. 14, 2015, 8 pages.

Notice of Allowance for U.S. Appl. No. 13/689,940, mailed Sep. 16, 2015, 7 pages.

Non-Final Office Action for U.S. Appl. No. 14/101,770, mailed Sep. 21, 2015, 5 pages.

Notice of Allowance for U.S. Appl. No. 13/661,164, mailed Oct. 21, 2015, 7 pages.

Non-Final Office Action for U.S. Appl. No. 14/702,192, mailed Oct. 7, 2015, 7 pages.

Non-Final Office Action for U.S. Appl. No. 14/254,215, mailed Oct. 15, 2015, 5 pages.

Notice of Allowance for U.S. Appl. No. 13/747,725, mailed Oct. 28, 2015, 9 pages.

\* cited by examiner ( FROM FIGS. 8B AND 8C )

SCALE THE ENVELOPE MAGNITUDE AS A FUNCTION OF THE PSEUDO GAIN CONTROL SIGNAL TO GENERATE AN INDEX INPUT SIGNAL FOR THE $V_{CC}$ LOOK UP TABLE THAT PROVIDES AN EMULATION OF THE INPUT POWER $P_{IN}$ OF THE MODULATED RADIO FREQUENCY INPUT SIGNAL PROVIDED TO THE RADIO FREQUENCY POWER AMPLIFIER
2738

GENERATE A CONTROL SIGNAL TO SUBSTANTIALLY OPERATE ON A SINGLE ISO-GAIN CONTOUR RELATED TO THE TRANSMIT-TARGET OUTPUT POWER SETTING PARAMETER TO MINIMIZE DISTORTION IN RESPONSE TO AN INCREASE IN THE INPUT POWER $P_{IN}$ OF THE MODULATED RADIO FREQUENCY INPUT SIGNAL PROVIDED TO THE RADIO FREQUENCY POWER AMPLIFIER
2740

COMMENCE A DATA TRANSMISSION
2742

FIG. 8D

POWER LOOP CONTROL BASED ENVELOPE TRACKING

RELATED APPLICATIONS

The present application claims priority to and is a continuation-in-part of International Patent Application No. PCT/US12/36858, filed May 7, 2012, entitled "POWER MANAGEMENT SYSTEM FOR PSEUDO-ENVELOPE AND AVERAGE POWER TRACKING," which claims priority to U.S. Provisional Patent Applications No. 61/482,702, filed May 5, 2011; No. 61/484,613, filed May 10, 2011; No. 61/508,202, filed Jul. 15, 2011; No. 61/530,625, filed Sep. 2, 2011; No. 61/544,051, filed Oct. 6, 2011; No. 61/551,605, filed Oct. 26, 2011; No. 61/565,138, filed Nov. 30, 2011; and No. 61/576,520, filed Dec. 16, 2011.

International Patent Application No. PCT/US12/36858, filed May 7, 2012, claims priority to and is a continuation-in-part of U.S. patent application Ser. No. 13/218,400, filed Aug. 25, 2011, entitled "BOOST CHARGE-PUMP WITH FRACTIONAL RATIO AND OFFSET LOOP FOR SUPPLY MODULATION," now U.S. Pat. No. 8,519,788, which was also filed as International Patent Application No. PCT/US11/49243 on Aug. 25, 2011.

International Patent Application No. PCT/US12/36858, filed May 7, 2012, claims priority to and is a continuation-in-part of International Patent Application No. PCT/US11/54106, filed Sep. 29, 2011, entitled "SINGLE µC-BUCK-BOOST CONVERTER WITH MULTIPLE REGULATED SUPPLY OUTPUTS."

International Patent Application No. PCT/US12/36858, filed May 7, 2012, claims priority to and is a continuation-in-part of U.S. patent application Ser. No. 13/316,229, filed Dec. 9, 2011, entitled "PSEUDO-ENVELOPE FOLLOWER POWER MANAGEMENT SYSTEM WITH HIGH FREQUENCY RIPPLE CURRENT," now U.S. Pat. No. 8,633,766, which was also filed as International Patent Application No. PCT/US11/64255 on Dec. 9, 2011. U.S. patent application Ser. No. 13/316,229, filed Dec. 9, 2011, is a continuation-in-part of U.S. patent application Ser. No. 13/218,400, filed Aug. 25, 2011, which was also filed as International Patent Application No. PCT/US11/49243 on Aug. 25, 2011.

International Patent Application No. PCT/US12/36858, filed May 7, 2012, claims priority to and is a continuation-in-part of U.S. patent application Ser. No. 13/367,973, filed Feb. 7, 2012, entitled "GROUP DELAY CALIBRATION METHOD FOR POWER AMPLIFIER ENVELOPE TRACKING," now U.S. Pat. No. 8,942,313, which was also filed as International Patent Application No. PCT/US12/24124 on Feb. 7, 2012.

International Patent Application No. PCT/US12/36858, filed May 7, 2012, claims priority to and is a continuation-in-part of U.S. patent application Ser. No. 13/423,649, filed Mar. 19, 2012, entitled "APPARATUSES AND METHODS FOR RATE CONVERSION AND FRACTIONAL DELAY CALCULATION USING A COEFFICIENT LOOK UP TABLE," now U.S. Pat. No. 8,624,760.

International Patent Application No. PCT/US12/36858, filed May 7, 2012, claims priority to and is a continuation-in-part of U.S. patent application Ser. No. 13/363,888, filed Feb. 1, 2012, entitled "FAST ENVELOPE SYSTEM CALIBRATION," now U.S. Pat. No. 8,611,402, which was also filed as International Patent Application No. PCT/US12/23495, on Feb. 1, 2012.

All of the applications listed above are hereby incorporated herein by reference in their entireties.

FIELD OF THE DISCLOSURE

The embodiments described herein relate to a power management system for delivering current to a linear radio frequency power amplifier. More particularly, the embodiments relate to the use of a pseudo-envelope tracker in a power management system of mobile communications equipment.

BACKGROUND

Next-generation mobile devices are morphing from voice-centric telephones to message and multimedia-based "smart" phones that offer attractive new features. As an example, smart phones offer robust multimedia features such as web-browsing, audio and video playback and streaming, email access and a rich gaming environment. But even as manufacturers race to deliver ever more feature rich mobile devices, the challenge of powering them looms large.

In particular, the impressive growth of high bandwidth applications for radio frequency (RF) hand-held devices has led to increased demand for efficient power saving techniques to increase battery life. Because the radio frequency power amplifier of the mobile device consumes a large percentage of the overall power budget of the mobile device, various power management systems have been proposed to increase the overall power efficiency of the radio frequency power amplifier. As such, there remains a need to further improve the power efficiency of mobile devices to provide extended battery life. In this regard, there is a need to improve the power management system of mobile devices.

SUMMARY

Configuration-feedback circuitry and transceiver circuitry are disclosed, according to one embodiment of the present disclosure. The configuration-feedback circuitry regulates an output power from a radio frequency power amplifier based on a difference between a target output power from the radio frequency power amplifier and a measured output power from the radio frequency power amplifier. The transceiver circuitry regulates a modulated power supply voltage, which is used by the radio frequency power amplifier to provide power for amplification, based on the difference between the target output power from the radio frequency power amplifier and the measured output power from the radio frequency power amplifier.

By regulating the modulated power supply voltage based on the difference between the target output power from the radio frequency power amplifier and the measured output power from the radio frequency power amplifier, degradation of an output signal from the radio frequency power amplifier may be reduced or avoided.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIGS. 8A-D depict a method for compensating a control signal generated as part of an envelope tracking system.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Configuration-feedback circuitry and transceiver circuitry are disclosed, according to one embodiment of the present disclosure. The configuration-feedback circuitry regulates an output power from a radio frequency power amplifier based on a difference between a target output power from the radio frequency power amplifier and a measured output power from the radio frequency power amplifier. The transceiver circuitry regulates a modulated power supply voltage, which is used by the radio frequency power amplifier to provide power for amplification, based on the difference between the target output power from the radio frequency power amplifier and the measured output power from the radio frequency power amplifier.

By regulating the modulated power supply voltage based on the difference between the target output power from the radio frequency power amplifier and the measured output power from the radio frequency power amplifier, degradation of an output signal from the radio frequency power amplifier may be reduced or avoided.

Figure 1A:
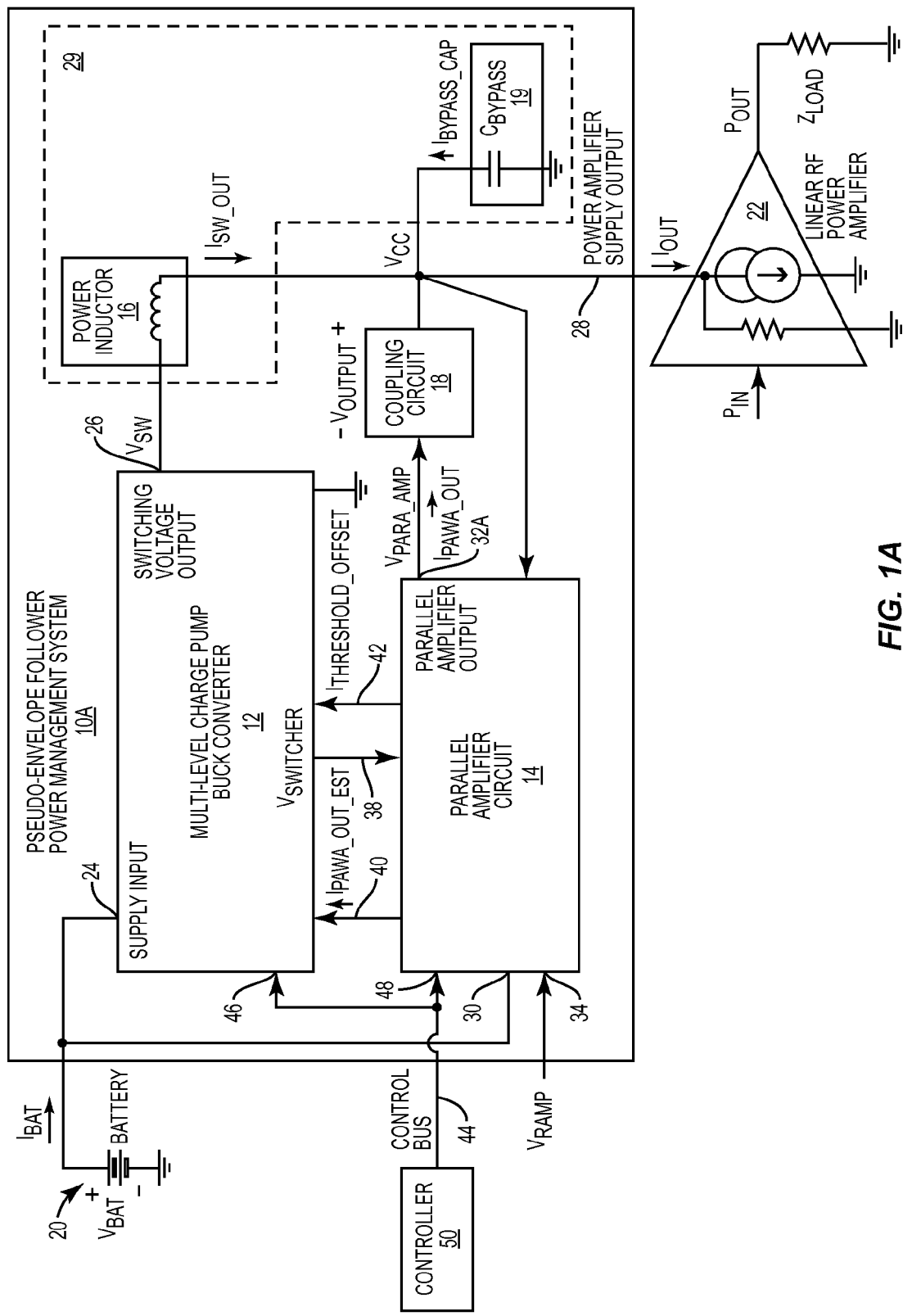
FIG. 1A depicts an embodiment of a pseudo-envelope follower power management system for managing power supplied to a linear radio frequency power amplifier according to one embodiment of the pseudo-envelope follower power management system.
Figure 1B:
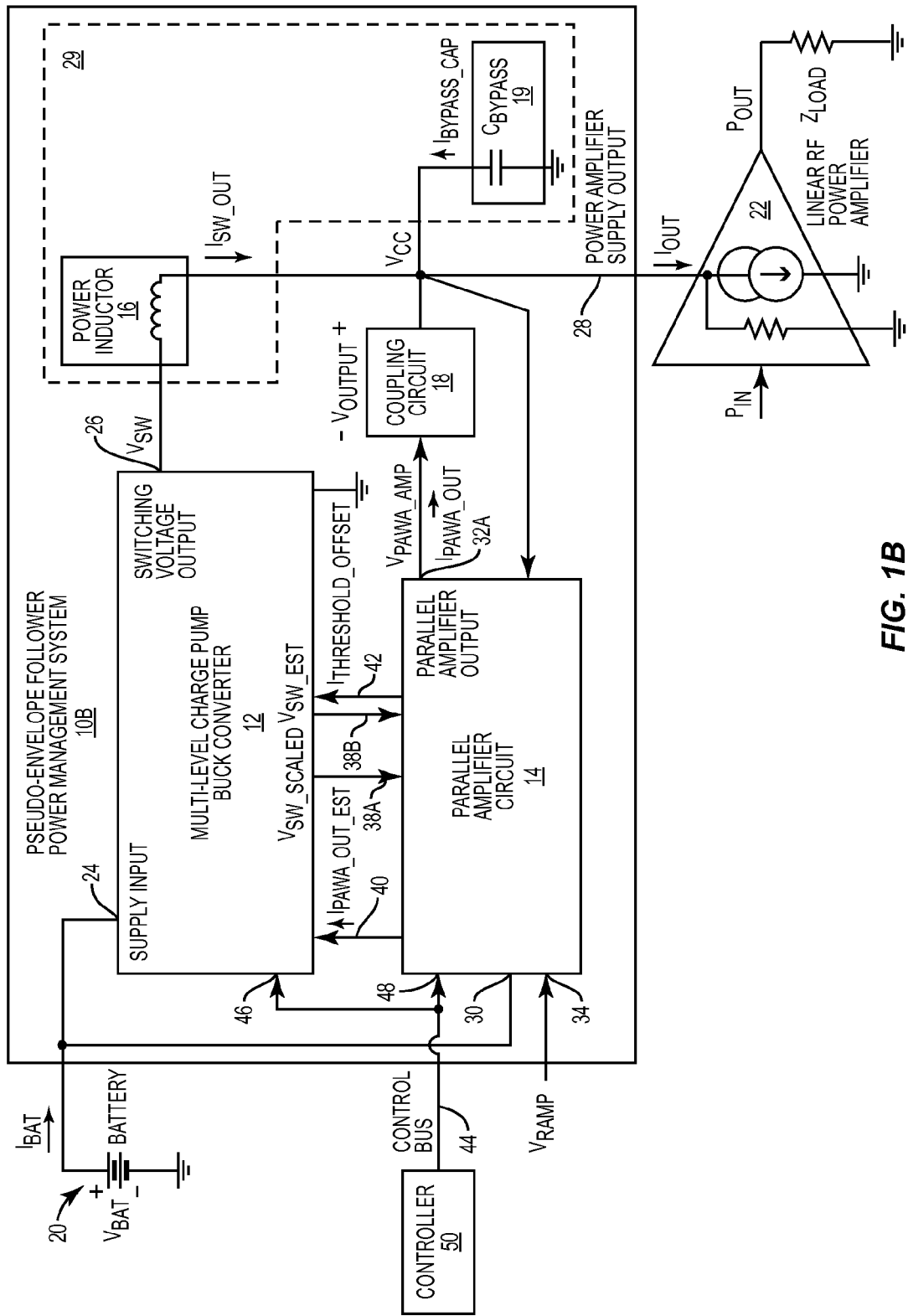
FIG. 1B depicts an embodiment of the pseudo-envelope follower power management system for managing power supplied to a linear radio frequency power amplifier according to an alternate embodiment of the pseudo-envelope follower power management system.
Figure 2A:
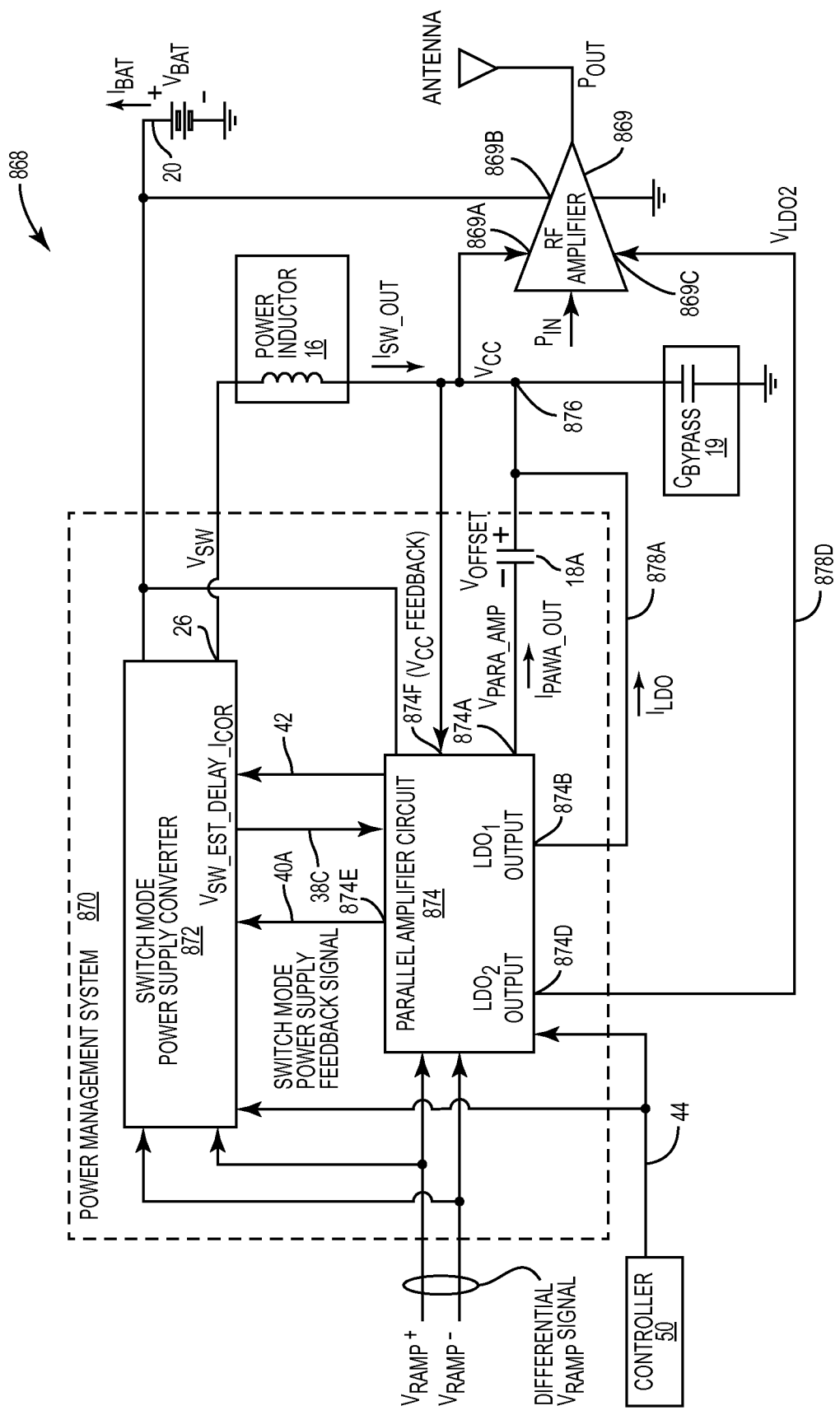
FIG. 2A depicts one embodiment of a pseudo-envelope tracking modulated power supply system according to one embodiment of the pseudo-envelope tracking modulated power supply system.

FIG. 1A depicts an embodiment of a pseudo-envelope follower power management system 10A for managing power supplied to a linear radio frequency power amplifier 22 according to one embodiment of the pseudo-envelope follower power management system 10A. FIG. 1B depicts an embodiment of a pseudo-envelope follower power management system 10B for managing power supplied to the linear radio frequency power amplifier 22 according to an alternate embodiment of the pseudo-envelope follower power management system 10A. As such, FIGS. 1A and 2A depict an example embodiment of the pseudo-envelope follower power management system 10A including a multi-level charge pump buck converter 12, a parallel amplifier circuit 14, a power inductor 16, a coupling circuit 18, and a bypass capacitor 19. The bypass capacitor 19 has a bypass capacitor capacitance, $C_{BYPASS}$.

The multi-level charge pump buck converter 12 and the parallel amplifier circuit 14 may be configured to operate in tandem to generate a power amplifier supply voltage, $V_{CC}$, at a power amplifier supply output 28 of the pseudo-envelope follower power management system 10A for the linear radio frequency power amplifier 22. The power amplifier supply voltage, $V_{CC}$, may also be referred to as a modulated power supply voltage, $V_{CC}$. The power amplifier supply output 28 provides an output current, $I_{OUT}$, to the linear radio frequency power amplifier 22. The linear radio frequency power amplifier 22 may include a radio frequency power amplifier input configured to receive a modulated radio frequency input signal having an input power $P_{IN}$. The linear radio frequency power amplifier 22 may further include a radio frequency power amplifier output coupled to an output load, $Z_{LOAD}$. The linear radio frequency power amplifier 22 may generate an amplified modulated radio frequency output signal having an output power $P_{OUT}$ in response to the modulated radio frequency input signal having the input power $P_{IN}$.

As an example, the output load, $Z_{LOAD}$, may be an antenna. The radio frequency power amplifier output may generate the amplified modulated radio frequency output signal as a function of the modulated radio frequency input signal and the power amplifier supply voltage, $V_{CC}$. In some embodiments, the power amplifier supply voltage, $V_{CC}$, may be modulated to substantially follow the signal envelope characteristic of the modulated radio frequency input signal to improve the power efficiency of the pseudo-envelope follower power management system 10A. The amplified modulated radio frequency output signal may be provided to the antenna for transmission. The multi-level charge pump buck converter 12 may include a supply input 24, ($V_{BAT}$), configured to receive a battery voltage, $V_{BAT}$, from a battery 20 and a switching voltage output 26 configured to provide a switching voltage, $V_{SW}$. The switching voltage output 26 may be coupled to the power amplifier supply output 28 by the power inductor 16, where the power inductor 16 couples to the bypass capacitor 19 to form an output filter 29 for the switching voltage output 26 of the multi-level charge pump buck converter 12. As such, the power inductor 16 is coupled between the switching voltage output 26 and the power amplifier supply output 28. The power inductor 16 provides a power inductor current, $I_{SW\_OUT}$, to the power amplifier supply output 28. The parallel amplifier circuit 14 may include a parallel amplifier supply input 30 configured to receive the battery voltage, $V_{BAT}$, from the battery 20, a parallel amplifier output 32A, a first control input 34 configured to receive a $V_{RAMP}$ signal, and a second control input configured to receive the power amplifier supply voltage, $V_{CC}$. The parallel amplifier output 32A of the parallel amplifier circuit 14 may be coupled to the power amplifier supply voltage $V_{CC}$, by the coupling circuit 18. A parallel amplifier output voltage, $V_{PARA\_AMP}$, is provided by the parallel amplifier circuit 14.

As an example, the parallel amplifier circuit 14 may generate the parallel amplifier output voltage, $V_{PARA\_AMP}$, based on the difference between the $V_{RAMP}$ signal and the power amplifier supply voltage, $V_{CC}$. Thus, the $V_{RAMP}$ signal may represent either an analog or digital signal that contains the required supply modulation information for a power amplifier collector of a linear radio frequency power amplifier. Typically, the $V_{RAMP}$ signal is provided to the parallel amplifier circuit 14 as a differential analog signal to provide common mode rejection against any noise or spurs that could appear on this signal. The $V_{RAMP}$ signal may be a time domain signal, $V_{RAMP}$ (t), generated by a transceiver or modem and used to transmit radio frequency signals. For example, the $V_{RAMP}$ signal may be generated by a digital baseband processing portion of the transceiver or modem, where the digital $V_{RAMP}$ signal, $V_{RAMP\_DIGITAL}$, is digital-to-analog converted to form the $V_{RAMP}$ signal in the analog domain. In some embodiments, the "analog" $V_{RAMP}$ signal is a differential signal. The transceiver or a modem may generate the $V_{RAMP}$ signal based upon a known radio frequency modulation Amp (t)*cos(2*pi*$f_{RF}$*t+Phase (t)). The $V_{RAMP}$ signal may represent the target voltage for the power amplifier supply voltage, $V_{CC}$, to be generated at the power amplifier supply output 28 of the pseudo-envelope follower power management system 10A, where the pseudo-envelope follower power management system 10A provides the power amplifier supply voltage, $V_{CC}$, to the linear radio frequency power amplifier 22. Also the $V_{RAMP}$ signal may be generated from a detector coupled to the linear radio frequency power amplifier 22.

For example, the parallel amplifier circuit 14 includes the parallel amplifier output 32A that provides the parallel amplifier output voltage, $V_{PARA\_AMP}$, to the coupling circuit 18. The parallel amplifier output 32A sources a parallel amplifier circuit output current, $I_{PAWA\_OUT}$, to the coupling circuit 18. The parallel amplifier circuit 14, depicted in FIG. 1A and FIG. 1B, may provide a parallel amplifier circuit output current estimate 40, $I_{PAWA\_OUT\_EST}$, to the multi-level charge pump buck converter 12 as an estimate of the parallel amplifier circuit output current $I_{PAWA\_OUT}$, of the parallel amplifier circuit 14. Thus, the parallel amplifier circuit output current estimate 40, $I_{PAWA\_OUT\_EST}$, represents an estimate of the parallel amplifier circuit output current $I_{PAWA\_OUT}$, provided by the parallel amplifier circuit 14 as a feedback signal to the multi-level charge pump buck converter 12. Based on the parallel amplifier circuit output current estimate 40, $I_{PAWA\_OUT\_EST}$, the multi-level charge pump buck converter 12 may be configured to control the switching voltage, $V_{SW}$, provided at the switching voltage output 26 of the multi-level charge pump buck converter 12.

In some embodiments of the pseudo-envelope follower power management system 10A, depicted in FIG. 1A, and the pseudo-envelope follower power management system 10B, depicted in FIG. 1B, the coupling circuit 18 may be an offset capacitor, $C_{OFFSET}$. An offset voltage, $V_{OFFSET}$, may be developed across the coupling circuit 18. In other alternative embodiments, the coupling circuit 18 may be a wire trace such that the offset voltage, $V_{OFFSET}$, between the parallel amplifier output voltage, $V_{PARA\_AMP}$, and the power amplifier supply voltage output, $V_{CC}$, is zero volts. In still other embodiments, the coupling circuit may be a transformer.

FIG. 2A depicts one embodiment of a pseudo-envelope tracking modulated power supply system 868 according to one embodiment of the pseudo-envelope tracking modulated power supply system 868.

Figure 2B:
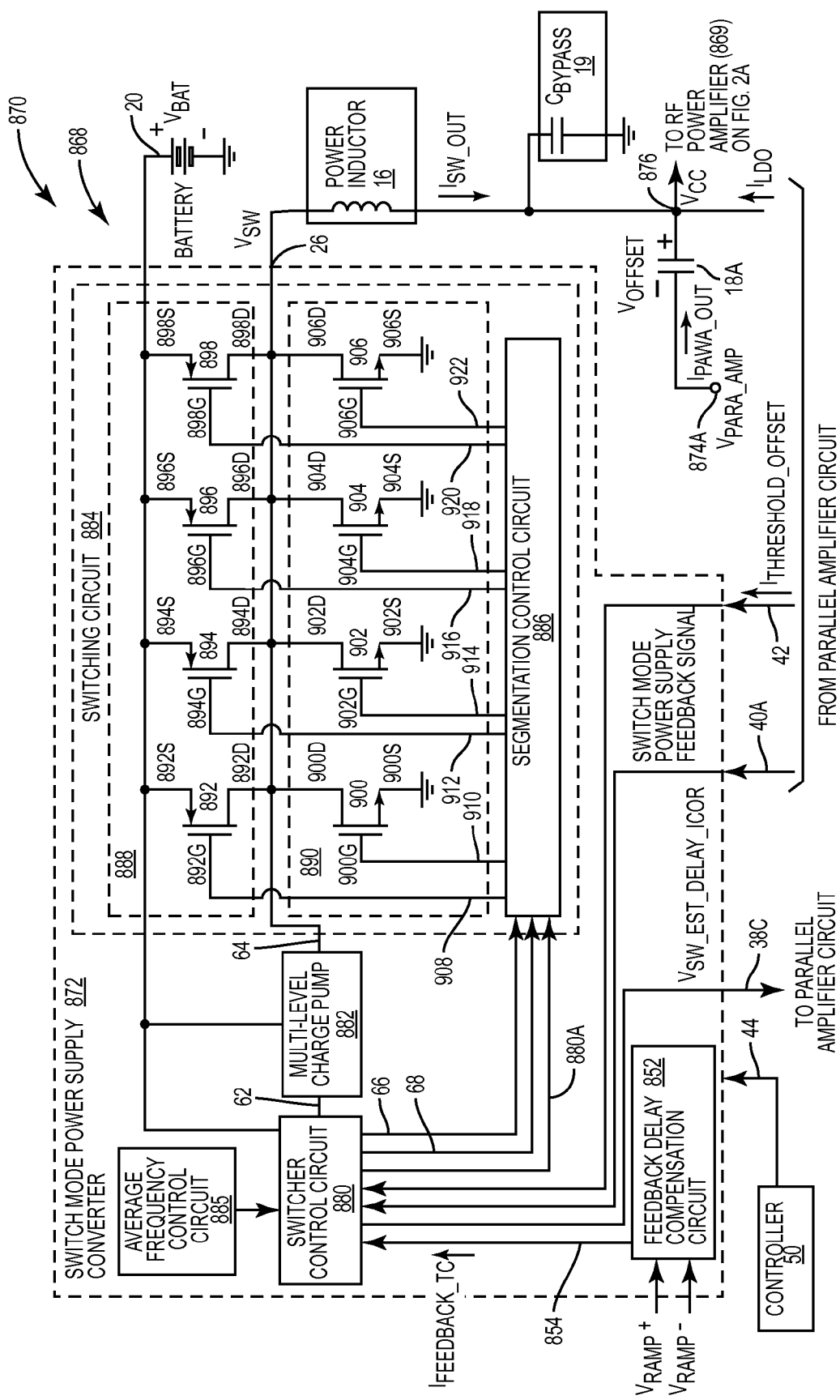
FIG. 2B depicts one embodiment of a pseudo-envelope tracking modulated power supply system according to an alternate embodiment of the pseudo-envelope tracking modulated power supply system.

FIG. 2B depicts one embodiment of a pseudo-envelope tracking modulated power supply system 868 according to an alternate embodiment of the pseudo-envelope tracking modulated power supply system 868.

Figure 2C:
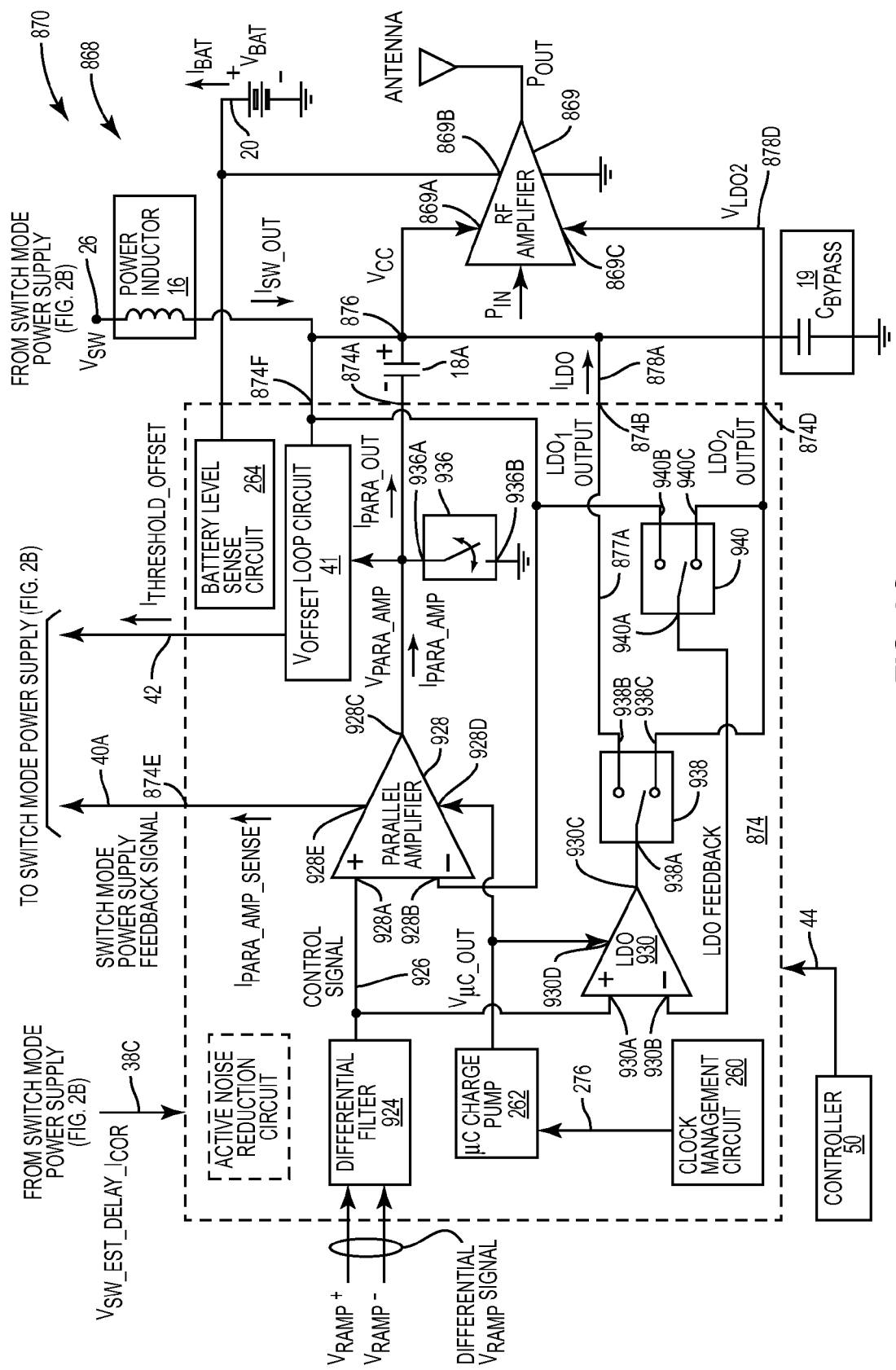
FIG. 2C depicts one embodiment of a pseudo-envelope tracking modulated power supply system according to an additional embodiment of the pseudo-envelope tracking modulated power supply system.

FIG. 2C depicts one embodiment of a pseudo-envelope tracking modulated power supply system 868 according to an additional embodiment of the pseudo-envelope tracking modulated power supply system 868.

FIG. 2A depicts a high level illustration of a pseudo-envelope tracking modulated power supply system 868 that may include a radio frequency power amplifier 869 configured to be powered by or under the control of a power management system 870. The power amplifier supply voltage, $V_{CC}$, may also be referred to as a modulated power supply voltage, $V_{CC}$, that is generated at a modulated power supply output 876.

Similar to other previously described switch mode power supply converters, multi-level charge pump buck converters, and parallel amplifier circuits, a switch mode power supply converter 872 and a parallel amplifier circuit 874 may be configured to receive an input supply voltage from a battery 20. The battery 20 may provide a supply voltage substantially equal to the battery voltage, $V_{BAT}$.

For the sake of simplicity of description, and not by way of limitation, the pseudo-envelope tracking modulated power supply system 868 may include a controller 50 coupled via a control bus 44 to the switch mode power supply converter 872 and the parallel amplifier circuit 874. The switch mode power supply converter 872 may be arranged to cooperatively operate with the parallel amplifier circuit 874 to form the power management system 870, which generates the modulated power supply voltage, $V_{CC}$, at the modulated power supply output 876. For example, in some embodiments, the controller 50 may configure the switch mode power supply converter 872 and the parallel amplifier circuit 874 to operate in various power level modulation modes, depending upon the expected output power to be generated by the radio frequency power amplifier 869 during a transmission of information. In some embodiments, the control functions described with respect to the controller 50 may be incorporated into a digital baseband modem or transceiver circuit that provides a differential $V_{RAMP}$ signal as a control signal to the power management system 870 based on a radio frequency input signal provided to the radio frequency power amplifier 869 for transmission.

The power management system 870 may be configured to receive a differential $V_{RAMP}$ signal having a non-inverted $V_{RAMP}$ signal component, $V_{RAMP}+$, and an inverted $V_{RAMP}$ signal component, $V_{RAMP}-$. In some alternative embodiments, the power management system 870 may be configured to receive a $V_{RAMP}$ signal that is a single ended $V_{RAMP}$ signal, a differential $V_{RAMP}$ signal, and/or both the single ended $V_{RAMP}$ signal and the differential $V_{RAMP}$ signal. The differential $V_{RAMP}$ signal may be provided as a control signal to govern generation of the modulated power supply voltage, $V_{CC}$. Illustratively, the switch mode power supply converter 872 and the parallel amplifier circuit 874 may each be configured to receive the differential $V_{RAMP}$ signal.

The switch mode power supply converter 872 may include the switching voltage output 26 in communication with the modulated power supply output 876. A power inductor 16 may be coupled between the switching voltage output 26 and the modulated power supply output 876.

The parallel amplifier circuit 874 may include a parallel amplifier circuit output 874A in communication with the modulated power supply output 876. Illustratively, in some embodiments, a coupling capacitor 18A is coupled between the modulated power supply output 876 and the parallel amplifier circuit output 874A. In addition, the parallel amplifier circuit 874 may also include a first linear regulator output 874B, $LDO_1$ OUTPUT, in communication with the modulated power supply output 876. In some power level modulation modes, the power management system 870 may configure the first linear regulator output 874B, $LDO_1$ OUTPUT, to provide a high impedance path with respect to ground. In other power level modulation modes, the power management system 870 may configure the first linear regulator output 874B, $LDO_1$ OUTPUT, to apply a first linear regulator output current 878A, $I_{LDO}$, to the modulated power supply output 876 to regulate the modulated power supply voltage, $V_{CC}$.

The parallel amplifier circuit 874 may also include a second linear regulator output 874D, $LDO_2$ OUTPUT, in communication with a CMOS logic supply input 869C. In some power level modulation modes, the power management system 870 may configure the second linear regulator output 874D, $LDO_2$ OUTPUT, to provide a second linear regulator output voltage, $V_{LDO2}$, to the CMOS logic supply input 869C as a function of the battery voltage, $V_{BAT}$. As an example, the CMOS logic supply input 869C may include a minimum CMOS logic supply voltage threshold. Accordingly, the power management system 870 may configure the second linear regulator output 874D, $LDO_2$ OUTPUT, to provide a second linear regulator output voltage, $V_{LDO2}$, to the CMOS logic supply input 869C that is at least equal to the minimum CMOS logic supply voltage threshold.

The parallel amplifier circuit 874 may also include a switch mode power supply converter control output 874E configured to output a switch mode power supply feedback signal 40A to the switch mode power supply converter 872, depicted in FIG. 2B. In addition, the parallel amplifier circuit 874 may provide a threshold offset current 42, $I_{THRESHOLD\_OFFSET}$, to the switch mode power supply converter 872. The parallel amplifier circuit 874 may receive the modulated power supply voltage, $V_{CC}$, from the modulated power supply output 876 at a modulated power supply voltage feedback input 874F. The parallel amplifier circuit 874 may use the input to the modulated power supply voltage feedback input 874F as a feedback signal to regulate the modulated power supply voltage, $V_{CC}$.

In some embodiments, the radio frequency power amplifier 869 may be a linear radio frequency power amplifier. The radio frequency power amplifier 869 may include a radio frequency power amplifier input configured to receive a modulated radio frequency input signal from a digital baseband processing portion of the transceiver or modem, where the modulated radio frequency input signal has an input power, $P_{IN}$. In addition, the radio frequency power amplifier 869 may also include a radio frequency power amplifier output in communication with an antenna via the radio frequency duplexer and switch (not shown). The radio frequency power amplifier 869 may generate an amplified modulated radio frequency output signal having an output power $P_{OUT}$ at the radio frequency power amplifier output.

In some embodiments, the radio frequency power amplifier 869 may include a collector voltage supply input 869A configured to receive the modulated power supply voltage, $V_{CC}$, from the modulated power supply output 876. The radio frequency power amplifier 869 may further include a battery voltage supply input 869B configured to receive the battery voltage, $V_{BAT}$, from the battery 20. The radio frequency power amplifier 869 may also include a CMOS logic supply input 869C configured to receive a second linear regulator output voltage, $V_{LDO2}$.

In some embodiments of the power management system 870, the power management system 870 may be configured to operate in various power level modulation modes based on an expected output power to be generated by the radio frequency power amplifier 869 during a data transmission. In addition, the power management system 870 may be reconfigured prior to each data transmission to minimize the energy drawn from the battery 20 during the data transmission. For example, some embodiments of the power management system 870 may be configured to operate in one of many power level modulation modes on a data transmission slot by data transmission slot basis.

As a non-limiting list of example power level modulation modes of operation, the power management system 870 may be configured to operate in a set of power level modulation modes including a high power modulation mode, a medium power modulation mode, and low power modulation mode. As another example, in other embodiments, the power management system 870 may be configured to operate in a set of power level modulation modes including a high power modulation mode, a medium power modulation mode, a medium power average power tracking modulation modes, and a low power average power tracking modulation mode. In other embodiments, the medium power average power tracking modulation modes are omitted.

As a further example, in a slow tracking mode of operation, the power management system 870 may disable the switch mode power supply converter 872, and configure the parallel amplifier circuit 874 to track an envelope of a modulated radio frequency input signal to be transmitted by the radio frequency power amplifier 869 as a function of a slowly modulated or unmodulated differential $V_{RAMP}$ signal. In the no tracking mode of operation, the power management system 870 may further configure the parallel amplifier circuit 874 to provide a modulated power supply voltage, $V_{CC}$, based on a substantially unmodulated differential $V_{RAMP}$ signal. In the no tracking mode, the power management system 870 may be configured to generate a modulated power supply voltage, $V_{CC}$, that has a substantially fixed voltage level. In the slow tracking mode of operation, the parallel amplifier circuit 874 may be configured to slowly track the envelope of the differential $V_{RAMP}$ signal.

To minimize energy consumed from the battery during a data transmission, the power management system 870 may enable and disable various elements and signal processing functions of the switch mode power supply converter 872 and the parallel amplifier circuit 874 as a function of the power level modulation mode of operation. In some embodiments, the power management system 870 may disable the least energy efficient element and signal processing functions as a function of the expected output power to be generated by the radio frequency power amplifier 869. For example, the power management system 870 may disable portions of the switch mode power supply converter 872, the parallel amplifier circuit 874, and/or a combination thereof as the expected output power of the radio frequency power amplifier 869 decreases to achieve an overall decrease in energy consumption from the battery 20 during a data transmission. In addition, some embodiments of the power management system 870 may generate the modulated power supply output 876 using a less energy efficient device or power generation circuit in response to an expected output power of the radio frequency power amplifier 869 falling below a low power modulation mode threshold in order to disable other energy consuming circuitry and achieve an overall reduction in energy drawn from the battery 20 during a data transmission.

As a non-limiting example, in some embodiments of the high power level modulation mode and the medium power modulation mode, the power management system 870 may configure the switch mode power supply converter 872 and the parallel amplifier circuit 874 to generate the modulated power supply voltage, $V_{CC}$, based on the differential $V_{RAMP}$ signal as a function of the expected output power to be generated by the radio frequency power amplifier 869 during the data transmission. As an example, in some embodiments of the high power modulation mode and the medium power modulation mode, the parallel amplifier circuit 874 may be configured to govern the operation of the switch mode power supply converter 872, regulate generation of the modulated power supply voltage, $V_{CC}$, as a function of the differential $V_{RAMP}$ signal, and regulate the offset voltage, $V_{OFFSET}$, across the coupling capacitor 18A. In one embodiment of the switch mode power supply converter 872, during the high power modulation mode, the switch mode power supply converter 872 boosts the power amplifier supply voltage, $V_{CC}$, above the battery voltage, $V_{BAT}$.

In general, in one embodiment of the pseudo-envelope tracking modulated power supply system 868, during the high power modulation mode and the medium power modulation mode, the power amplifier supply voltage, $V_{CC}$, is modulated and provides envelope tracking. Further, during the low power average power tracking mode, the power amplifier supply voltage, $V_{CC}$, is not modulated and provides average power tracking. In this regard, during the low power average power tracking mode, a magnitude of the power amplifier supply voltage, $V_{CC}$, is adjustable based on an expected output power from the radio frequency power amplifier 869.

As an example, the parallel amplifier circuit 874 may be configured to apply a parallel amplifier circuit output current, $I_{PAWA\_OUT}$, from the parallel amplifier circuit 874 to regulate the modulated power supply voltage, $V_{CC}$, as a function of the differential $V_{RAMP}$ signal. The parallel amplifier circuit 874 may provide the switch mode power supply feedback signal 40A and a threshold offset current 42, $I_{THRESHOLD\_OFFSET}$, to govern the operation of the switch mode power supply converter 872 and regulate the offset voltage, $V_{OFFSET}$, across the coupling capacitor 18A. In response to the switch mode power supply feedback signal 40A and the threshold offset current 42, $I_{THRESHOLD\_OFFSET}$, and the differential $V_{RAMP}$ signal, the switch mode power supply converter 872 may generate the switching voltage, $V_{SW}$, at the switching voltage output 26, and provide a delayed $I_{COR}$ estimated switching voltage output 38C, $V_{SW\_EST\_DELAY\_ICOR}$, to the parallel amplifier circuit 874. In addition, the parallel amplifier circuit 874 may configure the first linear regulator output 874B, $LDO_1$ OUTPUT, to provide a high impedance path to ground. Depending on the battery voltage, $V_{BAT}$, the parallel amplifier circuit 874 may configure the second linear regulator output 874D, $LDO_2$ OUTPUT, to provide the second linear regulator output voltage, $V_{LDO2}$, at least equal to the minimum CMOS logic supply voltage to the CMOS logic supply input 869C of the radio frequency power amplifier 869.

As another non-limiting example, in some embodiments of the low power modulation mode, the power management system 870 may disable the switch mode power supply converter 872 and configure the switching voltage output 26 to provide a high impedance path to ground. In addition, the parallel amplifier circuit output 874A may be configured to provide a low impedance path to ground to short the negative terminal of the coupling capacitor 18A to ground.

To generate the modulated power supply voltage, $V_{CC}$, the first linear regulator output 874B, $LDO_1$ OUTPUT, may be configured to apply a linear regulator output current, $I_{LDO}$, to the modulated power supply output 876 as a function of the differential $V_{RAMP}$ signal and a selected tracking mode of operation. The differential $V_{RAMP}$ signal may be substantially constant or only slowly modulated during the data transmission. In the case where the differential $V_{RAMP}$ signal is substantially constant, the power management system 870 may configure the parallel amplifier circuit 874 to operate in a no tracking mode of operation. In the no tracking mode of operation, the first linear regulator output 874B, $LDO_1$ OUTPUT, may regulate the modulated power supply voltage, $V_{CC}$, to be substantially constant or unmodulated during data transmission. Alternatively, in the case where the differential $V_{RAMP}$ signal slowly changes relative to the envelope of the radio frequency input signal provided to the radio frequency power amplifier 869, the power management system 870 may configure the first linear regulator output 874B, $LDO_1$ OUTPUT, to slowly track the differential $V_{RAMP}$ signal during the data transmission.

In some embodiments of the low power modulation mode, the parallel amplifier circuit 874 may disable the second linear regulator output 874D, $LDO_2$ OUTPUT. In some alternative embodiments of the low power modulation mode, the parallel amplifier circuit 874 may configure the second linear regulator output 874D, $LDO_2$ OUTPUT, to selectively output the second linear regulator output voltage, $V_{LDO2}$, to the CMOS logic supply input 869C as a function of the battery voltage, $V_{BAT}$.

FIG. 2B depicts a non-limiting example of the embodiments of the switch mode power supply converter 872 that may be selectively configured to operate in a number of various buck converter modes, a number of various envelope tracking modes, a number of various average power tracking modes, and/or a combination thereof as a function of an expected output power to be generated by the radio frequency power amplifier 869 depicted in FIGS. 2A and 2C. The switch mode power supply converter 872 may further include an off mode. The various embodiments of the switch mode power supply converter 872 are described with continuing reference to the various embodiments of the power management system 870, depicted in FIGS. 2A-C.

As an example, the various envelope tracking modes may include one or more envelope tracking power modes of operation including the high power modulation mode and the medium power modulation mode. As another example, the various average power tracking modes may include one or more average power tracking modes of operation including a medium power average power tracking mode and a low power average power tracking mode. In one embodiment of the pseudo-envelope tracking modulated power supply system 868, the switch mode power supply converter 872 is arranged to cooperatively operate with the parallel amplifier circuit 874 to form the power management system 870, which operates in one of the high power modulation mode, the medium power modulation mode, and the low power average power tracking mode. In an alternate embodiment of the power management system 870, the power management system 870 operates in one of the high power modulation mode, the medium power modulation mode, the medium power average power tracking mode, and the low power average power tracking mode. The power management system 870 provides envelope tracking using the power amplifier supply voltage, $V_{CC}$, during the high power modulation mode and the medium power modulation mode. As such, during the high power modulation mode and the medium power modulation mode, the power management system 870 controls the power amplifier supply voltage, $V_{CC}$, to the linear radio frequency power amplifier 22 to provide the envelope tracking. Further, the pseudo-envelope tracking modulated power supply system 868 provides average power tracking during the low power average power tracking mode. As such, during the low power average power tracking mode, the power management system 870 controls the power amplifier supply voltage, $V_{CC}$, to the linear radio frequency power amplifier 22 to provide the average power tracking.

In one embodiment of the pseudo-envelope tracking modulated power supply system 868, the linear radio frequency power amplifier 22 sequentially transmits multiple communications slots. As such, selection of the one of the high power modulation mode, the medium power modulation mode, and the low power average power tracking mode is based on an expected output power from the radio frequency power amplifier 869 and is made on a communications slot to communications slot basis. In one embodiment of the pseudo-envelope tracking modulated power supply system 868, during the low power average power tracking mode, adjustment of a magnitude of the power amplifier supply voltage, $V_{CC}$, is made on a communications slot to communications slot basis.

The controller 50 may configure the switch mode power supply converter 872 to operate in the medium power average power tracking mode when the power management system 870 is configured to operate in a medium power average power tracking modulation mode. The controller 50 may configure the switch mode power supply converter 872 to be in a high power modulation mode when the power management system 870 is configured to operate in the high power modulation mode. The controller 50 may configure the switch mode power supply converter 872 to be in a medium power modulation mode when the power management system 870 is configured to operate in the medium power modulation mode. The controller 50 may configure the switch mode power supply converter 872 to be in an off mode when the power management system 870 is configured to operate in either a low power modulation mode or a low power average power tracking mode.

The switch mode power supply converter 872 may include embodiments of a switcher control circuit 880, a multi-level charge pump 882, a switching circuit 884, and an average frequency control circuit 885. The switcher control circuit 880, the multi-level charge pump 882, the switching circuit 884, and a feedback delay compensation circuit 852 may be configured to receive the battery voltage, $V_{BAT}$. Some embodiments of the switch mode power supply converter 872 may further include the feedback delay compensation circuit 852. The controller 50 may configure the switcher control circuit 880 to govern the operation of the multi-level charge pump 882 and the switching circuit 884 as a function of the power level modulation mode and the expected output power to be generated by the embodiments of the radio frequency power amplifier 869 in response to a modulated radio frequency input signal to be transmitted. In some embodiments, the switcher control circuit 880 may also be configured to control the operation of the feedback delay compensation circuit 852 as a function of the power level modulation mode and the expected output power of the radio frequency power amplifier 869. In addition, in some embodiments, the feedback delay compensation circuit 852 may generate a feedback delay compensation signal 854, $I_{FEEDBACK\_TC}$, as a function of the power level modulation mode and the expected output power of the radio frequency power amplifier 869.

As a non-limiting example, in the high power modulation mode, the controller 50 or the switcher control circuit 880 may configure the feedback delay compensation circuit 852 to operate as a function of a high power mode apparent gain to increase the aggressiveness of the feedback compensation provided by the feedback delay compensation signal 854, $I_{FEEDBACK\_TC}$. As the apparent gain of the feedback delay compensation circuit 852 is increased, the switch mode power supply converter 872 may respond to a change in the target voltage for the modulated power supply voltage, $V_{CC}$, provided by the differential $V_{RAMP}$ signal, which may increase the power efficiency of the various embodiments of a parallel amplifier 928, depicted in FIG. 2C.

In the medium power modulation mode, the controller 50 or the switcher control circuit 880 may configure the feedback delay compensation circuit 852 to operate as a function of a medium power mode apparent gain to decrease the aggressiveness of the feedback compensation provided by the feedback delay compensation signal 854, $I_{FEEDBACK\_TC}$, in order to prevent the switcher control circuit 880 from prematurely changing the switching voltage, $V_{SW}$. The feedback delay compensation circuit 852 may operate in an overly aggressive manner when the apparent gain is set too high with respect to the expected output power to be generated by the radio frequency power amplifier 869 during a data transmission. Over aggressiveness of feedback compensation provided by the feedback delay compensation circuit 852 may result in pre-mature changes in the switching voltage, $V_{SW}$, because the switch mode power supply converter 872 may overreact to a change in the target voltage for the modulated power supply voltage, $V_{CC}$, provided by the differential $V_{RAMP}$ signal. As a result, the switch mode power supply converter 872 may generate a switching voltage that provides too much or too little energy to the modulated power supply voltage $V_{CC}$, which may decrease the power efficiency of the various embodiments of the parallel amplifier 928, depicted in FIG. 2C.

In some embodiments of the medium power modulation mode, the controller 50 may set the apparent gain of the feedback delay compensation circuit 852 based on a sliding scale as a function of the expected output power to be generated by the radio frequency power amplifier 869 during the data transmission. As an alternative example, some embodiments of the switcher control circuit 880 may be further configured to adjust the apparent gain of the feedback delay compensation circuit 852 based on a segmentation mode of the switching circuit 884. In some embodiments, the controller 50 or the switcher control circuit 880 may disable the feedback delay compensation circuit 852 during the low power average power tracking mode and during the off mode. Some embodiments of the power management system 870 may enable the feedback delay compensation circuit 852 in a high power modulation mode and a medium power modulation mode.

In the low power average power tracking mode, the switcher control circuit 880 may disable the multi-level charge pump 882 and the switching circuit 884, and configure the switching voltage output 26 to provide a high impedance path to ground. In the low power average power tracking mode, the switch mode power supply converter 872 may be configured to disable a clocking signal that may be used by a µC charge pump circuit 262.

In a buck converter "bang-bang" mode of operation, the switcher control circuit 880 may disable the multi-level charge pump 882, and control the switching circuit 884 to swing the switching voltage, $V_{SW}$, between the battery voltage, $V_{BAT}$, and ground. In the multi-level charge pump buck converter mode, the switcher control circuit 880 may enable both the multi-level charge pump 882 and the switching circuit 884. The switcher control circuit 880 may further control the multi-level charge pump 882 and the switching circuit 884 to generate both buck level voltages and boost level voltages to provide the switching voltage, $V_{SW}$, at the switching voltage output 26 as a function of the operational state of the switcher control circuit 880 and the power level modulation mode.

In a medium power average power tracking mode of operation, the switcher control circuit 880 may be configured to operate in a number of average power tracking "bang-bang" modes of operation. As an example, in some embodiments of an average power tracking "bang-bang" mode of operation, the switcher control circuit 880 may configure the multi-level charge pump 882 and the switching circuit 884 to switch the switching voltage, $V_{SW}$, between only a first bang-bang switching voltage, $V_{SW\_BB1}$, and a second bang-bang switching voltage, $V_{SW\_BB2}$, during a data transmission, where the first bang-bang switching voltage, $V_{SW\_BB1}$, is less than the second bang-bang switching voltage, $V_{SW\_BB2}$.

Unlike a buck converter mode of operation in which the switching voltage $V_{SW}$ swings between ground and the battery supply, $V_{BAT}$, the first bang-bang switching voltage, $V_{SW\_BB1}$, may be substantially equal to ground, the battery voltage, $V_{BAT}$, or the switching voltage $V_{SW}$ between ground and the battery voltage, $V_{BAT}$. The second bang-bang switching voltage, $V_{SW\_BB2}$, may be substantially equal to the supply voltage, $V_{BAT}$, or a charge pump output voltage generated by the multi-level charge pump 882 from the battery voltage, $V_{BAT}$. The average power tracking "bang-bang" modes of operation may include an average power tracking "buck-buck" mode of operation and an average power tracking "buck-boost" mode of operation.

In the average power tracking "buck-buck" mode of operation, the switcher control circuit 880 may configure the multi-level charge pump 882 and the switching circuit 884 to generate a first bang-bang switching voltage, $V_{SW\_BB1}$, and a second bang-bang switching voltage, $V_{SW\_BB2}$, that are no greater than the battery voltage, $V_{BAT}$. For example, the switcher control circuit 880 may configure the multi-level charge pump 882 to generate only a bucked output voltage at a charge pump output 64. As an example, the switcher control circuit may configure the multi-level charge pump 882 to generate a first buck mode output voltage, $V_{FIRST\_BUCK}$, substantially equal to $\frac{1}{2} \times V_{BAT}$ in a first buck mode of operation. In the average power tracking "buck-buck" mode, the switcher control circuit 880 may disable the multi-level charge pump 882 provided the first bang-bang switching voltage, $V_{SW\_BB1}$, and the second bang-bang switching voltage, $V_{SW\_BB2}$, are a shunt mode output voltage substantially equal to ground and a series mode output voltage substantially equal to $V_{BAT}$, respectively.

In the average power tracking "buck-boost" mode, the first bang-bang switching voltage, $V_{SW\_BB1}$, may be no greater than the battery voltage, $V_{BAT}$, and the second bang-bang switching voltage, $V_{SW\_BB2}$, is a boost voltage that is greater than the battery voltage, $V_{BAT}$. In the average power tracking "buck-boost" mode, the switcher control circuit 880 may configure the multi-level charge pump 882 and the switching circuit 884 to generate the first bang-bang switching voltage, $V_{SW\_BB1}$. The switcher control circuit 880 may configure the multi-level charge pump 882 to generate the second bang-bang switching voltage, $V_{SW\_BB2}$. A further description of the average power tracking "bang-bang" modes of operation is provided below.

Some embodiments of the switcher control circuit 880 may be configured to form a composite control signal as a function of the various envelope tracking modes, the various average power tracking modes, and buck converter modes. As an example, the various embodiments of the switcher control circuit 880 may combine the various fractional amounts and combinations of the feedback delay compensation signal 854, $I_{FEEDBACK\_TC}$, the switch mode power supply feedback signal 40A, and the threshold offset current 42, $I_{THRESHOLD\_OFFSET}$, to form one or more composite control signals as a function of the power level modulation mode. In some embodiments, the composite control signal may depend on the power level modulation mode.

As an example, FIG. 2C depicts an embodiment of the power management system 870 in which a parallel amplifier 928 may generate the switch mode power supply feedback signal 40A in the high power modulation mode and medium power modulation mode. In addition, a $V_{OFFSET}$ loop circuit 41 may generate the threshold offset current 42, $I_{THRESHOLD\_OFFSET}$, in the high power modulation mode and the medium power modulation mode.

Returning to FIG. 2B, the switcher control circuit 880 may also provide a series switch control signal 66 and a shunt switch control signal 68 to the switching circuit 884. In response to an assertion of the series switch control signal 66, the switching circuit 884 couples the switching voltage output 26 to the battery voltage, $V_{BAT}$, to generate the switching voltage, $V_{SW}$, substantially equal to $V_{BAT}$. In response to the shunt switch control signal 68, the switching circuit 884 couples the switching voltage output 26 to ground to generate the switching voltage, $V_{SW}$, substantially equal to zero. In addition, the switcher control circuit 880 provides a segmentation control signal 880A to the switching circuit 884 as a function of the power level modulation mode. In some embodiments, the switcher control circuit 880 may generate the segmentation control signal 880A as a function of the power level modulation mode and the expected output power to be generated by the radio frequency power amplifier 869 during a data transmission. For example, some embodiments of the power management system 870 may be configured to generate the segmentation control signal 880A based on an average expected output power, $P_{OUT\_AVE}$, of the radio frequency power amplifier 869 that maximizes the efficiency of the switch mode power supply converter 872.

In general, the switch mode power supply converter 872 has a segmented output stage, such that during the high power modulation mode and the medium power modulation mode, segment selection of the segmented output stage is based on an expected output power from the radio frequency power amplifier 869 to increase efficiency of the pseudo-envelope tracking modulated power supply system 868.

The switcher control circuit 880 may configure the switch mode power supply converter 872 to generate a switching voltage, $V_{SW}$, at the switching voltage output 26 based on an operational state of the switcher control circuit 880 as a function of a power level modulation mode, which is dependent on the expected output power to be generated by the radio frequency power amplifier 869 during a data transmission. In some embodiments, the switcher control circuit 880 may configure the multi-level charge pump 882 and the switching circuit 884 to operate in one of a buck converter "bang-bang" mode, a multi-level charge pump buck converter mode, and an average power tracking mode of operation as a function of the power level modulation mode and operational mode of the switcher control circuit 880.

Referring to FIGS. 2C and 2B, in some embodiments, a control signal 926, received at the non-inverting input of the parallel amplifier 928 to generate the parallel amplifier output current, $I_{PARA\_AMP}$, may be generated by a differential filter 924 as a function of the power level modulation mode. For example, in the high power modulation mode, the differential filter 924 may provide an increased level of frequency compensation or correction as compared to the frequency compensation or correction provided by the differential filter 924 in the medium power modulation mode. Accordingly, some embodiments of the switcher control circuit 880, the switch mode power supply converter 872, the parallel amplifier circuit 874 and/or a combination thereof, may be further adapted to adjust a scaling factor, M, provided to a buffer scalar 434, and/or the magnitude of the delayed $I_{COR}$ estimated switching voltage output 38C, $V_{SW\_EST\_DELAY\_ICOR}$, as a function of the power level modulation mode.

Some alternative embodiments of the switcher control circuit 880, the switch mode power supply converter 872, the parallel amplifier circuit 874, and/or combinations thereof, may be further configured to adjust the magnitude of the delayed $I_{COR}$ estimated switching voltage output 38C, $V_{SW\_EST\_DELAY\_ICOR}$, based on the magnitude of the control signal 926 that is received by at the non-inverting input of the parallel amplifier 928, which is generated by the differential filter 924. In some embodiments, the switcher control circuit 880 may selectively adjust the scaling factor, M, as a function of the magnitude of the differential $V_{RAMP}$ signal and the power level modulation mode. For example, in some embodiments of the switcher control circuit 880, the scaling factor, M, may be further adjusted as a function of the power level modulation mode to reflect the amount of frequency compensation or correction applied by the differential filter 924 to generate the control signal 926 received at the non-inverting input 928A of the parallel amplifier 928, depicted in FIG. 2C.

In some embodiments of the power management system 870, either the switch mode power supply converter 872 or the parallel amplifier circuit 874 may be further adapted to adjust the scaling factor, M, based on the magnitude of the control signal 926 or the power level modulation mode. For example, in some embodiments, the magnitude of the delayed $I_{COR}$ estimated switching voltage output 38C, $V_{SW\_EST\_DELAY\_ICOR}$, may be adjusted as a function of the power level modulation mode, the magnitude of the differential $V_{RAMP}$ signal, and the expected frequency response of the parallel amplifier 928 when operating in each of the respective power level modulation modes.

For example, a switcher propagation delay is a time period between when the state of the switcher control circuit 880 changes to a new operational state and the switching voltage, $V_{SW}$, generated in response to the new operational state of the switcher control circuit 880, is generated at the switching voltage output 26. In some embodiments of the switch mode power supply converter 872, the switcher propagation delay may vary based on being configured to operate in the envelope tracking mode of operation and the average power tracking mode. Thus, the controller 50 may be configured to adjust the programmable delay period as a function of an expected output power to be generated by the radio frequency power.

As another example, in some embodiments, the switching circuit 884 may be a segmented switching circuit having a number of sets of series switch and shunt switch pairs. The sets of series switch and shunt switch pairs may be arranged in parallel and operably coupled to form a segmented series switch and shunt switch network. The switcher control circuit 880 may generate a series switch control signal 66, a shunt switch control signal 68, and the segmentation control signal 880A based on an operational state of the switcher control circuit 880 to control the operation of the switching circuit 884. In addition, the segmentation control signal 880A may be dependent on the power level modulation mode of the power management system 870. For example, the switcher control circuit 880 may configure the segmentation control signal 880A to enable or disable various combinations of the sets of series switch and shunt switch pairs of the switching circuit 884 based on the power level modulation mode of operation of the respective power management system 870, depicted in FIG. 2A-C. As an example, in some embodiments of the medium power modulation mode, the switcher control circuit 880 may generate a segmentation control signal 880A to enable either 75% or 50% of the number of sets of series switch and shunt switch pairs of the switching circuit 884.

In some embodiments of the switching circuit 884, the switcher propagation delay may vary depending on the number of sets of series switch and shunt switch pairs configured to operate during a data transmission. In some embodiments, the switcher control circuit 880 may be configured to adjust a programmable delay period depending on the segmentation control signal 880A to maintain the temporal alignment of the delayed $I_{COR}$ estimated switching voltage output 38C $V_{SW\_EST\_DELAY\_ICOR}$ with respect to the switching voltage, $V_{SW}$, provided at the switching voltage output 26.

The switching circuit 884 may include a segmentation control circuit 886 configured to receive a segmentation control signal 880A from the switcher control circuit 880. The switching circuit 884 may further include segmented series switches 888 and segmented shunt switches 890 in communication with the segmentation control circuit 886. The segmented series switches 888 may include a first series switch 892, a second series switch 894, a third series switch 896, and a fourth series switch 898. The segmented shunt switches 890 may include a first shunt switch 900, a second shunt switch 902, a third shunt switch 904, and a fourth shunt switch 906.

A source 892S of the first series switch 892, a source 894S of the second series switch 894, a source 896S of the third series switch 896, and a source 898S of the fourth series switch 898 are in communication with a supply voltage received from the battery 20 substantially equal to the battery voltage, $V_{BAT}$. A drain 892D of the first series switch 892, a drain 894D of the second series switch 894, a drain 896D of the third series switch 896, and a drain 898D of the fourth series switch 898 are respectively coupled to a drain 900D of the first shunt switch 900, a drain 902D of the second shunt switch 902, a drain 904D of the third shunt switch 904, and a drain 906D of the fourth shunt switch 906 to form the switching voltage output 26. A source 900S of the first shunt switch 900, a source 902S of the second shunt switch 902, a source 904S of the third shunt switch 904, and a source 906S of the fourth shunt switch 906 are in communication with a reference voltage substantially equal to ground.

The segmentation control circuit 886 may include a first series switch control output 908 coupled to the gate 892G of the first series switch 892, a first shunt switch control output 910 coupled to the gate 900G of the first shunt switch 900, a second series switch control output 912 coupled to the gate 894G of the second series switch 894, a second shunt switch control output 914 coupled to the gate 902G of the second shunt switch 902, a third series switch control output 916 coupled to the gate 896G of the third series switch 896, a third shunt control output 918 coupled to the gate 904G of the third shunt switch 904, a fourth series switch control output 920 couple to the gate 898G of the fourth series switch 898, and a fourth shunt switch control output 922 coupled to the gate 906G of the fourth shunt switch 906.

Operationally, the segmentation control circuit 886 may divide the segmented series switches 888 and segmented shunt switches 890 into logical groupings of sets of series and shunt switches such that each set of series and shunt switches includes one of the segmented series switches 888 and one of the segmented shunt switches 890. For example, a first set of series and shunt switches may include the first series switch 892 and the first shunt switch 900. A second set of series and shunt switches may include the second series switch 894 and the second shunt switch 902. A third set of series and shunt switches may include the third series switch 896 and the third shunt switch 904. A fourth set of series and shunt switches may include the fourth series switch 898 and the fourth shunt switch 906.

The segmentation control circuit 886 is configured to receive a series switch control signal 66 and a shunt switch control signal 68 from the switcher control circuit 880. The power management system 870 may configure the switcher control circuit 880 to generate a segmentation control signal 880A to select which of the segmented series switches 888 and segmented shunt switches 890 are to be enabled by the segmentation control circuit 886 to generate the switching voltage, $V_{SW}$, at the switching voltage output 26 as a function of the average expected output power, $P_{OUT\_AVE}$, to be generated by the radio frequency power amplifier 869 during the data transmission. Illustratively, in the case where there are four sets of series and shunt switches, the operation of the segmentation control circuit 886 may be divided into four regions or modes of operation.

In some embodiments, the switcher control circuit 880 may generate the segmentation control signal 880A as a function of the average expected output power, $P_{OUT\_AVE}$, and a set of switcher output power thresholds including a first switcher output power threshold, $P_{OUT1}$, a second switcher output power threshold, $P_{OUT2}$, and a third switcher output power threshold, $P_{OUT3}$. The values of the first switcher output power threshold, $P_{OUT1}$, the second switcher output power threshold, $P_{OUT2}$, and the third switcher output power threshold, $P_{OUT3}$, may be determined to maximize the efficiency of the switch mode power supply converter 872 with respect to the expected output power of the radio frequency power amplifier 869 as a function of the power level modulation mode and an expected load line, $R_{RF\_AMP\_EXP}$, of the radio frequency power amplifier 869 during the data transmission.

In the case where the average expected output power, $P_{OUT\_AVE}$, of the radio frequency power amplifier 869 is at least equal to the first switcher output power threshold, $P_{OUT1}$, the segmentation control signal 880A may configure the segmentation control circuit 886 to enable all four of the series switch and shunt switch segments. In the case where the average expected output power, $P_{OUT\_AVE}$, of the radio frequency power amplifier 869 is less than the first switcher output power threshold, $P_{OUT1}$, and at least equal to the second switcher output power threshold, $P_{OUT2}$, the segmentation control signal 880A may configure the segmentation control circuit 886 to enable three of the series switch and shunt switch segments. In the case where the average expected output power, $P_{OUT\_AVE}$, of the radio frequency power amplifier 869 is less than the second switcher output power threshold, $P_{OUT2}$, and at least equal to the third switcher output power threshold, $P_{OUT3}$, the segmentation control signal 880A may configure the segmentation control circuit 886 to enable two of the series switch and shunt switch segments. And in the case where the average expected output power, $P_{OUT\_AVE}$, of the radio frequency power amplifier 869 is less than the third switcher output power threshold, $P_{OUT3}$, the segmentation control signal 880A may configure the segmentation control circuit 886 to enable one of the series switch and shunt switch segments.

The multi-level charge pump 882 may configure a multi-level charge pump switching network to generate a variety of "boost" output voltages and "buck" output voltages as a function of a charge pump mode control signal 62 received from the switcher control circuit 880. Some embodiments of the multi-level charge pump 882 may generate a variety of "boost" output voltages and "buck" output voltages as a multi-level charge pump output voltage, $V_{MLCP}$, in response to the charge pump mode control input 62 generated by the switcher control circuit 880. The multi-level charge pump 882 may provide the multi-level charge pump output voltage, $V_{MLCP}$, to the charge pump output 64, which may be coupled through the switching circuit 884 to the switching voltage output 26.

For example, in a second boost mode of operation, the multi-level charge pump 882 may configure the multi-level charge pump switching network to generate a second boost mode output voltage, $V_{SECOND\_BOOST}$, substantially equal to $2 \times V_{BAT}$ at the charge pump output 64. In a first boost mode of operation, the multi-level charge pump 882 may configure the switching network to generate a first boost mode output voltage at the charge pump output 64 substantially equal to $\frac{3}{2} \times V_{BAT}$. In a first buck mode of operation, the multi-level charge pump 882 may configure the multi-level charge pump switching network to generate a first buck mode output voltage at the charge pump output 64 substantially equal to $\frac{1}{2} \times V_{BAT}$. In some alternative embodiments, the multi-level charge pump 882 may be configured to generate other ratios of boost mode output voltages and buck mode output voltage.

Some embodiments of the multi-level charge pump 882 may include only two flying capacitors that are coupled in various switching arrangements with respect to each other, the battery voltage, $V_{BAT}$, and the charge pump output 64 to generate the various charge pump output voltages at the charge pump output 64. For example, similar to the μC charge pump circuit 262, some embodiments of the multi-level charge pump 882 may generate various ratios of output voltages that may be provided as a boost output voltage or a buck output voltage to the switching voltage output 26 as the switching voltage, $V_{SW}$. In still other alternative embodiments, the multi-level charge pump 882 may generate a boost output voltage or a buck output voltage with respect to a supply voltage other than the battery voltage, $V_{BAT}$, where the supply voltage may be greater than the battery voltage, $V_{BAT}$, or less than the battery voltage, $V_{BAT}$. In some alternative embodiments, the supply voltage provided to the multi-level charge pump 882 may be a boosted voltage or a bucked voltage derived from the battery voltage, $V_{BAT}$.

Based on the power level modulation mode, in some embodiments of the multi-level charge pump buck converter mode of operation, the switcher control circuit 880 may configure the switch mode power supply converter 872 to generate a series output voltage substantially equal to the battery voltage, $V_{BAT}$, a shunt output voltage substantially equal to a ground voltage, and a subset of the available charge pump output voltages. As an example, as a function of the power level modulation mode, the switcher control circuit 880 may configure the multi-level charge pump 882 and the switching circuit 884 to generate a shunt mode output voltage substantially equal to a ground voltage in the shunt output mode, a series mode output voltage substantially equal to $V_{BAT}$ in the series output mode, and a first boost mode output voltage $V_{FIRST\_BOOST}$ substantially equal to $\frac{3}{2} \times V_{BAT}$ in the first boost output mode. As another non-limiting example, as a function of the power level modulation mode, in some power level modulation modes, the switcher control circuit 880 may configure the multi-level charge pump 882 to provide a first buck mode output voltage substantially equal to $\frac{1}{2} \times V_{BAT}$ in the first buck mode of operation. As an example, as a function of the power level modulation mode, the switcher control circuit 880 may configure the multi-level charge pump 882 and the switching circuit 884 to generate a shunt mode output voltage substantially equal to ground, a first buck mode output voltage substantially equal to $\frac{1}{2} \times V_{BAT}$, a series mode output voltage substantially equal to $V_{BAT}$, and a first boost mode output voltage substantially equal to $\frac{3}{2} \times V_{BAT}$ as a function of the operational state of the switcher control circuit 880. As still another non-limiting example, in some power level modulation modes, the switcher control circuit 880 may configure the multi-level charge pump 882 to only operate in a first boost mode of operation to generate a first boost mode output voltage, $V_{FIRST\_BOOST}$, substantially equal to $\frac{3}{2} \times V_{BAT}$.

As another example, in some power level modulation modes, the multi-level charge pump 882 may be configured to only operate in the second boost mode of operation. In still another example, in some power level modulation modes, the multi-level charge pump 882 may be configured to operate in the first buck mode and either the first boost mode or the second boost mode of operation. For example, in some power level modulation modes, the switcher control circuit 880 may configure the multi-level charge pump 882 to provide either a first buck mode output voltage substantially equal to $\frac{1}{2} \times V_{BAT}$ and a first boost mode output voltage substantially equal to $\frac{3}{2} \times V_{BAT}$ as a function of the operational state of the switcher control circuit 880. In other power level modulation modes, the switcher control circuit may configure the multi-level charge pump 882 to provide a buck output voltage substantially equal to $\frac{1}{2} \times V_{BAT}$ in the first buck mode and a second boost level output voltage substantially equal to $2 \times V_{BAT}$ as a function of the operational state of the switcher control circuit 880.

Depending on a power level modulation mode, a characteristic of the data transmission, and/or a desired distribution of harmonics of the switching frequency within the frequency spectrum, the controller 50 may configure the comparator thresholds to set the equivalent main ripple voltage level at the modulated power supply output 876 and/or the switching frequency of the switch mode power supply converter 872. For example, in the medium power average power tracking modulation mode The parallel amplifier 928 may include a non-inverting input 928A configured to receive the control signal 926. In some embodiments, the control signal 926 may be a compensated $V_{RAMP}$ signal, $V_{RAMP\_C}$. The parallel amplifier 928 may also include an inverting input 928B in communication with the modulated power supply output 876. Based on the difference between the control signal and the modulated power supply voltage, $V_{CC}$, the parallel amplifier 928 may generate a parallel amplifier output current, $I_{PARA\_AMP}$, at the parallel amplifier output 928C in order to generate the parallel amplifier output voltage, $V_{PARA\_AMP}$ at the parallel amplifier circuit output 874A during the high power modulation mode and the medium power modulation mode. Additionally, the parallel amplifier 928 may be disabled during the low power average power tracking mode. In another embodiment of the parallel amplifier 928, the parallel amplifier 928 is disabled during the medium power average power tracking mode.

The parallel amplifier 928 may generate a scaled parallel amplifier output current estimate, $I_{PARA\_AMP\_SENSE}$, which is a fractional representation of the parallel amplifier output current, $I_{PARA\_AMP}$, from the parallel amplifier feedback output 928E. The parallel amplifier 928 may include a parallel amplifier supply voltage input 928D configured to receive a μC charge pump output voltage, $V_{\mu C\_OUT}$, from the μC charge pump circuit 262, such that the parallel amplifier output voltage, $V_{PARA\_AMP}$ is based on the μC charge pump output voltage, $V_{\mu C\_OUT}$ during the high power modulation mode and the medium power modulation mode. In general, the power amplifier supply voltage, $V_{CC}$, is based on the μC charge pump output voltage, $V_{\mu C\_OUT}$, during the high power modulation mode and the medium power modulation mode.

In one embodiment of the parallel amplifier 928, the parallel amplifier 928 has a segmented output stage, such that during the high power modulation mode and the medium power modulation mode, segment selection of the segmented output stage is based on an expected output power from the radio frequency power amplifier 869 to increase efficiency of the pseudo-envelope tracking modulated power supply system 868.

Alternatively, as previously described, in some embodiments the parallel amplifier supply voltage input 928D may be switchably configured to be powered by the μC charge pump output voltage, $V_{\mu C\_OUT}$, or a supply voltage provided by the multi-level charge pump 882 of the switch mode power supply converter 872, depicted in FIG. 2B.

For example, in some embodiments, the μC charge pump circuit 262 may generate the μC charge pump output voltage, $V_{\mu C\_OUT}$, as a function of the battery voltage and the modulation mode of operation. As such, the μC charge pump output voltage, $V_{\mu C\_OUT}$, may be based on a charge-pump-ratio, which may be based on one of at least the high power modulation mode, the medium power modulation mode, and the low power average power tracking mode. For example, in the high power modulation mode, the power management system 870 may configure the μC charge pump circuit 262 to operate in the $1 \times V_{BAT}$ mode or the $\frac{4}{3} \times V_{BAT}$ mode to generate the μC charge pump output voltage, $V_{\mu C\_OUT}$, substantially equal to either the battery voltage, $1 \times V_{BAT}$, or $\frac{4}{3} \times V_{BAT}$, respectively, which equates to a charge-pump-ratio of 1 or $\frac{4}{3}$, respectively. In the medium power modulation mode, the power management system 870 may configure the μC charge pump circuit 262 to operate in the $1 \times V_{BAT}$ mode or the $\frac{2}{3} \times V_{BAT}$ mode to generate the μC charge pump output voltage, $V_{\mu C\_OUT}$, substantially equal to either the battery voltage, $V_{BAT}$, or $\frac{2}{3} \times V_{BAT}$, respectively, which equates to a charge-pump-ratio of 1 or $\frac{2}{3}$, respectively. In some embodiments, in the low power modulation mode, the power management system 870 may configure the μC charge pump circuit 262 to operate in the $\frac{1}{4} \times V_{BAT}$ mode, $\frac{1}{3} \times V_{BAT}$ mode, or the $\frac{1}{2} \times V_{BAT}$ mode to generate the μC charge pump output voltage, $V_{\mu C\_OUT}$, substantially equal to $\frac{1}{4} \times V_{BAT}$, $\frac{1}{3} \times V_{BAT}$, or $\frac{1}{2} \times V_{BAT}$, respectively, which equates to a charge-pump-ratio of $\frac{1}{4}$, $\frac{1}{3}$, or $\frac{1}{2}$, respectively.

In one embodiment of the μC charge pump circuit 262, the μC charge pump circuit 262 provides the μC charge pump output voltage, $V_{\mu C\_OUT}$ based on the battery voltage, $V_{BAT}$. In one embodiment of the μC charge pump circuit 262, the μC charge pump circuit 262 is a capacitor-based charge pump circuit 262, such that multiple switched flying capacitors are used to provide the μC charge pump output voltage, $V_{\mu C\_OUT}$ In an alternate embodiment of the parallel amplifier circuit 874, the μC charge pump circuit 262 is replaced with a μL charge pump circuit (not shown), which provides the μC charge pump output voltage, $V_{\mu C\_OUT}$ based on the battery voltage, $V_{BAT}$. The μL charge pump circuit (not shown) is an inductor-based charge pump circuit, such that at least one inductor is used to provide the μC charge pump output voltage, $V_{\mu C\_OUT}$ As such, either the μC charge pump circuit 262, the μL charge pump circuit (not shown), or both may operate in a boost, a buck mode, or both. As such, the μC charge pump output voltage, $V_{\mu C\_OUT}$ may be greater than, equal to, or less than the battery voltage, $V_{BAT}$.

In one embodiment of the μC charge pump circuit 262, the μC charge pump circuit 262 has a segmented output stage, such that during the high power modulation mode, during the medium power modulation mode, and during the low power average power tracking mode, segment selection of the segmented output stage is based on an expected output power from the radio frequency power amplifier 869 to increase efficiency of the pseudo-envelope tracking modulated power supply system 868.

In some embodiments, a segmented parallel amplifier output stage of the parallel amplifier 928 may be configured based upon the expected output power of the radio frequency power amplifier 869. As an example, the segmentation configuration of the parallel amplifier 928 may be a function of a maximum instantaneous output power, $P_{INST\_MAX}$, to be generated by the radio frequency power amplifier 869 during the data transmission and the expected load line, $R_{RF\_AMP\_EXP}$, of the radio frequency power amplifier 869 during the data transmission. As an example, in some embodiments, a maximum instantaneous output current, $I_{MAX\_PARA\_AMP}$, to be provided by the parallel amplifier 928 during the data transmission may be substantially equal to $(P_{INST\_MAX}/R_{RF\_AMP\_EXP})^{1/2}$. In some embodiments, the parallel amplifier 928 may include a maximum parallel amplifier output current, $I_{PARA\_MAX}$, which is the maximum output current to be generated by the parallel amplifier 928. In some embodiments, the power management system 870 may configure the segmentation configuration of the parallel amplifier 928 based on the maximum parallel amplifier output current, $I_{PARA\_MAX}$, and the maximum instantaneous output current, $I_{MAX\_PARA\_AMP}$.

For example, in some embodiments, the controller may determine the maximum instantaneous output current, $I_{MAX\_PARA\_AMP}$, based on the envelope characteristics of the modulated radio frequency input signal to be transmitted and the expected load line, $R_{RF\_AMP\_EXP}$, of the radio frequency power amplifier 869 during the data transmission. The power management system 870 may determine the maximum instantaneous output power, $P_{INST\_MAX}$, based on the envelope characteristics of the modulated radio frequency input signal. Based on the maximum instantaneous output current, $I_{MAX\_PARA\_AMP}$, the power management system 870 may determine an estimated percentage of output current generation capacity of the parallel amplifier 928 that may be used during the data transmission.

For example, the power management system 870 may calculate the percentage of the output current generation capacity based on the ratio of the maximum instantaneous output current, $I_{MAX\_PARA\_AMP}$, to the maximum parallel amplifier output current, $I_{PARA\_MAX}$. The power management system 870 may determine the number of output stage segments of the parallel amplifier 928 to enable based on the estimated percentage of output current generation capacity of the parallel amplifier 928 to be used. For example, in the case where the parallel amplifier 928 includes two output stage segments that are configured to have a substantially equal output current generation capacity, the power management system 870 may set the segmentation configuration to be 100% when the ratio of the maximum instantaneous output current, $I_{MAX\_PARA\_AMP}$, to the maximum parallel amplifier output current, $I_{PARA\_MAX}$, is substantially equal to or near at least 50%. The power management system 870 may set the segmentation configuration to be 50% when the ratio of the maximum instantaneous output current, $I_{MAX\_PARA\_AMP}$, to the maximum parallel amplifier output current, $I_{PARA\_MAX}$, is at least less than 50%. In the case where the output stage segments of the parallel amplifier 928 are not substantially equal, the controller 50 may determine which of the output stage segments to enable based on the ratio of the maximum instantaneous output current, $I_{MAX\_PARA\_AMP}$, and the current generation capacity of each of the output stage segments.

In some alternative embodiments, the segmentation configuration of the parallel amplifier 928 may be based on the expected peak-to-peak swing of a modulated power supply voltage, $V_{CC\_PKPK}$, and the expected load line, $R_{RF\_AMP\_EXP}$, of the radio frequency power amplifier 869 during the data transmission.

For example, when operating in the high power modulation mode, the power management system 870 may set the segmentation configuration to be 100%. Alternatively, the power management system 870 may configure the parallel amplifier 928 to use only the first output stage segment or only the second output stage segment while operating in the medium power modulation mode depending on the ratio of the maximum instantaneous output current, $I_{MAX\_PARA\_AMP}$, to the maximum parallel amplifier output current, $I_{PARA\_MAX}$. And in the low power modulation mode, the power management system 870 may disable the parallel amplifier 928 to place the parallel amplifier output 928C in a high impedance mode.

As previously described with respect to FIG. 2A, FIG. 2C depicts that the parallel amplifier circuit 874 may provide the threshold offset current 42, $I_{THRESHOLD\_OFFSET}$, from an embodiment of the $V_{OFFSET}$ loop circuit 41 to regulate the offset voltage, $V_{OFFSET}$, across the coupling capacitor 18A.

In some embodiments, the $V_{OFFSET}$ loop circuit 41 may be configured to generate the threshold offset current 42, $I_{THRESHOLD\_OFFSET}$, that represents an average or integrated error between the modulated power supply voltage, $V_{CC}$, and a $V_{RAMP}$ signal when the switch mode power supply converter 872 is configured to operate in an average power tracking mode of operation. Some embodiments of the $V_{OFFSET}$ loop circuit 41 may be configured to pre-charge the bypass capacitor 19 and the coupling capacitor 18A while the switch mode power supply converter 872 is configured to operate in the average power tracking mode of operation.

The parallel amplifier circuit 874 may further include a linear regulator 930, LDO. The linear regulator 930, LDO, may be a low dropout voltage linear regulator. The parallel amplifier circuit 874 may also include a parallel amplifier output bypass switch 936, a linear regulator output selection switch 938, and a feedback selection switch 940. The parallel amplifier output bypass switch 936 includes a first terminal 936A coupled to the parallel amplifier output 928C and a second terminal 936B coupled to ground. The power management system 870 may configure the parallel amplifier output bypass switch 936 to close when the parallel amplifier 928 is disabled.

For example, the power management system 870 may configure the parallel amplifier output bypass switch 936 to close based on a determination that the expected output power of the radio frequency power amplifier 869 is less than the low power modulation mode threshold or the parallel amplifier output 928C is disabled and configured to provide a high impedance. Alternatively, the power management system 870 may configure the parallel amplifier output bypass switch 936 to be open when the parallel amplifier 928 is enabled. As such, the parallel amplifier output bypass switch 936 is coupled between the parallel amplifier circuit output 874A and ground. During the high power modulation mode and the medium power modulation mode, the parallel amplifier output bypass switch 936 is OPEN and during the low power average power tracking mode, the parallel amplifier output bypass switch 936 is CLOSED.

The linear regulator output selection switch 938 may include an input terminal 938A coupled to a linear regulator output 930C of the linear regulator 930, LDO, a first output terminal 938B in communication with the modulated power supply output 876, and a second output terminal 938C in communication with the second linear regulator output 874D, LDO$_2$ OUTPUT, in communication with the CMOS logic supply input 869C of the radio frequency power amplifier 869. In one embodiment of the power management system 870, the μC charge pump circuit 262 provides the second linear regulator output voltage, $V_{LDO2}$, to PA CMOS bias circuitry in the radio frequency power amplifier 869 via the linear regulator 930, LDO.

The feedback selection switch 940 includes an output terminal 940A in communication with an inverting input 930B of the linear regulator 930, LDO, a first input terminal 940B in communication with the modulated power supply output 876, and a second input terminal 940C in communication with the second linear regulator output 874D, LDO$_2$ OUTPUT, of the parallel amplifier circuit 874. The linear regulator 930, LDO, also includes a linear regulator power supply input 930D configured to receive the μC charge pump output voltage, $V_{\mu C\_OUT}$. The μC charge pump output voltage, $V_{\mu C\_OUT}$, may be configured provide a voltage level to the linear regulator power supply input 930D as a function of the battery voltage, $V_{BAT}$, and the expected output power of the radio frequency power amplifier 869.

The linear regulator 930, LDO, may also include a non-inverting input 930A in communication with the non-inverting input 928A of the parallel amplifier. The non-inverting input 930A of the linear regulator 930, LDO, may also be in communication with the differential filter 924, and configured to receive the control signal 926 at the non-inverting input 930A. The linear regulator 930, LDO, may also receive a linear regulator feedback signal, LDO FEEDBACK, from the output terminal 940A of the feedback selection switch 940. Based on the difference between the control signal 926 and the linear regulator feedback signal, LDO FEEDBACK, the linear regulator 930, LDO, may generate a linear regulator output voltage at the linear regulator output 930C. Based on the switch states of the linear regulator output selection switch 938 and the feedback selection switch 940, the linear regulator 930, LDO, may generate a linear regulator output voltage to apply the first linear regulator output current 878A, $I_{LDO}$, to the modulated power supply output 876.

In this regard, in one embodiment of the linear regulator output selection switch 938 and the linear regulator 930, LDO, during the low power average power tracking mode, the linear regulator 930, LDO, provides the power amplifier supply voltage, $V_{CC}$ based on the μC charge pump output voltage, $V_{\mu C\_OUT}$. As such, the power amplifier supply voltage, $V_{CC}$, is based on the μC charge pump output voltage, $V_{\mu C\_OUT}$, during the low power average power tracking mode. Further, in one embodiment of the linear regulator 930, LDO, during the medium power modulation mode, the linear regulator 930, LDO, is disabled. Additionally, in one embodiment of the linear regulator 930, LDO, during the high power modulation mode, the linear regulator 930, LDO, is disabled.

In addition, in one embodiment of the linear regulator 930, LDO, during the medium power average power tracking mode, the linear regulator 930, LDO, is disabled. In one embodiment of the linear regulator 930, LDO, and the parallel amplifier 928, during the medium power average power tracking mode, both the linear regulator 930, LDO, and the parallel amplifier 928, are disabled. Further, in one embodiment of the switch mode power supply converter 872, during the medium power average power tracking mode, the switch mode power supply converter 872 provides the power amplifier supply voltage, $V_{CC}$.

Figure 3:
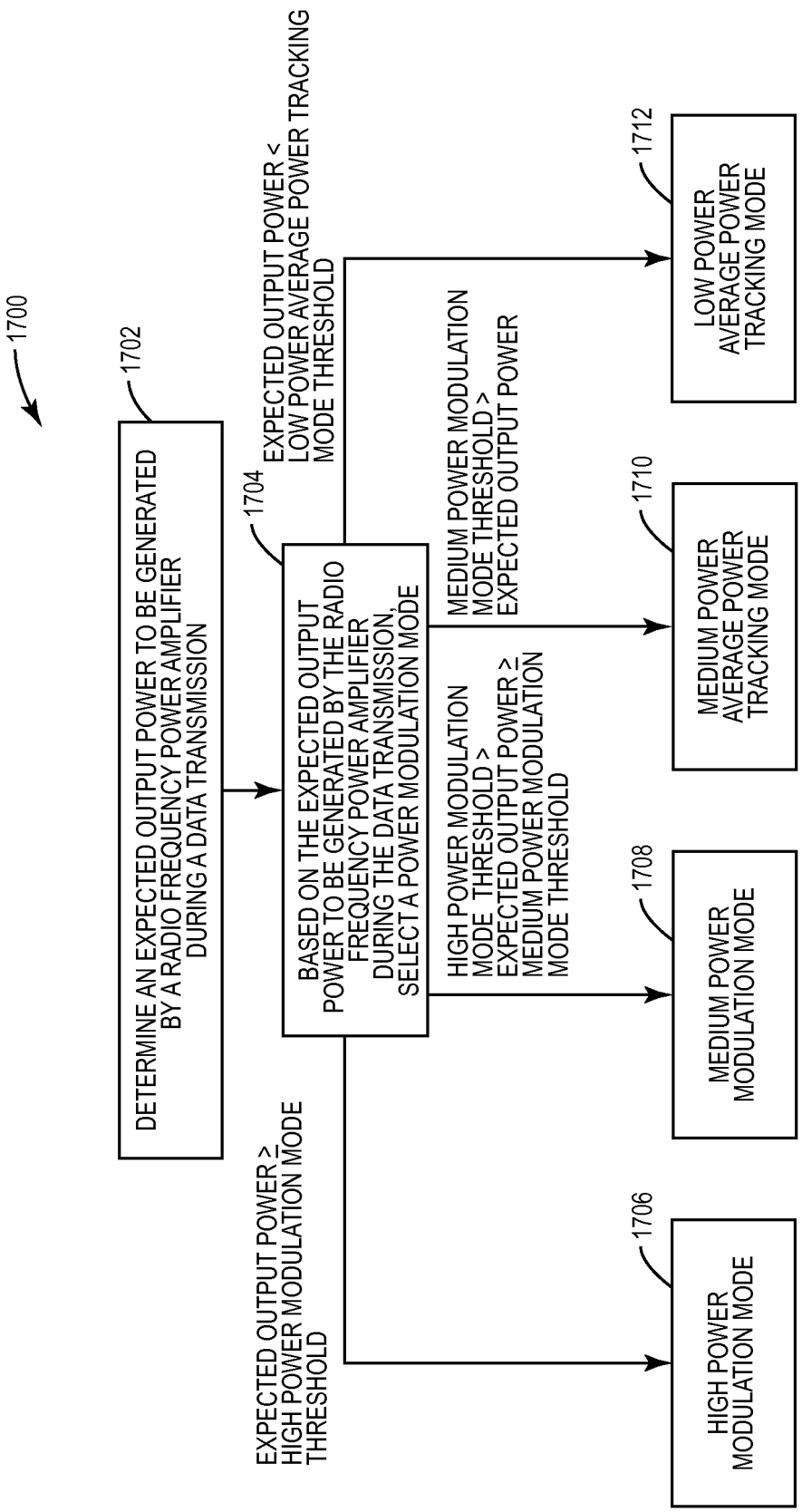
FIG. 3 depicts a method for operating the pseudo-envelope tracking modulated power supply system according to one embodiment of the pseudo-envelope tracking modulated power supply system.

FIG. 3 depicts a method 1700 for configuring the operation of the power management system 870 (FIG. 2A). The power management system 870 may determine an expected output power to be generated by a radio frequency power amplifier 869 (FIG. 2A) during a data transmission. (Step 1702). For example, in some embodiments, the controller 50 (FIG. 2A) may determine the expected output power to be generated by the radio frequency power amplifier 869 (FIG. 2A) based upon the envelope characteristics of a data signal to be transmitted during a data transmission slot. In other embodiments, the digital baseband processing portion of the transceiver or modem that provides the differential $V_{RAMP}$ signal to the parallel amplifier circuit 874 (FIG. 2A) may determine the expected output power to be generated by the radio frequency power amplifier 869 (FIG. 2A).

Based on the expected output power to be generated by the radio frequency power amplifier 869 (FIG. 2A) during the data transmission, the power management system 870 (FIG. 2A) may select a power modulation mode of operation from among a number of power level modulation modes of operation. (Step 1704). For example, the power management system 870 (FIG. 2A) includes the high power modulation mode, the medium power modulation mode, and the low power average power tracking mode. As such, the power management system 870 (FIG. 2A) selects the one of the high power modulation mode, the medium power modulation mode, and the low power average power tracking mode.

In the case where the expected output power to be generated by the radio frequency power amplifier 869 (FIG. 2A) is greater than or equal to a high power modulation mode threshold, the power management system 870 (FIG. 2A) configures the power management system 870 (FIG. 2A) to operate in the high power modulation mode. (Step 1706). Alternatively, in the case where the expected output power to be generated by the radio frequency power amplifier 869 (FIG. 2A) is less than the high power modulation mode threshold but greater than or equal to a medium power modulation mode threshold, the power management system 870 (FIG. 2A) configures the power management system 870 (FIG. 2A) to operate in the medium power modulation mode. (Step 1708).

In the case where the expected output power to be generated by the radio frequency power amplifier 869 (FIG. 2A) is less than the medium power modulation mode threshold but greater than or equal to the low power modulation mode threshold, the power management system 870 (FIG. 2A) may configure the power management system 870 (FIG. 2A) to operate in the medium power average power tracking mode. (Step 1710). In the case where the expected output power to be generated by the radio frequency power amplifier 869 (FIG. 2A) is less than the low power modulation mode threshold, the power management system 870 (FIG. 2A) may configure the power management system 870 (FIG. 2A) to operate in the low power average power tracking mode. (Step 1712).

In another embodiment of the power management system 870 (FIG. 2A), in the case where the expected output power to be generated by the radio frequency power amplifier 869 (FIG. 2A) is less than the medium power modulation mode threshold, the power management system 870 (FIG. 2A) may configure the power management system 870 (FIG. 2A) to operate in the low power average power tracking mode (Step 1712).

In one embodiment of the power management system 870 (FIG. 2A), the high power modulation mode threshold is equal to about three decibels less than a maximum expected output power from the radio frequency power amplifier 869 (FIG. 2A). In one embodiment of the power management system 870 (FIG. 2A), the medium power modulation mode threshold is equal to about ten decibels less than a maximum expected output power from the radio frequency power amplifier 869 (FIG. 2A).

Figure 5:
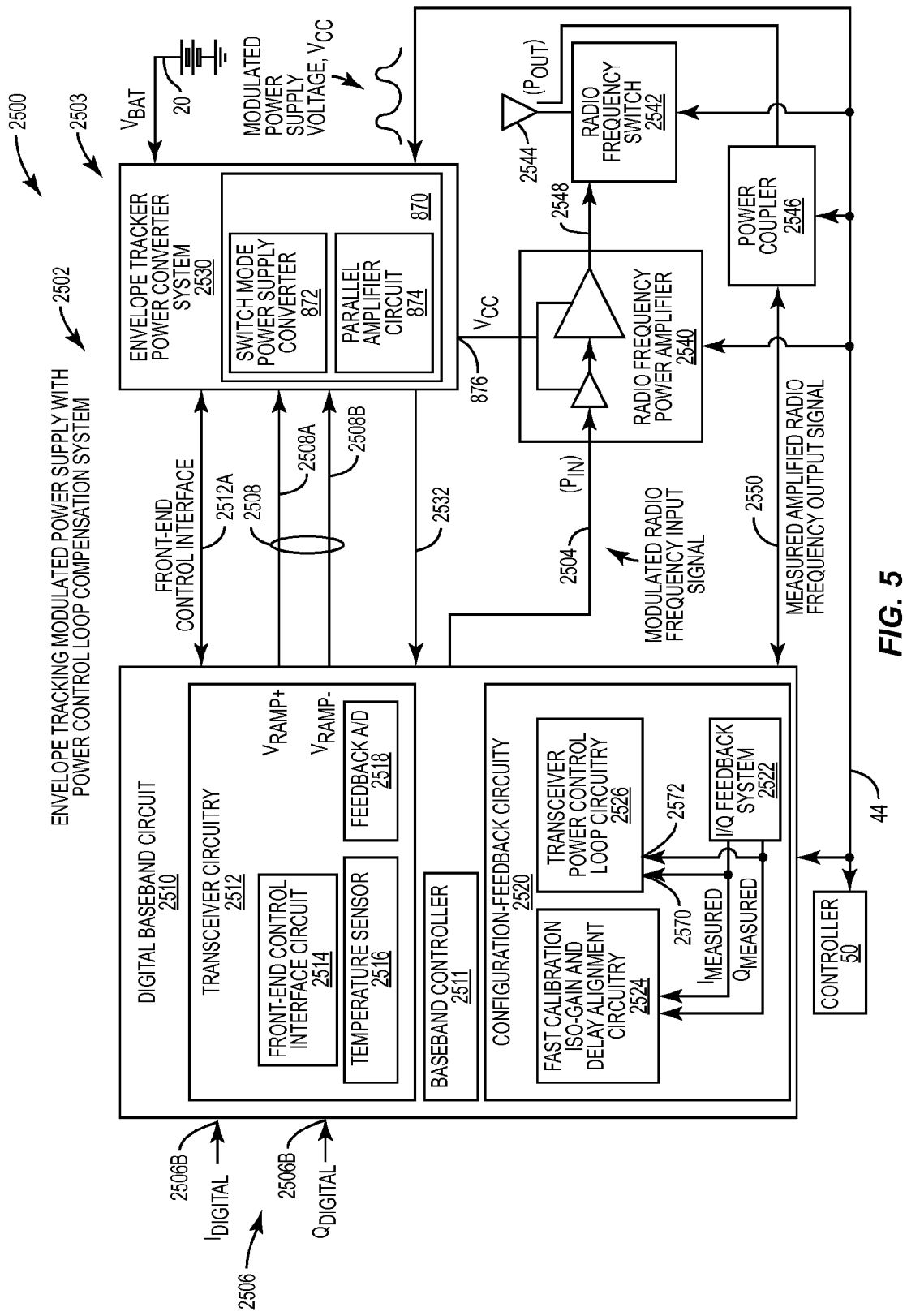
FIG. 5 depicts one embodiment of a portion of a communication device including various embodiments of an envelope tracking modulated power supply system with transceiver power control loop compensation.

FIG. 5 depicts a portion of a communication device including various embodiments of an envelope tracking modulated power supply system 2500 with transceiver power control loop compensation. For the purposes of illustration and not by way of limitation, the envelope tracking modulated power supply system 2500 with transceiver power control loop compensation may be described with continuing reference to a number of the embodiments of the pseudo-envelope tracking modulated power supply system 868, depicted in FIGS. 2A-C.

The envelope tracking modulated power supply system 2500 with transceiver power control loop compensation may include a transceiver power control loop 2502 and an envelope tracking control system 2503. The transceiver power control loop 2502 may include a transmit-target power setting parameter 2502A and a transmit-gain setting parameter 2502B. The transceiver power control loop 2502 may adjust a drive level or an input power $P_{IN}$ of a modulated radio frequency input signal 2504 provided to a radio frequency power amplifier 2540 based on the values of the transmit-target power setting parameter 2502A and the transmit-gain setting parameter 2502B as a function of the output power $P_{OUT}$ generated by the radio frequency power amplifier 2540.

In some embodiments, the modulated radio frequency input signal 2504, $P_{IN}$, may be a test signal. As an example, the modulated radio frequency input signal 2504, $P_{IN}$, may be a carrier wave having a desired frequency.

In some embodiments of the communication device, the transmit-target power setting parameter 2502A may be based on network control information provided by a communication network in which the communication device is configured to operate. For example, the communication network may provide the communication device with network control information to configure the operation of the communication device within the communication network. In some embodiments, the transmit-target power setting parameter 2502A used by a communication device may be a function of the different wireless transmissions generated by the communication device. The transmit-target power setting parameter 2502A of the communication device may also be based on a data rate of the transmission, the resource blocks to be used during the transmission, a frequency band allocated for the transmission, the relative location of the transmission band to other bands of operation in the communication network, and/or a combination thereof. As another example, the transmit-target power setting parameter 2502A may be a function of the distance between the communication device and a nearest base station of the communication network. For example, the communication device may use an initial value of the transmit-target power setting parameter 2502A based on a target base station to receive an initial transmission. Thereafter, the communication network may configure the communication device to use a new value of the transmit-target power setting parameter 2502A based on a serving base station.

In some embodiments, the transceiver power control loop 2502 may adjust the transmit-gain setting parameter 2502B in response to changes in bias settings of the transceiver circuitry 2512, a temperature change of the digital baseband circuit 2510, and/or changes in the voltage standing wave ratio, VSWR, for a particular transmit frequency.

As an example, the transceiver power control loop 2502 may be configured to adjust a transmit-gain setting parameter 2502B to provide a modulated radio frequency input signal 2504 to a radio frequency power amplifier 2540. In some embodiments, the transmit-gain setting parameter 2502B may be adjusted as a function of the output power $P_{OUT}$ of the amplified radio frequency output signal 2548 provided to the antenna 2544 and the transmit-target power setting parameter 2502A.

For example, in some embodiments, the transceiver power control loop 2502 may increase the transmit-gain setting parameter 2502B used to set the input power $P_{IN}$ of the modulated radio frequency input signal 2504 provided to the radio frequency power amplifier 2540 in response to a decrease in the output power $P_{OUT}$ of an amplified radio frequency output signal 2548 provided to the antenna 2544. In response to the increase of the transmit-gain setting parameter 2502B, the transceiver circuitry 2512 may increase the drive level of the modulated radio frequency input signal 2504 provided to the radio frequency power amplifier 2540. In other words, the transceiver circuitry 2512 may increase the input power $P_{IN}$ of the modulated radio frequency input signal 2504 to increase the output power $P_{OUT}$ of the amplified radio frequency output signal 2548. To avoid gain compression due to the increase drive level of the modulated radio frequency input signal 2504, the envelope tracking control system 2503 may be configured to increase the amplitude of the modulated power supply voltage, $V_{CC}$, provided to the collector of the radio frequency power amplifier 2540. Otherwise, the modulated power supply voltage, $V_{CC}$, may be insufficient to support the increased output power $P_{OUT}$ to be generated by the radio frequency power amplifier 2540. Gain compression may result in degradation of the spectrum performance and the error vector magnitude (EVM) performance of the transmitted signal as measured at the output of the radio frequency power amplifier 2540.

Figure 4:
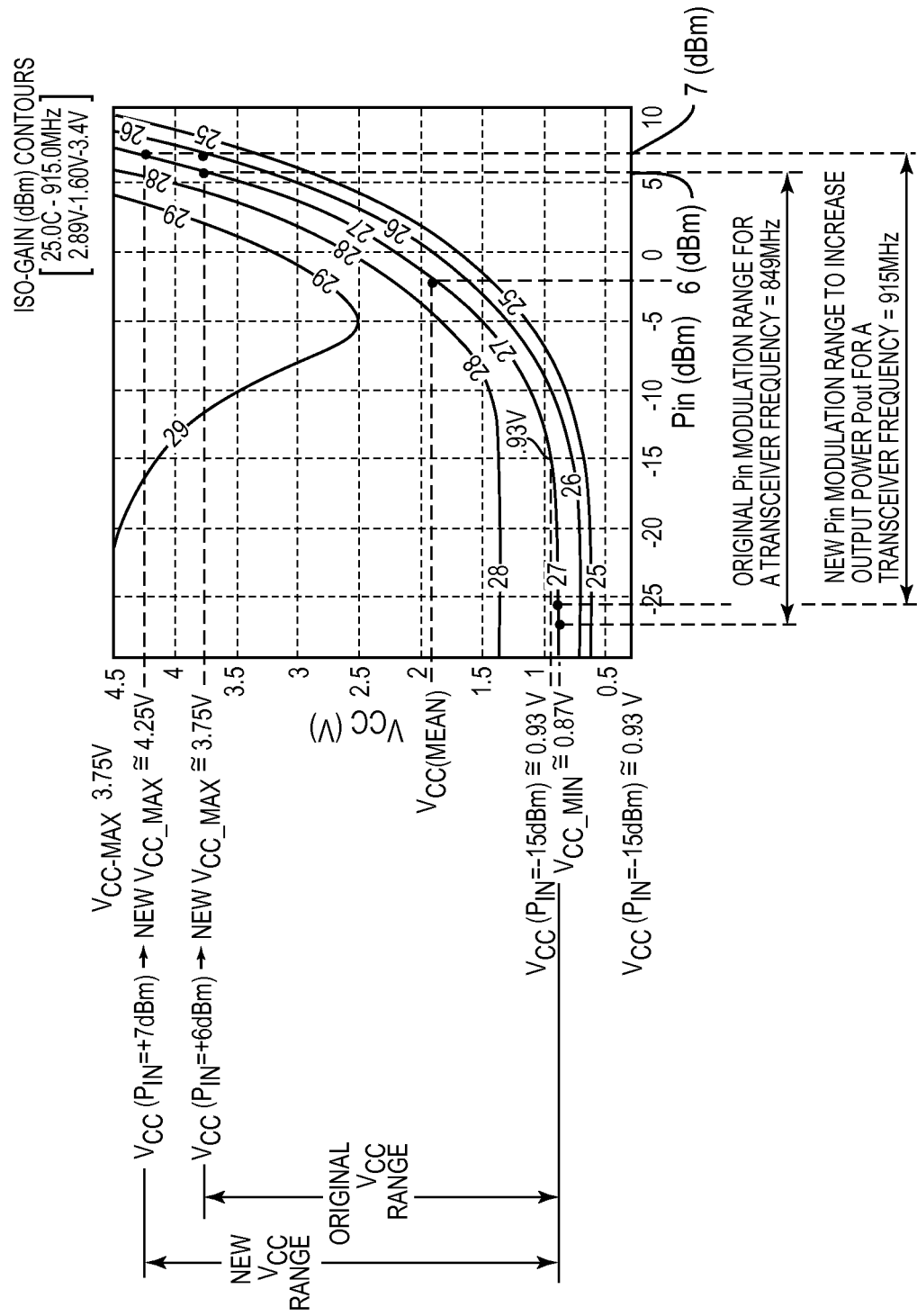
FIG. 4 depicts one embodiment of a set of iso-gain contours of a radio frequency power amplifier.

For example, FIG. 4 depicts a set of iso-gain contours of the radio frequency power amplifier 2540 that may be stored in a $V_{CC}$ look up table 2586, and used to generate the modulated power supply voltage, $V_{CC}$, provided to the collector of the radio frequency power amplifier 2540. For example, the sets of iso-gain contours may depict an iso-gain curve for the power gains 28 dBm, 27 dBm, 26 dBm, and 25 dBm. In addition, FIG. 4 depicts an original input power $P_{IN}$ or drive level of a modulated radio frequency input signal provided as an input to the radio frequency power amplifier 2540 to transmit a data signal. FIG. 4 further depicts an original range of the modulated power supply voltage, $V_{CC}$, generated by the envelope tracking power converter system 2530 as a function of the digital I/Q signal 2506 provided to a digital baseband circuit 2510 for transmission. The modulated radio frequency input signal 2504 may also be generated based on the digital I/Q signal 2506. FIG. 4 further depicts a new range of the modulated power supply voltage, $V_{CC}$, that should be generated by the envelope tracking power converter system 2530 in response to the input power $P_{IN}$ of a modulated radio frequency input signal being increased by 1 dBm while maintaining the same modulation range. As shown in FIG. 4, if the envelope tracking power converter system 2530 is not configured to generate a modulated power supply voltage, $V_{CC}$, greater than 3.75 volts, the modulated radio frequency input signal may cause the radio frequency power amplifier 2540 to change from the iso-gain contour for 27 dBm of power gain to the iso-gain contour for 26 dBm for an input power $P_{IN}$ or drive level above 6 dBm. As a result, the radio frequency power amplifier 2540 may operate in a non-linear mode and jump from one iso-gain contour to another during the data transmission. This may result in gain compression. To avoid this problem, the envelope tracking control system 2503 may determine whether the transceiver power control loop 2502 has increased the drive level of the modulated radio frequency input signal, such that the envelope tracking power converter system 2530 may not be able to provide a sufficient range for the modulated power supply voltage, $V_{CC}$, to support the increase in drive level. In that case, the envelope tracking control system 2503 may configure the digital baseband circuit 2510 to generate a control signal 2508 that will support the new range of the modulated power supply voltage, $V_{CC}$, necessary to prevent gain compression.

As an example, to avoid gain compression, the transceiver power control loop 2502 may be further configured to cooperatively operate with the envelope tracking control system 2503. The envelope tracking control system 2503 may provide the control signal 2508 to the envelope tracking power converter system 2530 as a function of the digital I/Q signal 2506 provided to the digital baseband circuit 2510 for transmission. The digital I/Q signal 2506 may include a digital in-phase component $I_{DIGITAL}$ 2506A and a digital quadrature component $Q_{DIGITAL}$ 2506B. In addition, the envelope tracking control system 2503 may be configured to adjust the control signal 2508 as a function of the transmit-gain setting parameter 2502B, the transmit-target power setting parameter 2502A, a temperature measurement of the digital baseband circuit 2510, and/or some combination thereof. In still other embodiments, the envelope tracking control system 2503 may be further configured to adjust the control signal 2508 as a function of the transmit frequency of the transmitter channel for the band of operation in which the communication device is configured to operate. As an example, in some embodiments, the envelope tracking control system 2503 may adjust the generation of a modulated power supply voltage, $V_{CC}$, as a function of a transmit-target power setting parameter 2502A and a transmit-gain setting parameter 2502B, and a transmit frequency of the transmitter channel.

FIG. 5 may further depict an embodiment of a system, circuitry, and methods for providing a transceiver power control loop 2502 configured to regulate the output power $P_{OUT}$ of an amplified radio frequency output signal 2548 provided to the antenna 2544 in response to the modulated radio frequency input signal 2504.

FIG. 5 depicts the envelope tracking modulated power supply system 2500 with transceiver power control loop compensation including a digital baseband circuit 2510, an envelope tracking power converter system 2530, a radio frequency power amplifier 2540, a radio frequency switch 2542 in combination with an antenna 2544 and power coupler 2546. The digital baseband circuit 2510, the envelope tracking power converter system 2530, the radio frequency power amplifier 2540, and radio frequency switch 2542 may be in communication with a controller 50 via a control bus 44. The controller 50 may control and/or provide parameters to govern the function of the digital baseband circuit 2510, the envelope tracking power converter system 2530, the radio frequency power amplifier 2540, and the radio frequency switch 2542 by selectively setting parameters and settings in the various devices. In addition, as will be discussed, the controller 50 may also provide a transmit-target power setting parameter 2502A to the digital baseband circuit 2510 as output power level control information received by the envelope tracking modulated power supply system 2500 from a base station of a communication network in which the envelope tracking modulated power supply system 2500 is configured to operate. The transmit-target power setting parameter 2502A may configure the digital baseband circuit 2510 to provide a modulated radio frequency input signal 2504 having an input power $P_{IN}$ to the radio frequency power amplifier 2540. The digital baseband circuit 2510 may be configured to receive the digital I/Q signal 2506 to be transmitted by the radio frequency power amplifier 2540 during a data transmission The digital I/Q signal 2506 may include a digital in-phase component $I_{DIGITAL}$ 2506A and a digital quadrature component $Q_{DIGITAL}$ 2506B. The digital baseband circuit 2510 may include transceiver circuitry 2512 and configuration-feedback circuitry 2520. The transceiver circuitry 2512 may include a front-end control interface circuit 2514 configured to communicate via a front-end control interface 2514A to the envelope tracking power converter system 2530. In addition, the digital baseband circuit 2510 may also configure various operational parameters of the envelope tracking power converter system 2530 via the front-end control interface 2514A. As an example, in some embodiments, the digital baseband circuit 2510 may provide various operational parameters via the front-end control interface 2514A to the envelope tracking power converter system 2530 as a function of a regulated time period.

In addition, the transceiver circuitry 2512 may provide a control signal 2508 to the envelope tracking power converter system 2530. In some embodiments, the control signal 2508 may be a differential control signal having a non-inverted control signal component 2508A and an inverted control signal component 2508B. For example, the control signal 2508 may be a differential $V_{RAMP}$ signal having a non-inverted $V_{RAMP}$ signal component and an inverted $V_{RAMP}$ signal component. The control signal 2508 may provide a target voltage for the modulated power supply voltage, $V_{CC}$, at the modulated power supply output 876. Based on the control signal 2508, the envelope tracking power converter system 2530 may generate a modulated power supply voltage, $V_{CC}$, at the modulated power supply output 876. The transceiver circuitry 2512 may further include a temperature sensor 2516 configured to provide a temperature measurement of the digital baseband circuit 2510.

The transceiver circuitry 2512 may also include a feedback analog-to-digital converter 2518 configured to receive a measurement signal 2532 from the envelope tracking power converter system 2530. The measurement signal 2532 in combination with the feedback analog-to-digital converter 2518 may provide information such as the temperature and supply voltage of the envelope tracking power converter system 2530.

The feedback analog-to-digital converter 2518 may receive the measurement signal 2532 from the envelope tracking power converter system 2530. The feedback analog-to-digital converter 2518 may convert the measurement signal 2532 into digital data, which may be provided to the controller 50 or other portions of the digital baseband circuit 2510. For example, in some embodiments, the envelope tracking power converter system 2530 may provide various types of measurements, including an analog temperature signal, an analog power supply voltage signal, and a measurement of the battery voltage, $V_{BAT}$.

For example, via the front-end control interface 2514A, the digital baseband circuit 2510 may request the envelope tracking power converter system 2530 to provide a measurement of the battery voltage, $V_{BAT}$, from a battery 20. In response, the envelope tracking power converter system 2530 may provide a measurement of the battery voltage, $V_{BAT}$, to the feedback analog-to-digital converter 2518 via the measurement signal 2532. In a similar fashion, the digital baseband circuit 2510 may obtain a measurement of the temperature of the envelope tracking power converter system 2530 via the measurement signal 2532.

Based on the digital in-phase component $I_{DIGITAL}$ 2506A and the digital quadrature component $Q_{DIGITAL}$ 2506B, the transceiver circuitry 2512 may generate a control signal 2508 to provide a target voltage for generation of a modulated power supply voltage, $V_{CC}$. As previously described, in some embodiments the control signal 2508 may be a differential $V_{RAMP}$ signal. The envelope tracking power converter system 2530 may configure the digital baseband circuit 2510 to generate the control signal 2508 as a function of the modulated radio frequency input signal 2504 provided to the radio frequency power amplifier 2540 for transmission. The envelope tracking power converter system 2530 may generate the modulated power supply voltage, $V_{CC}$, at the modulated power supply output 876 in response to the control signal 2508. The envelope tracking power converter system 2530 may provide the modulated power supply voltage, $V_{CC}$, to the radio frequency power amplifier 2540.

The radio frequency power amplifier 2540 may generate an amplified radio frequency output signal 2548 as a function of the input power $P_{IN}$ of the modulated radio frequency input signal 2504 and the modulated power supply voltage $V_{CC}$. The radio frequency power amplifier 2540 may provide the amplified radio frequency output signal 2548 to the antenna 2544 via a radio frequency switch 2542.

In response to the amplified radio frequency output signal 2548, the power coupler 2546 may obtain a measurement of the amplified radio frequency output signal 2548. In some embodiments, the power coupler 2546 may also obtain a measurement of the output power of the amplified radio frequency output signal 2548, present at the antenna 2544. In other embodiments of the transceiver power control loop 2502, the power coupler 2546 may be located at the output of the radio frequency power amplifier 2540 and configured to obtain a measurement of the amplified radio frequency output signal 2548 before passing through the radio frequency switch 2542. Some embodiments of the power coupler 2546 may include a power detector configured to measure the output power $P_{OUT}$ of the amplified radio frequency output signal 2548 at the output of the radio frequency power amplifier 2540. The power coupler 2546 may provide a measured amplified radio frequency output signal 2550 to the digital baseband circuit 2510. For example, the power coupler 2546 may provide the measured amplified radio frequency output signal 2550 to the configuration-feedback circuitry 2520 of the digital baseband circuit 2510.

The I/Q feedback system 2522 may receive the measured amplified radio frequency output signal 2550. The I/Q feedback system 2522 may demodulate the measured amplified radio frequency output signal 2550 to obtain a digitized in-phase feedback component $I_{MEASURED}$ 2570 and a digitized quadrature feedback component $Q_{MEASURED}$ 2572 as a function of the measured amplified radio frequency output signal 2550.

The digitized in-phase feedback component $I_{MEASURED}$ 2570 and the digitized quadrature feedback component $Q_{MEASURED}$ 2572 may be provided to the fast calibration iso-gain and delay alignment circuitry 2524 and the transceiver power control loop circuitry 2526. The transceiver power control loop circuitry 2526 also receives the transmit-target power setting parameter 2502A. Based on the digitized in-phase feedback component $I_{MEASURED}$ 2570 and the digitized quadrature feedback component $Q_{MEASURED}$ 2572, the transceiver power control loop circuitry 2526 may determine whether to increase or decrease the power level of the modulated radio frequency input signal 2504 as a function of the transmit-target power setting parameter 2502A.

For example, the transceiver power control loop circuitry 2526 may determine that the output power $P_{OUT}$ of the measured amplified radio frequency output signal 2550 is less than the transmit-target power setting parameter 2502A. In response to the determination that the output power $P_{OUT}$ of the measured amplified radio frequency output signal 2550 is less than the transmit-target power setting parameter 2502A, the transceiver power control loop circuitry 2526 may configure the transceiver circuitry 2512 to increase the input power $P_{IN}$ of the modulated radio frequency input signal 2504 provided to the radio frequency power amplifier 2540. For example, in some embodiments, the transceiver power control loop circuitry 2526 may increase the magnitude of the transmit-gain setting parameter 2502B. The transceiver power control loop circuitry 2526 may generate a transmit-gain setting signal 2526A based on the transmit-gain setting parameter 2502B. In some embodiments, the transceiver power control loop circuitry 2526 may provide the transmit-gain setting signal 2526A to a baseband controller 2511. The baseband controller 2511 may be configured to adjust various parameters and settings of the transceiver circuitry 2512 to increase the drive level or input power $P_{IN}$ of the modulated radio frequency input signal 2504 to compensate for the difference between the transmit-target power setting parameter 2502A and the output power $P_{OUT}$ of the measured amplified radio frequency output signal 2550.

In addition, the transceiver power control loop circuitry 2526 may provide the transmit-gain setting signal 2526A and a transmit-target power setting signal 2526B to a pseudo-envelope follower gain control circuit 2574. Alternatively, in some embodiments, the baseband controller 2511 may provide the transmit-gain setting parameter 2502B and a transmit-target output power parameter to the pseudo-envelope follower gain control circuit 2574. For example, in some alternative embodiments, the baseband controller 2511 may configure the pseudo-envelope follower gain control circuit 2574 to generate a gain control signal 2574A having a gain control magnitude substantially equal to $G_{CONTROL}$.

On the other hand, the transceiver power control loop circuitry 2526 may determine that the output power $P_{OUT}$ of the measured amplified radio frequency output signal 2550 exceeds the transmit-target power setting parameter 2502A. Based on a determination that the output power $P_{OUT}$ of the measured amplified radio frequency output signal 2550 exceeds the transmit-target power setting parameter 2502A, the transceiver power control loop circuitry 2526 may decrease the magnitude of the transmit-gain setting parameter 2502B.

The transceiver power control loop circuitry 2526 may generate a transmit-gain setting signal 2526A based on the reduced magnitude of the transmit-gain setting parameter 2502B. In some embodiments, the baseband controller 2511 may be configured to adjust various parameters and settings of the transceiver circuitry 2512 to reduce the drive level or input power $P_{IN}$ of the modulated radio frequency input signal 2504 to decrease the output power $P_{OUT}$ of the measured amplified radio frequency output signal 2550. In addition, the transceiver power control loop circuitry 2526 may provide the transmit-gain setting signal 2526A to the pseudo-envelope follower gain control circuit 2574.

In some embodiments the power coupler 2546 may include a detector. The detector may include a sensor in communication with an output of the radio frequency power amplifier 2540. The detector may measure an output power generated by the radio frequency power amplifier 2540. As an example, after accounting for losses in the radio frequency switch 2542, the power coupler 2546 may provide a measured output power, $P_{OUT}$, of the amplified radio frequency output signal 2548. The measured output power may provide an average power measurement. The power coupler 2546 may also provide an average power measurement based on various averaging techniques. In some embodiments, the power coupler 2546 may be configured to provide a peak power measurement. In some embodiments, the power coupler 2546 may be configured as a linear power detector. In other embodiments, the power coupler 2546 may be a logarithmic power detector. In still other embodiments, the power coupler 2546 may be a non-linear power detector.

The radio frequency switch 2542 includes a closed state of operation and an open state of operation. In the closed state of operation, the radio frequency switch 2542 may couple the radio frequency power amplifier 2540 to the antenna 2544, which permits the amplified radio frequency output signal 2548 to pass through the radio frequency switch 2542 to the antenna 2544 to transmit the amplified radio frequency output signal 2548. In the open state of operation, the radio frequency switch 2542 substantially attenuates the amplified radio frequency output signal 2548 to minimize or prevent a transmission of the amplified radio frequency output signal 2548. Ideally, in the open state of operation, the radio frequency switch 2542 has infinite impedance. In some embodiments, the radio frequency switch 2542 may provide antenna switch isolation around +25 dBm.

In some embodiments, the communication device may include a controller 50 configured to coordinate the functions of the various components and operations of the embodiments of the envelope tracking modulated power supply system 2500 with transceiver power control loop compensation. In some embodiments, the controller 50 may include a number of distributed processors, distributed microcontrollers, controllers, local control units, memory mapped local memory for various components, functions, and features of the various embodiments of the power management system 870, the various embodiments of the switch mode power supply converter 872, the various embodiments of the parallel amplifier circuit 874, firmware circuitry, reconfigurable digital logic circuitry, state machines, analog logic circuitry, a number of communication interfaces and busses, various forms of memory, data registers, control registers, cache memory, distributed memory, memory mappings, register mappings, various types of sensors and inputs for receiving sensory data or information, one or more digital-to-analog converters, one or more analog-to-digital converters, various types and numbers of output drivers, various types and numbers of digital input buffers and analog input buffers, various processor cores and arithmetic operation units, sub-processors, read only memory, random access memory, flash memory circuitry, electronically fusible memory, interrupt handlers, interrupt handling management systems, and controls signals. For the sake of simplicity of description, and not by way of limitation, the controller 50 may be described as performing various functions and features to govern the operation of the communication device, the various embodiments of the envelope tracking modulated power supply system 2500 with transceiver power control loop compensation, the digital baseband circuit 2510, the envelope tracking power converter system 2530, the radio frequency power amplifier 2540, the radio frequency switch 2542, the power coupler 2546. As an example, and not by way of limitation, the controller 50 may include a control bus 44 in communication with the digital baseband circuit 2510, the envelope tracking power converter system 2530, the radio frequency power amplifier 2540, the radio frequency switch 2542, and the power coupler 2546. For the sake of simplicity, and not by way of limitation, the control bus 44 is only depicted as being in communication with each component depicted in FIG. 1. Even so, one of ordinary skill in the art will understand that this is by way of example and not by way of limitation.

For example, the controller 50 may be in communication with various other elements to be described in the digital baseband circuit 2510, the embodiments of the switch mode power supply converter 872, and the embodiments of the parallel amplifier circuit 874 of the envelope tracking power converter system 2530. As an example, the controller 50 may be in communication with and cooperatively operate with the various embodiments of the power management system 870.

The controller 50 may include a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor. In the alternative, the processor may be any conventional processor, controller, microcontroller, a state machine and/or a combination thereof. A processor may also be implemented as a combination of computing devices. As an example, a combination of computing devices may include a combination of a DSP and a microprocessor, a plurality of microprocessors, one or more microprocessors in conjunction with a DSP core, or any other such configuration. The processor 28 may further include or be embodied in hardware and in computer executable instructions that are stored in memory, and may reside, for example, in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of computer readable medium known in the art. An exemplary storage medium may be coupled to the processor such that a processor can read information from, and write information to, the storage medium. In the alternative, the storage medium or a portion of the storage medium may be integral to the processor. The processor and the storage medium may reside in an Application Specific Integrated Circuit (ASIC).

The front-end control interface circuit 2514 is in communication with the envelope tracking power converter system 2530 via a front-end control interface 2536. In some embodiments, the front-end control interface circuit 2514 may operate with a Mobile Industry Processor Interface® standard based device via the front-end control interface 2536. As an example, the front-end control interface circuit 2514 and the front-end control interface 2536 may be configured to control devices based on a Radio Frequency Front-End control interface specification.

In some embodiments, the controller 50 may cooperatively interoperate the front-end control interface circuit 2514 to configure and control the envelope tracking power converter system 2530. In still other embodiments, the controller 50 may be a supervisory processor that governs other controllers. The baseband controller 2511 may include configurable firmware, a processor, sub-controllers, control logic, control circuitry, one or more state machines, a Digital Signal Processor (DSP), an ASIC, a Field Programmable Gate Array (FPGA) or other programmable logic device, discrete gate or transistor logic, discrete hardware components, or any combination thereof designed to perform the functions described herein. The baseband controller 2511 may include firmware, executable program code, read only memory, fusible memory, a memory processor, a microprocessor, conventional processor, controller, microcontroller, or state machine. A processor may also be implemented as a combination of computing devices. As an example, a combination of computing devices may include a combination of a DSP and a microprocessor, a plurality of microprocessors, one or more microprocessors in conjunction with a DSP core, or any other such configuration. The controller 50 may further include or be embodied in hardware and in computer executable instructions that are stored in memory, and may reside, for example, in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of computer readable medium known in the art. An exemplary storage medium may be coupled to the processor such that a processor can read information from, and write information to, the storage medium. In the alternative, the storage medium or a portion of the storage medium may be integral to the processor. The processor and the storage medium may reside in an Application Specific Integrated Circuit (ASIC).

The digital baseband circuit 2510 may receive a digital I/Q signal 2506 to be transmitted by the radio frequency power amplifier 2540. For example, the digital I/Q signal 2506 includes a digital data signal. Alternatively, the digital I/Q signal 2506 may be a test signal for calibrating various parts of the envelope tracking modulated power supply system 2500 with transceiver power control loop compensation. In some embodiments, the digital I/Q signal 2506 may include a digital in-phase component $I_{DIGITAL}$ 2506A and a digital quadrature component $Q_{DIGITAL}$ 2506B. The digital in-phase component $I_{DIGITAL}$ 2506A and the digital quadrature component $Q_{DIGITAL}$ 2506B where the digital in-phase component $I_{DIGITAL}$ 2506A and the digital quadrature component $Q_{DIGITAL}$ 2506B represent the in-phase and quadrature components of a signal to be transmitted. The digital I/Q signal 2506 may receive various types of test signals to generate a modulated radio frequency input signal 2504 having a desired envelope characteristic. In addition, the digital I/Q signal 2506 may include a test signal that generates the modulated radio frequency input signal 2504 having a desired frequency characteristic or periodicity. For example, dependent upon a band of operation of a communication network to which a communication device is assigned or a wideband modulation technique associated with the band of operation, the test signal received by the digital I/Q signal 2506 may include various frequency characteristics. As an example, for the case where a wideband modulation technique includes a particular modulation bandwidth, the digital I/Q signal 2506 may generate a modulated radio frequency input signal 2504 that has a bandwidth substantially similar to the bandwidth associated with the wideband modulation technique or the band of operation assigned to the communication device.

The digital baseband circuit 2510 may further include a pseudo-envelope follower gain control circuit 2574 configured to provide a gain control signal 2574A having a gain control magnitude substantially equal to $G_{CONTROL}$. The pseudo-envelope follower gain control circuit 2574 may adjust the magnitude of the gain control signal 2574A based as a function of a measured temperature of the transceiver circuitry 2512, the transmit-gain setting signal 2526A, a carrier frequency for the band of operation in which the communication device is configured to operate, and/or a combination thereof to generate the $V_{CC}$ look up table index signal 2584 at the input of the $V_{CC}$ look up table 2586. The pseudo-envelope follower gain control circuit 2574 may adjust the gain control magnitude, $G_{CONTROL}$, such that the $V_{CC}$ look up table index signal 2584 provides an index signal into the $V_{CC}$ look up table 2586 that substantially emulates the drive level or input power $P_{IN}$ of the modulated radio frequency input signal 2504 provided to the radio frequency power amplifier 2540. In other words, the pseudo-envelope follower gain control circuit 2574 may adjust the magnitude of the gain control magnitude, $G_{CONTROL}$, such that the $V_{CC}$ look up table compensated envelope signal 2588 may provide a target voltage for the modulated power supply voltage, $V_{CC}$, as a function of the iso-gain curve that corresponds to the transmit-target power setting parameter 2502A. As a result, the gain control signal 2574A may compensate for an increase in the input power of the modulated radio frequency input signal provided to the radio frequency power amplifier 2540 to prevent or minimize gain compression.

The envelope tracking power converter system 2530 may include various circuits to generate a modulated power supply voltage, $V_{CC}$, at the modulated power supply output 876. As a non-limiting example, some embodiments of the envelope tracking power converter system 2530 may include the switch mode power supply converter 872 and the parallel amplifier circuit 874. In some embodiments, the switch mode power supply converter 872 may be a buck converter. In other embodiments, the switch mode power supply converter 872 may include a multi-level charge pump buck converter configured to buck and/or boost a supply voltage to provide a switching voltage at different voltages dependent upon the control signal 2508. As a non-limiting example, in some embodiments, the envelope tracking power converter system 2530 may operate in various power level modulation modes depending on the expected output power to be generated by the radio frequency power amplifier 2540 in a data transmission.

Figure 6:
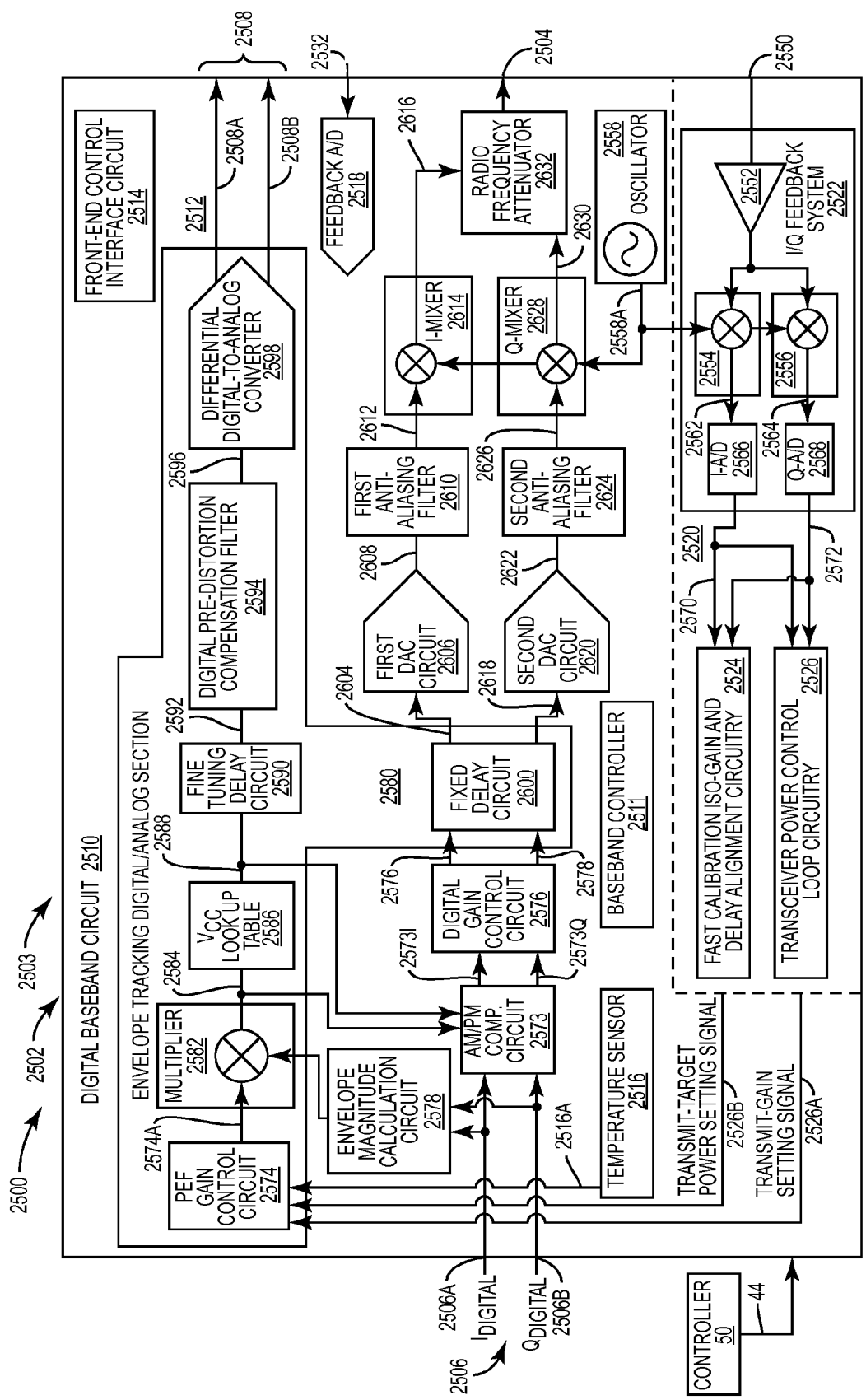
FIG. 6 depicts one embodiment of transceiver circuitry.

As depicted in FIG. 6, the transceiver circuitry 2512 may include an AM/PM compensation circuit 2573, a digital gain control circuit 2576, an envelope magnitude calculation circuit 2578, and an envelope tracking digital/analog section 2580. The envelope magnitude calculation circuit 2578 may receive the digital in-phase component $I_{DIGITAL}$ 2506A and the digital quadrature component $Q_{DIGITAL}$ 2506B. The envelope magnitude calculation circuit 2578 may calculate an envelope magnitude, $\zeta_{MAGNITUDE}$, of an expected envelope of the modulated radio frequency input signal 2504, $P_{IN}$. As an example, the envelope magnitude calculation circuit 2578 may generate the envelope magnitude, $\zeta_{MAGNITUDE}$, based on the digital in-phase component $I_{DIGITAL}$ 2506A and the digital quadrature component $Q_{DIGITAL}$ 2506B. In some embodiments, the envelope magnitude, $\zeta_{MAGNITUDE}$, may be proportional to the magnitude of the envelope of the modulated radio frequency input signal 2504, $P_{IN}$. As a non-limiting example, the envelope magnitude, $\zeta_{MAGNITUDE}$, may be described by equation (1) as follows:

$$\zeta_{MAGNITUDE} = \sqrt{I_{DIGITAL}^2 + Q_{DIGITAL}^2} \qquad (1)$$

The envelope magnitude calculation circuit 2578 provides the envelope magnitude, $\zeta_{MAGNITUDE}$, to the envelope tracking digital/analog section 2580.

The AM/PM compensation circuit 2573 may be configured to receive the digital in-phase component $I_{DIGITAL}$ 2506A and the digital quadrature component $Q_{DIGITAL}$ 2506B. In some embodiments, the AM/PM compensation circuit 2573 may be configured to provide amplitude modulation and phase modulation compensation for the radio frequency power amplifier 2540. For example, some embodiments of the AM/PM compensation circuit 2573 may adjust the digital in-phase component $I_{DIGITAL}$ 2506A and the digital quadrature component $Q_{DIGITAL}$ 2506B to compensate for any phase shift due to the modulated power supply voltage, $V_{CC}$, the input power, $P_{IN}$, of the modulated radio frequency input signal 2504 to be transmitted by the radio frequency power amplifier 2540, and/or a combination thereof.

For example, some embodiments of the AM/PM compensation circuit 2573 may receive the $V_{CC}$ look up table index signal 2584 and the $V_{CC}$ look up table compensated envelope signal 2588. The $V_{CC}$ look up table index signal 2584 may be substantially equivalent to a digital representation of the envelope of the modulated radio frequency input signal 2504 provided to the radio frequency power amplifier 2540 for transmission. The $V_{CC}$ look up table compensated envelope signal 2588 may be substantially equivalent to a digital representation of a target envelope for the envelope tracking power converter system 2530 to track or follow to generate a modulated power supply voltage, $V_{CC}$, that substantially corresponds to the modulated radio frequency input signal 2504. In other words, the $V_{CC}$ look up table 2586 may translate the $V_{CC}$ look up table index signal 2584 into a desired target voltage for the modulated power supply voltage, $V_{CC}$.

As will be described, the pseudo-envelope follower gain control circuit 2574 may generate the gain control, $G_{CONTROL}$, signal as a function of a temperature of the digital baseband circuit 2510, the transmit-target power setting signal 2526B, the transmit-gain setting signal 2526A, and/or a combination thereof to adjust the magnitude of the envelope magnitude, $\zeta_{MAGNITUDE}$, signal. As a result, the $V_{CC}$ look up table index signal 2584 may include a transceiver gain adjusted envelope magnitude $\zeta_{TGA\text{-}MAGNITUDE}$, substantially equal to the product of the envelope magnitude, $\zeta_{MAGNITUDE}$, signal and the gain control, $G_{CONTROL}$, signal. The gain control, $G_{CONTROL}$, adjusts the envelope magnitude, $\zeta_{MAGNITUDE}$, signal to reflect a change in the transceiver gain such that the $V_{CC}$ look up table index signal is not solely based on the expected output power to be generated by the radio frequency power amplifier 2540 in response to the modulated radio frequency input signal 2504. Transceiver gain adjusted envelope magnitude, $\zeta_{TGA\text{-}MAGNITUDE}$, is provided by the equation (2) as follows:

$$\zeta_{TGA\text{-}MAGNITUDE} = \zeta_{MAGNITUDE} \times G_{CONTROL}, \quad (2)$$

where the gain control, $G_{CONTROL}$, may be a function of the transceiver temperature, $T_{TRANSCEIVER}$, and the transceiver gain settings, $G_{TRANSCEIVER}$. In some embodiments, the gain control, $G_{CONTROL}$, may also be a function of the transceiver transmit frequency, $F_{TRANSMIT}$.

Accordingly, the $V_{CC}$ look up table index signal 2584 substantially compensates for a change in the gain of the digital transceiver to reflect the input drive level to the radio frequency power amplifier. Thus, the $V_{CC}$ look up table index signal 2584 provides an emulated "Pin drive level of the power amplifier" rather using as index the output power of the radio frequency power amplifier 2540 to generate the control signal 2508.

Because the gain control, $G_{CONTROL}$, provided by the pseudo-envelope follower gain control circuit 2574 compensates for changes in the transmit gain setting used to set the power level of the modulated radio frequency input signal 2504, the $V_{CC}$ look up table index signal 2584 may index into the $V_{CC}$ look up table 2586 to generate a $V_{CC}$ look up table compensated envelope signal 2588 that is adjusted for a change in the transmit-gain setting signal 2526A used to set the power level of the modulated radio frequency input signal 2504 provided to the radio frequency power amplifier 2540.

The AM/PM compensation circuit 2573 may compensate for any phase shift due to the drive level change in of the modulated radio frequency input signal 2504 provided to the radio frequency power amplifier 2540.

In some embodiments, the AM/PM compensation circuit 2573 may receive either the $V_{CC}$ look up table index signal 2584 or the $V_{CC}$ look up table compensated envelope signal 2588 as a scaled version of the digital envelope of the modulated radio frequency input signal 2504. In other words, the AM/PM compensation circuit 2573 may use either the $V_{CC}$ look up table index signal 2584, the $V_{CC}$ look up table compensated envelope signal 2588, and/or a combination thereof to represent the modulated radio frequency input signal 2504. Based on the representation of the modulated radio frequency input signal 2504, the AM/PM compensation circuit 2573 may calculate a phase correction as a function of the input power $P_{IN}$. The AM/PM compensation circuit 2573 may apply the phase correction to generate a phase corrected digital in-phase component $I_{DIGITAL}$ 2573I and a phase corrected digital in-phase component I-DIGITAL 2527Q, which are provide to the digital gain control circuit 2576. In response to the phase corrected digital in-phase component $I_{DIGITAL}$ 2573I and the phase corrected digital in-phase component $I_{DIGITAL}$ 2527Q, the digital gain control circuit 2576 may generate a gain adjusted digital in-phase, $I_{DIGITAL\_GAIN\_ADJUSTED}$, component and the gain adjusted digital quadrature, $Q_{DIGITAL\_GAIN\_ADJUSTED}$, component based on the transmit-gain setting parameter 2502B.

The envelope tracking digital/analog section 2580 may include the pseudo-envelope follower gain control circuit 2574, a multiplier 2582, the $V_{CC}$ look up table 2586, a fine tuning delay circuit 2590, a digital pre-distortion compensation filter 2594, a differential digital-to-analog converter 2598, and a fixed delay circuit 2600. The multiplier 2582 may include a first input in communication with the output of the pseudo-envelope follower gain control circuit 2574 and a second input in communication with the envelope magnitude calculation circuit 2578. The first input of the multiplier 2582 may receive the gain control, $G_{CONTROL}$, from the pseudo-envelope follower gain control circuit 2574. The second input of the multiplier 2582 may receive the envelope magnitude, $\zeta_{MAGNITUDE}$. The multiplier 2582 multiplies the envelope magnitude, $\zeta_{MAGNITUDE}$, by the gain control, $G_{CONTROL}$, to generate the $V_{CC}$ look up table index signal 2584. In some embodiments, the gain control, $G_{CONTROL}$, is adjusted to compensate for variations in a setup of the digital baseband circuit 2510. For example, the value of the gain control, $G_{CONTROL}$, may be adjusted to increase or decrease the modulated power supply voltage, $V_{CC}$, generated by the envelope tracking power converter system 2530 as a function of the input power $P_{IN}$ or drive level of the modulated radio frequency input signal 2504 provided to the radio frequency power amplifier 2540.

The multiplier 2582 provides a $V_{CC}$ look up table index signal 2584 to the $V_{CC}$ look up table 2586 based on the product of the envelope magnitude, $\zeta_{MAGNITUDE}$, and the gain control, $G_{CONTROL}$.

The $V_{CC}$ look up table 2586 may include one or more tables to translate the $V_{CC}$ look up table index signal 2584 into a $V_{CC}$ look up table compensated envelope signal 2588. The $V_{CC}$ look up table compensated envelope signal 2588 may provide a target voltage for the modulated power supply voltage, $V_{CC}$, to be generated by the envelope tracking power converter system 2530 based on the envelope of the modulated radio frequency input signal 2504. For example, depending upon a band of operation, a power level modulation mode of operation of the communication device, a spectrum target, and/or an error vector magnitude target, the baseband controller 2511 or the controller 50 may configure the $V_{CC}$ look up table 2586 to select a particular set of look up values as a function of an operational mode of the communication device, the digital baseband circuit 2510, the envelope tracking power converter system 2530, the envelope tracking digital/analog section 2580, and/or a combination thereof. The $V_{CC}$ look up table 2586 provides a $V_{CC}$ look up table compensated envelope signal 2588 to the fine tuning delay circuit 2590.

The fine tuning delay circuit 2590 may be configured to delay propagation of the $V_{CC}$ look up table compensated envelope signal 2588 based on a programmable delay parameter. The programmable delay parameter may be controlled by the controller 50 the baseband controller 2511 and/or a combination thereof. Depending upon the programmable delay parameter, the fine tuning delay circuit 2590 may provide a delay propagation of the $V_{CC}$ look up table compensated envelope signal 2588 based on a programmable delay parameter by a fine tuning delay time, $T_{FINE\_TUNING}$. The granularity of the fine tuning delay time, $T_{FINE\_TUNING}$, may depend upon a clock of the digital baseband circuit 2510. In some embodiments, the propagation delay of the fine tuning delay circuit 2590 may be provided by an interpolator. In other embodiments, the propagation delay of the fine tuning delay circuit 2590 may be provided by a tapped delay line or other delay circuit. The fine tuning delay circuit 2590 provides a digitally delayed control signal without pre-distortion compensation 84 to the digital pre-distortion compensation filter 2594. The digitally delayed control signal without pre-distortion compensation 84 may be provided to the digital pre-distortion compensation filter 2594.

The digital pre-distortion compensation filter 2594 may be either an infinite impulse response filter (IIR) or a finite impulse response filter (FIR). In some embodiments, the coefficients of the digital pre-distortion compensation filter 2594 may be configured by the controller 50, baseband controller 2511 and/or a combination thereof. In addition, the propagation delay through the digital pre-distortion compensation filter 2594 may vary depending upon the various modes of operation of the communication device.

For example, the propagation delay through the digital pre-distortion compensation filter 2594 may depend on various factors including a band of operation, a channel bandwidth, a wideband modulation bandwidth, channel conditions, a location of the communication device relative to communication hubs, points, towers, and hot-spots, signal modulation techniques, expected envelope characteristics, the peak-to-average ratio of the envelope of the signal to be transmitted, the data rate, the bandwidth of the channel, error vector magnitude, desired transmit spectrum characteristics, and/or some combination thereof.

As an example application, the digital pre-distortion compensation filter 2594 may be configured to equalize the frequency response of the modulated power supply voltage, $V_{CC}$, relative to the differential $V_{RAMP}$ signal. The digital pre-distortion compensation filter 2594 may provide a digital control signal 2596 to the differential digital-to-analog converter 2598. In some embodiments, the digital control signal 2596 may be a digital $V_{RAMP}$ signal, $V_{RAMP\_DIGITAL}$. The differential digital-to-analog converter 2598 may convert the digital control signal 2596 into the control signal 2508. In some embodiments, the control signal 2508 may be a differential control signal. For example, as described above, the control signal 2508 may include the non-inverted control signal component 2508A and the inverted control signal component 2508B. In some embodiments, the non-inverted control signal component 2508A may be the non-inverted $V_{RAMP}$ signal component, $V_{RAMP}+$, and the inverted control signal component 2508B may be the inverted $V_{RAMP}$ signal component, $V_{RAMP}-$. Although not depicted in FIG. 6, the differential digital-to-analog converter 2598 may further include anti-aliasing filters to accomplish proper image rejection after converting digital data into an analog signal.

The fixed delay circuit 2600 may provide a fixed delay to offset the propagation delay of the of the envelope magnitude, $\zeta_{MAGNITUDE}$, signal through the envelope tracking digital/analog section 2580 and provide a range of delay for the fine tuning delay circuit 2590. The fixed delay circuit 2600 receives the gain adjusted digital in-phase, $I_{DIGITAL\_GAIN\_ADJUSTED}$, component and the gain adjusted digital quadrature, $Q_{DIGITAL\_GAIN\_ADJUSTED}$, component from the digital gain control circuit 2576. The fixed delay circuit 2600 provides a delay adjusted digital in-phase component 2604 and a delay adjusted quadrature component 2618 as outputs.

A first digital-to-analog converter circuit 2606 is configured to receive the delay adjusted digital in-phase component 2604. The first digital-to-analog converter circuit 2606 converts the delay adjusted digital in-phase component 2604 into an analog signal to generate a pre-reconstruction in-phase component 2608, which is provided to a first anti-aliasing filter 2610. The first anti-aliasing filter 2610 filters the pre-reconstruction in-phase component 2608 to provide an analog in-phase component 2612 to be mixed.

Similarly, a second digital-to-analog converter circuit 2620 may receive the delay adjusted quadrature component 2618. The second digital-to-analog converter circuit 2620 converts the delay adjusted quadrature component 2618 into a pre-reconstruction quadrature component 2622, which is provided to a second anti-aliasing filter 2624. The second anti-aliasing filter 2624 filters the pre-reconstruction quadrature component 2622 to provide an analog quadrature component 2626 to be mixed.

The digital baseband circuit 2510 may further include an oscillator 2558, an in-phase component mixer 2614, I-Mixer, and a quadrature component mixer 2628, Q-Mixer. The oscillator 2558 is configured to generate a carrier signal 2558A having a transmit carrier frequency for a band of operation, which is provided to the quadrature component mixer 2628, Q-Mixer, and the in-phase component mixer 2614, I-Mixer. The quadrature component mixer 2628, Q-Mixer, mixes the analog quadrature component 2626 to generate a modulated quadrature component 2630. The in-phase component mixer 2614, I-Mixer, mixes the analog in-phase component 2612 to generate a modulated in-phase component 2616. The modulated quadrature component 2630 and the modulated in-phase component 2616 are provided to a radio frequency attenuator 2632. The controller 50 may adjust the radio frequency attenuator 2632 to provide a magnitude of the modulated quadrature component 2630 and the modulated in-phase component 2616 used to provide the modulated radio frequency input signal 2504 having an input power $P_{IN}$ to the radio frequency power amplifier 2540. The radio frequency attenuator 2632 may be either a digital radio frequency attenuator or an analog radio frequency attenuator.

The fine tuning delay time, $T_{FINE\_TUNING}$, of the fine tuning delay circuit 2590 may be configured to adjust the group delay relationship between the control signal 2508 provided to the envelope tracking power converter system 2530 and the modulated radio frequency input signal 2504, $P_{IN}$, provided to the radio frequency power amplifier 2540. The output power of the amplified radio frequency output signal 2548 may depend on the relative group delay mismatch between the control signal 2508 and the modulated radio frequency input signal 2504, $P_{IN}$.

FIG. 6 depicts a more detailed view of the digital baseband circuit 2510 including the baseband controller 2511, the transceiver circuitry 2512, and the configuration-feedback circuitry 2520. Although FIG. 6 depicts that the transceiver circuitry 2512 and the configuration-feedback circuitry 2520 are substantially separate portions of the digital baseband circuit 2510, in some embodiments, the features and the functions of the transceiver circuitry 2512 and the configuration-feedback circuitry 2520 may be cooperatively shared.

FIG. 6 further depicts an I/Q feedback system 2522 having a buffer 2552 configured to receive the measured amplified radio frequency output signal 2550 from the power coupler 2546. The buffer 2552 provides the measured amplified radio frequency output signal 2550 to the in-phase component feedback mixer 2554 and the quadrature component feedback mixer 2556. The in-phase component feedback mixer 2554 and the quadrature component feedback mixer 2556 may receive a carrier signal 2558A having a transmit carrier frequency from an oscillator 2558. The in-phase component feedback mixer 2554 and the quadrature component feedback mixer 2556 may demodulate the measured amplified radio frequency output signal 2550 to recover an in-phase feedback component 2562 and a quadrature feedback component 2564. The in-phase component feedback mixer 2554 may provide the in-phase feedback component 2562 to an in-phase component analog-to-digital converter 2566 to generate a digitized in-phase feedback component $I_{MEASURED}$ 2570. The quadrature component feedback mixer 2556 may provide the quadrature feedback component 2564 to a quadrature component analog-to-digital converter 2568 to generate a digitized quadrature feedback component $Q_{MEASURED}$ 2572. The fast calibration iso-gain and delay alignment circuitry 2524 and the transceiver power control loop circuitry 2526 may each receive the digitized in-phase feedback component $I_{MEASURED}$ 2570 and the digitized quadrature feedback component $Q_{MEASURED}$ 2572.

As a non-limiting example, the $V_{CC}$ look up table 2586 may store a plurality of calibrated iso-gain contours. The iso-gain contours may be calibrated by measuring the relationship between a range of drive levels or input power $P_{IN}$ levels of a modulated radio frequency input signal 2504 versus an output power $P_{OUT}$ generated by the radio frequency power amplifier 2540 at a given modulated power supply voltage, $V_{CC}$. For example, in the simplest form, the input power $P_{IN}$ for a modulated radio frequency input signal 2504 may sweep through 27 dBn to +7 dbm at a given modulated power supply voltage, Vcc. The fast calibration iso-gain and delay alignment circuitry 2524 may determine the output power generated in response to the input power $P_{IN}$ level. The process may then be repeated for different magnitudes of the modulated power supply voltage, $V_{CC}$.

One embodiment of the envelope tracking modulated power supply system 2500 as illustrated in FIGS. 5 and 6 is presented. The configuration-feedback circuitry 2520 regulates an output power from the radio frequency power amplifier 2540 based on a difference between a target output power from the radio frequency power amplifier 2540 and a measured output power from the radio frequency power amplifier 2540. The transceiver circuitry 2512 regulates the modulated power supply voltage, $V_{CC}$, which is used by the radio frequency power amplifier 2540 to provide power for amplification, based on the difference between the target output power from the radio frequency power amplifier 2540 and the measured output power from the radio frequency power amplifier 2540.

In one embodiment of the envelope tracking modulated power supply system 2500, the configuration-feedback circuitry 2520 regulates the output power from the radio frequency power amplifier 2540, such that the measured output power from the radio frequency power amplifier 2540 is about equal to the target output power from the radio frequency power amplifier 2540. The transceiver circuitry 2512 provides the modulated radio frequency input signal 2504 having the input power $P_{IN}$ to the radio frequency power amplifier 2540. The radio frequency power amplifier 2540 generates the amplified radio frequency output signal 2548 as a function of the input power $P_{IN}$ of the modulated radio frequency input signal 2504 and the modulated power supply voltage $V_{CC}$. The measured output power from the radio frequency power amplifier 2540 is representative of the output power from the radio frequency power amplifier 2540. The measured amplified radio frequency output signal 2550 is representative of the measured output power from the radio frequency power amplifier 2540.

In one embodiment of the envelope tracking modulated power supply system 2500, the transmit-gain setting signal 2526A is based on the transmit-gain setting parameter 2502B and the transmit-target power setting signal 2526B is based on the transmit-target power setting parameter 2502A. As such, the transmit-target power setting parameter 2502A is representative of the target output power from the radio frequency power amplifier 2540 and the transmit-gain setting parameter 2502B is representative of the transmit-gain setting of the transceiver circuitry 2512. In this regard, the configuration-feedback circuitry 2520 receives the measured amplified radio frequency output signal 2550 and provides the transmit-gain setting parameter 2502B based on the measured amplified radio frequency output signal 2550 and the transmit-target power setting parameter 2502A. As a result, the transmit-gain setting signal 2526A is based on the measured amplified radio frequency output signal 2550 and the transmit-target power setting parameter 2502A.

In one embodiment of the envelope tracking modulated power supply system 2500, the transceiver circuitry 2512 adjusts the input power $P_{IN}$ of the modulated radio frequency input signal 2504 provided to the radio frequency power amplifier 2540 based on the values of the transmit-target power setting parameter 2502A and the transmit-gain setting parameter 2502B. In one embodiment of the transceiver circuitry 2512, the transceiver circuitry 2512 adjusts the transmit-gain setting parameter 2502B in response to changes in bias settings of the transceiver circuitry 2512. In one embodiment of the transceiver circuitry 2512, the transceiver circuitry 2512 adjusts the transmit-gain setting parameter 2502B in response to temperature changes of the transceiver circuitry 2512. In one embodiment of the transceiver circuitry 2512, the transceiver circuitry 2512 adjusts the transmit-gain setting parameter 2502B in response to changes in the voltage standing wave ratio, VSWR associated with the radio frequency power amplifier 2540. In one embodiment of the transceiver circuitry 2512, the transceiver circuitry 2512 adjusts the transmit-gain setting parameter 2502B in response to changes in a transmit frequency of the radio frequency power amplifier 2540.

In one embodiment of the envelope tracking modulated power supply system 2500, the envelope tracking power converter system 2530 generates the modulated power supply voltage, $V_{CC}$, at the modulated power supply output 876 based on the control signal 2508. In general, the modulated power supply voltage, $V_{CC}$, is based on the control signal 2508. In one embodiment of the envelope tracking modulated power supply system 2500, the transceiver circuitry 2512 receives the digital I/Q signal 2506. In general, the digital I/Q signal 2506 is an I/Q signal. As such, the modulated power supply voltage, $V_{CC}$, is based on the I/Q signal and the modulated radio frequency input signal 2504, which is provided to the radio frequency power amplifier 2540, is also based on the I/Q signal. In one embodiment of the envelope tracking modulated power supply system 2500, the transceiver circuitry 2512 adjusts the modulated power supply voltage, $V_{CC}$, via the control signal 2508 to compensate for changes of the transmit-gain setting of the transceiver circuitry 2512.

In one embodiment of the envelope tracking modulated power supply system 2500, the modulated power supply voltage, $V_{CC}$, is based on the $V_{CC}$ look up table 2586, such that the $V_{CC}$ look up table index signal 2584 provides an index signal into the $V_{CC}$ look up table 2586 that substantially emulates the input power $P_{IN}$ of the modulated radio frequency input signal 2504 provided to the radio frequency power amplifier 2540. In this regard, the transceiver circuitry 2512 adjusts the $V_{CC}$ look up table index signal 2584 in response to changes of the transmit-gain setting of the transceiver circuitry 2512.

In one embodiment of the transceiver circuitry 2512, the transceiver circuitry 2512 adjusts the $V_{CC}$ look up table index signal 2584 in response to changes in bias settings of the transceiver circuitry 2512. In one embodiment of the transceiver circuitry 2512, the transceiver circuitry 2512 adjusts the $V_{CC}$ look up table index signal 2584 in response to temperature changes of the transceiver circuitry 2512. In one embodiment of the transceiver circuitry 2512, the transceiver circuitry 2512 adjusts the $V_{CC}$ look up table index signal 2584 in response to changes in the voltage standing wave ratio, VSWR associated with the radio frequency power amplifier 2540. In one embodiment of the transceiver circuitry 2512, the transceiver circuitry 2512 adjusts the $V_{CC}$ look up table index signal 2584 in response to changes in a transmit frequency of the radio frequency power amplifier 2540.

In one embodiment of the transceiver circuitry 2512, the transceiver circuitry 2512 further includes the pseudo-envelope follower gain control circuit 2574, which provides the gain control signal 2574A based on the transmit-gain setting of the transceiver circuitry 2512, such that the $V_{CC}$ look up table index signal 2584 is based on the gain control signal 2574A. In one embodiment of the pseudo-envelope follower gain control circuit 2574, the gain control signal 2574A is based on a difference between a calibration transmit-gain setting of the transceiver circuitry 2512 and the transmit-gain setting of the transceiver circuitry 2512.

In one embodiment of the pseudo-envelope follower gain control circuit 2574, the gain control signal 2574A is based on a difference between a calibration temperature of the transceiver circuitry 2512 and a measured temperature of the transceiver circuitry 2512. In one embodiment of the pseudo-envelope follower gain control circuit 2574, the gain control signal 2574A is based on a difference between a calibration transmit frequency of the radio frequency power amplifier 2540 and the transmit frequency of the radio frequency power amplifier 2540. In one embodiment of the pseudo-envelope follower gain control circuit 2574, the gain control signal 2574A is based on the difference between the calibration transmit-gain setting of the transceiver circuitry 2512 and the transmit-gain setting of the transceiver circuitry 2512, the difference between the calibration temperature of the transceiver circuitry 2512 and the measured temperature of the transceiver circuitry 2512, the difference between the calibration transmit frequency of the radio frequency power amplifier 2540 and the transmit frequency of the radio frequency power amplifier 2540, or any combination thereof.

Figure 7A:
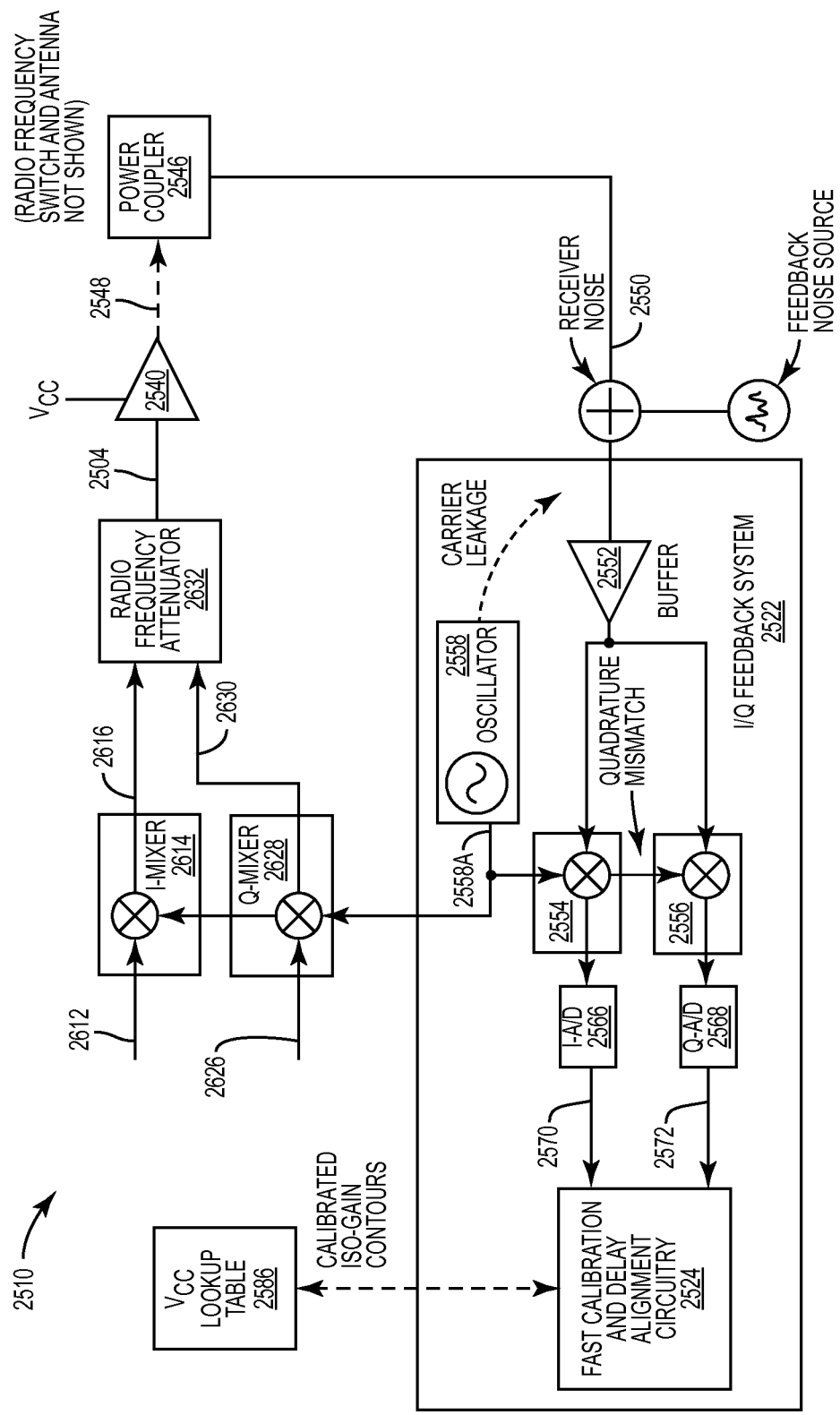
FIG. 7A depicts one embodiment of a saw tooth effect.
Figure 7B:
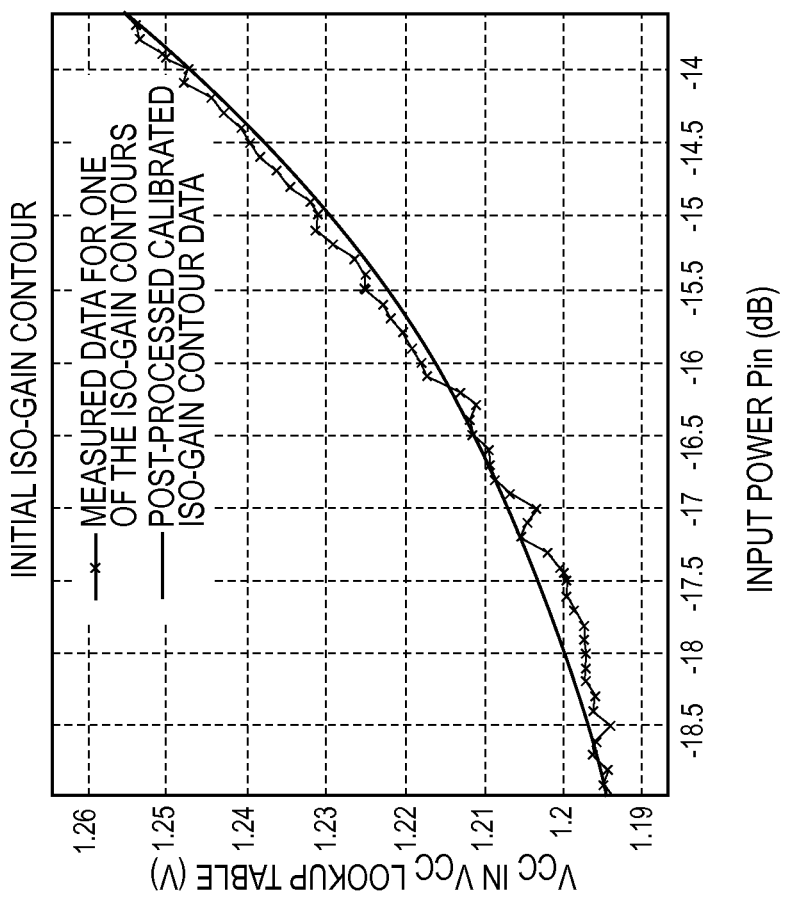
FIG. 7B depicts an alternate embodiment of the saw tooth effect.
Figure 7C:
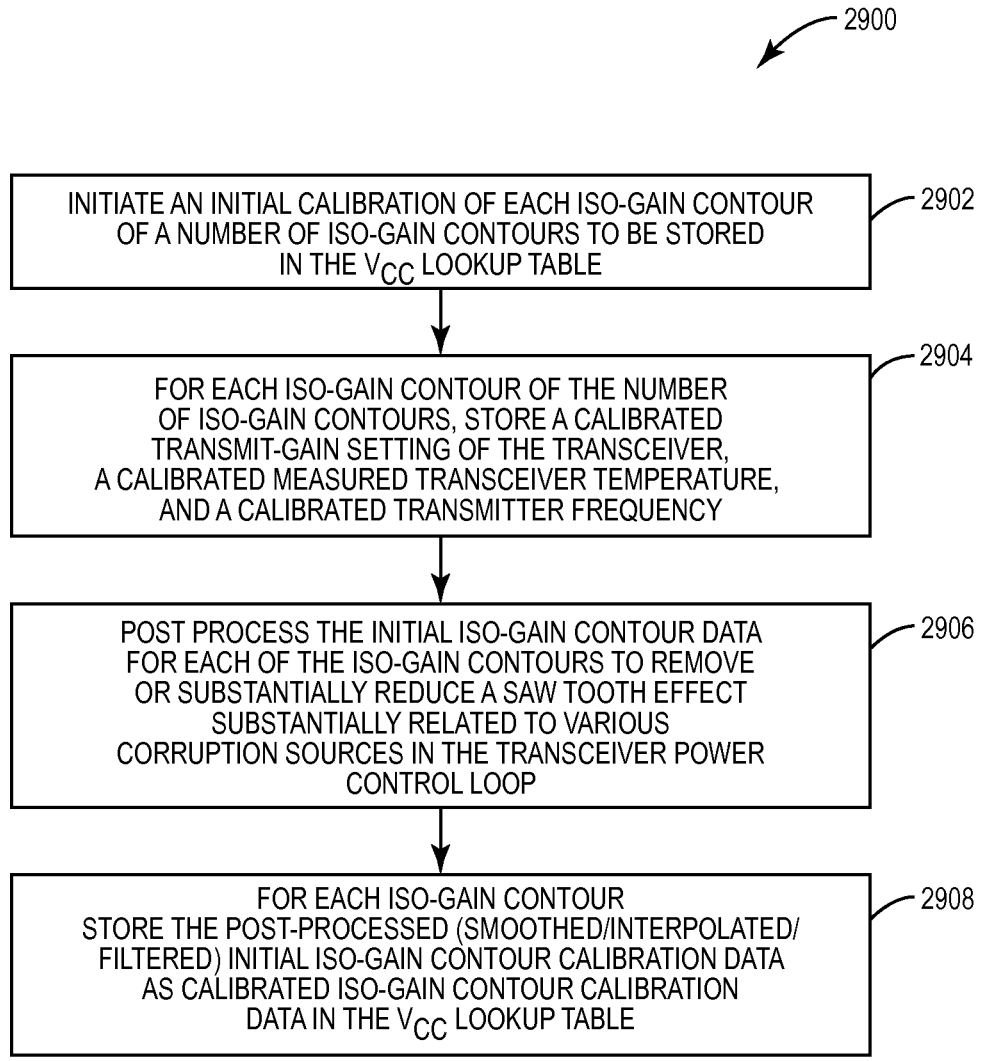
FIG. 7C depicts a method for reducing the saw tooth effect.
Figure 8A:
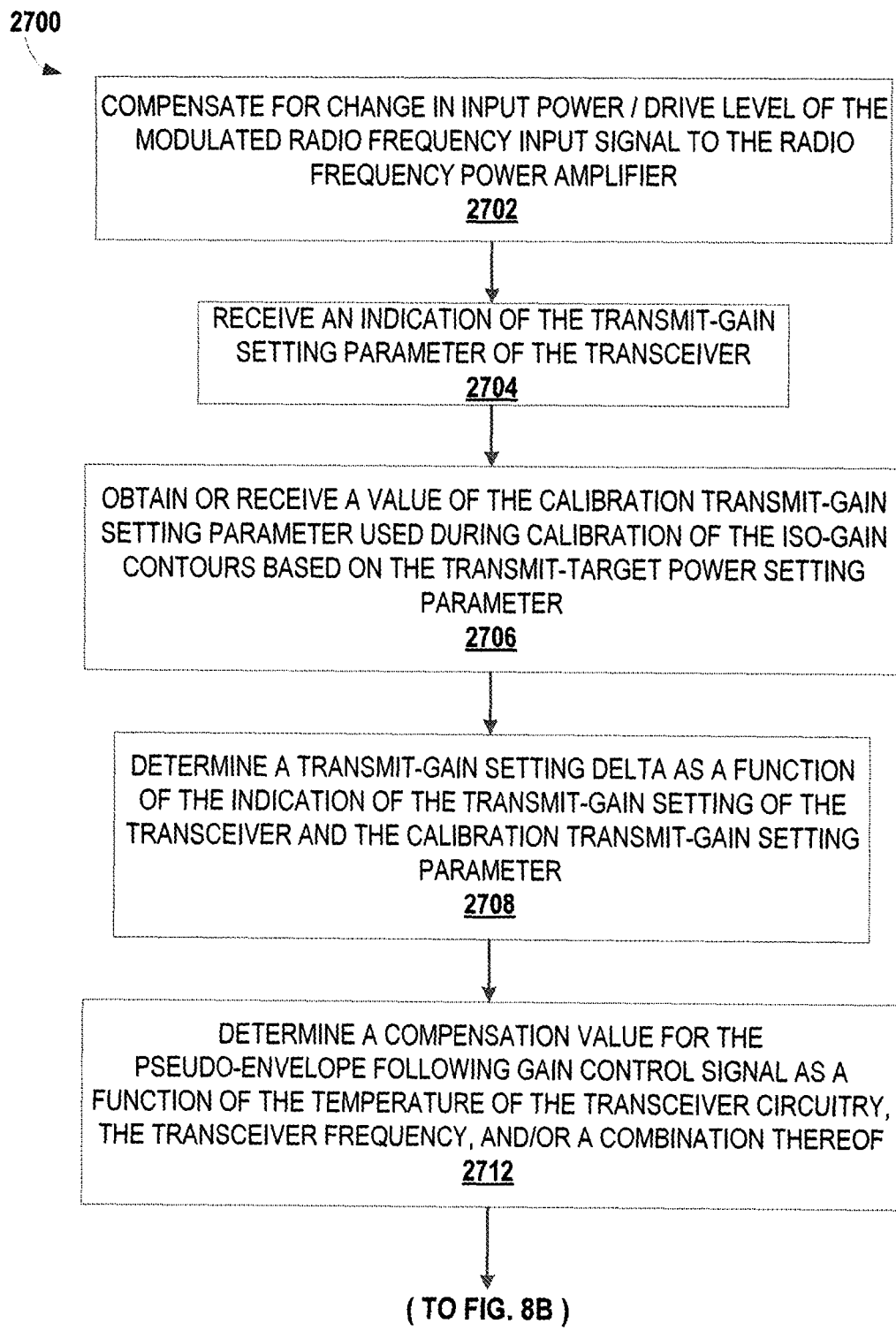
Figure 8B:
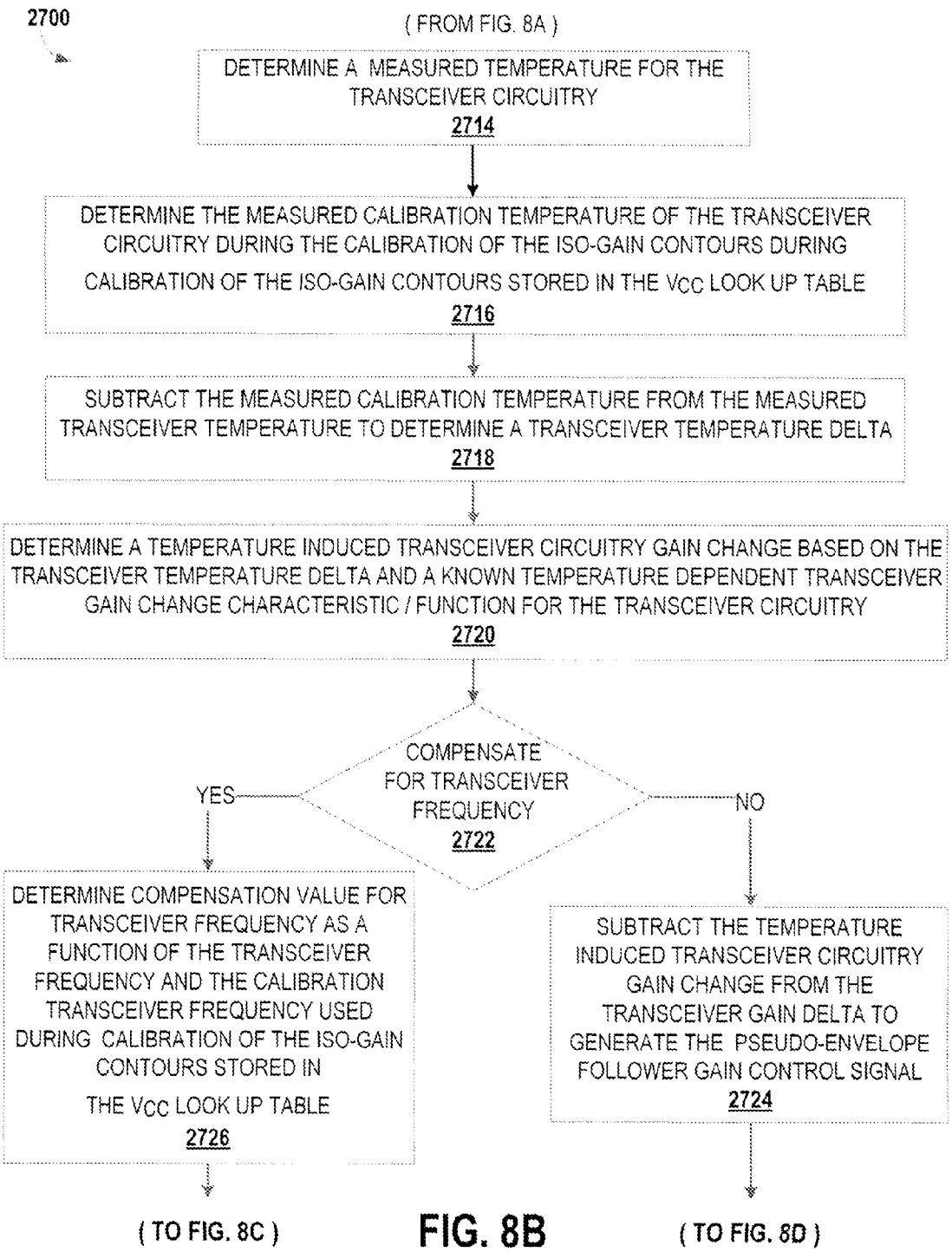
Figure 8C:
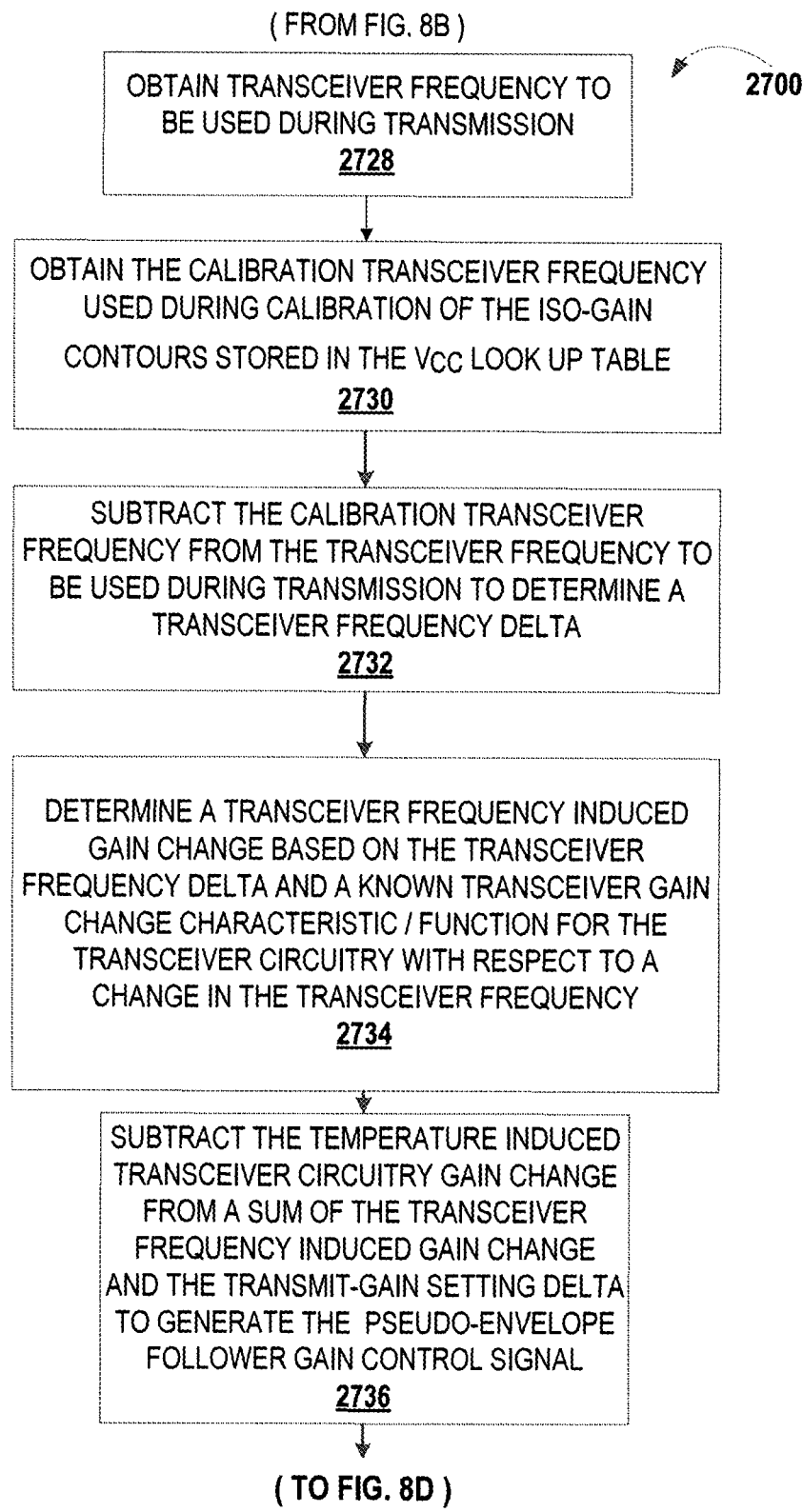

As depicted in the FIG. 7B, the measured data for the iso-gain contours may have a saw tooth characteristic. As depicted in FIG. 7A, the saw tooth effect may be due in part to various corruption sources that affect the accuracy of calibration including feedback noise sources that impact the measured amplified radio frequency output signal 2550, carrier leakage from the oscillator 2558, quadrature mismatch between the in-phase component feedback mixer 2554 and the quadrature component feedback mixer 2556, and/or some combination thereof. To correct for the saw tooth effect, as depicted in FIG. 7B and described in 7C, the initial measured data may be post-processed either by the controller 50, the baseband controller 2511, or factor test equipment to remove or minimize the impact of the corruption sources. For example, FIG. 7C depicts a method 2900 for reducing a saw tooth effect.

At the factor, an initial calibration of each iso-gain contour of a number of iso-gain contours to be stored in the $V_{CC}$ lookup table 2586 may be initiated. (Step 2902.)

For each iso-gain contour of the number of iso-gain contours, the fast calibration iso-gain and delay alignment circuitry 2524 may store a calibrated transmit-gain setting of the transceiver circuitry 2512, a calibrated measured transceiver temperature, and a calibrated transmitter frequency. (Step 2904.)

Thereafter, one of the controller 50, the baseband controller 2511, fast calibration iso-gain and delay alignment circuitry 2524, and/or factor test equipment may post process the initial iso-gain contour data for each of the iso-gain contours to remove or substantially reduce a saw tooth effect substantially related to various corruption sources in the transceiver power control loop 2502. As an example, a fit-post processing algorithm may be applied to the initial iso-gain contour data to remove the overall saw tooth effect and recalculate discrete points for the $V_{CC}$ look up table 2586 based on an interpolation process. As an example, the controller 50 or a factory calibration computer may execute the fit-processing and then recalculate the new discrete point to define the iso-gain curves. For example, in some embodiments, N data point may be used to generate an $M^{th}$ order polynomial that provides a polyfit with respect to the initial iso-gain contour data. Other advance filtering techniques may also be applied to remove the saw tooth effect and provide clean post processed calibrated iso-gain contour data. (Step 2906).

For each iso-gain contour, one of the controller 50, the baseband controller 2511, fast calibration iso-gain and delay alignment circuitry 2524, and/or factor test equipment may the store the post-processed (smoothed/interpolated/filtered) initial iso-gain contour calibration data as calibrated iso-gain contour calibration data in the $V_{CC}$ look up table 2586. (Step 2908).

In response to receipt of the in-phase feedback component 2562, the in-phase component analog-to-digital converter 2566 provides the digitized in-phase feedback component $I_{MEASURED}$ 2570 to the fast calibration iso-gain and delay alignment circuitry 2524 and the transceiver power control loop circuitry 2526. Similarly, the quadrature component feedback mixer 2556 provides a quadrature feedback component 2564 to the quadrature component analog-to-digital converter 2568. In response, the quadrature component analog-to-digital converter 2568 provides the digitized quadrature feedback component $Q_{MEASURED}$ 2572 to both the fast calibration iso-gain and delay alignment circuitry 2524 and the transceiver power control loop circuitry 2526.

The transceiver power control loop circuitry 2526 may determine a measured output power, $P_{OUT\_MEASURED}$, generated by the radio frequency power amplifier 2540 in response to the modulated radio frequency input signal 2504 having an input power $P_{IN}$ and the control signal 2508. For example, the transceiver power control loop circuitry 2526 may calculate the measured output power, $P_{OUT\_MEASURED}$, as a function of the digitized in-phase feedback component $I_{MEASURED}$ 2570 and the digitized quadrature feedback component $Q_{MEASURED}$ 2572. Based on the measured output power, $P_{OUT\_MEASURED}$, and the transmit-target power setting parameter 2502A, the transceiver power control loop circuitry 2526 may generate a transmit-gain setting signal 2526A to minimize a difference between the measured output power, $P_{OUT\_MEASURED}$, and the transmit-target power setting parameter 2502A. The transceiver power control loop circuitry 2526 may also provide the transmit-gain setting signal 2526A to a baseband controller 2511. In addition, in some embodiments, transceiver power control loop circuitry 2526 may provide the measured output power, $P_{OUT\_MEASURED}$, to the controller 50 via the control bus 44. In this case, the baseband controller 2511 may provide the transmit-target power setting parameter 2502A to the transceiver power control loop circuitry 2526. In some embodiments, the pseudo-envelope follower gain control circuit 2574 may receive an indication of the transmit-gain setting parameter 2502B of the transceiver from the configuration-feedback circuitry 2520 via the transmit-gain setting signal 2526A.

FIGS. 8A-D depict a method 2700 for compensating a control signal generated as part of an envelope tracking system for changes in the drive level or input power $P_{IN}$ of a modulated radio frequency input signal 2504. The digital baseband circuit 2510 may provide the modulated radio frequency input signal 2504 to the radio frequency power amplifier 2540 to generate the amplified radio frequency output signal 2548. The radio frequency power amplifier 2540 may provide the amplified radio frequency output signal 2548 to the antenna 2544 for transmission. As previously discussed, the transceiver power control loop 2502 may adjust the drive level or input power $P_{IN}$ of the modulated radio frequency input signal 2504 in response a determination that the output power $P_{OUT}$ of the amplified radio frequency output signal 2548, measured at the antenna 2544, outside a threshold limit of a target-transmit output power parameter. For example, the configuration-feedback circuitry 2520 may determine whether an output power of a radio frequency power amplifier is outside of a threshold limit of a target-transmit output power parameter. Based on a determination that the output power of the radio frequency power amplifier is outside of the threshold limit of the target-transmit output power parameter, a transceiver circuit configured to generate a modulated radio frequency input signal based on a difference between the output power of the radio frequency power amplifier and the target-transmit output power parameter, and generate a control signal to regulate generation of a modulated supply voltage to maintain a linear gain characteristic of the radio frequency power amplifier through a new dynamic range of the modulated radio frequency input signal.

The envelope tracking control system 2530 may be configured to compensate for a change in the input power $P_{IN}$ or drive level of the modulated radio frequency input signal provided to the radio frequency power amplifier 2540. (Step 2702). As an example, the pseudo-envelope follower gain control circuit 2574 may receive an indication of the transmit-gain setting parameter of the transceiver circuit and the configuration-feedback circuitry 2520 via the transmit-gain setting signal 2526A. In addition the pseudo-envelope follower gain control circuit 2574 may receive an indication of the transmit-target power setting parameter 2502A from the configuration-feedback circuitry 2520 via the transmit-target power setting signal 2526B. (Step 2704).

In response to receipt of the indication of the transmit-gain setting parameter, the pseudo-envelope follower gain control circuit 2574 may obtain or receive a value of the calibration transmit-gain setting parameter used during calibration of the iso-gain contours based on the transmit-target power setting parameter. (Step 2706.)

The pseudo-envelope follower gain control circuit 2574 may determine a transmit gain setting delta as a function of the indication of the transmit-gain setting of the transceiver and the calibration transmit-gain setting parameter. The transmit gain setting delta may be calculated by subtracting the calibration transmit-gain setting parameter from the transmit-gain setting parameter. (Step 2708).

The pseudo-envelope follower gain control circuit 2574 may determine a compensation value for the pseudo-envelope following gain control signal as a function of the temperature of the transceiver circuitry 2512, the transceiver frequency, and/or a combination thereof (Step 2712.)

The pseudo-envelope follower gain control circuit 2574 may determine a measured temperature for the transceiver circuitry 2512. To determine a compensation value for the pseudo-envelope following gain control signal 2574A, the pseudo-envelope follower gain control circuit 2574 may receive a measured temperature for the transceiver circuitry 2512 from the temperature sensor 2516 via the temperature signal 2516A. (Step 2714.)

The pseudo-envelope follower gain control circuit 2574 may determine the measured calibration temperature of the transceiver circuitry 2512 during the calibration of the iso-gain contours during calibration of the iso-gain contours stored in the $V_{CC}$ look up table 2586. As an example, in some embodiments, the baseband controller 2511 may obtain or receive the measured calibration temperature of the transceiver circuitry 2512 from the controller 50. Alternatively, the measured calibration temperature of the transceiver circuitry 2512 may be stored in a memory or register accessible by the baseband controller 2511. In some embodiments, the controller 50 may provide the measured calibration temperature of the transceiver circuitry 2512 to the pseudo-envelope follower gain control circuit 2574. In still other embodiments, the pseudo-envelope follower gain control circuit 2574 may request the measured calibration temperature of the transceiver circuitry 2512 from the baseband controller 2511 or the controller 50. In still other embodiments, the measured calibration temperature of the transceiver circuitry 2512 may be provided to the pseudo-envelope follower gain control circuit 2574 prior to commencement of a data transmission. (Step 2716.)

The pseudo-envelope follower gain control circuit 2574 may subtract the measured calibration temperature from the measured transceiver temperature to determine a transceiver temperature delta. (Step 2718.)

Thereafter, the pseudo-envelope follower gain control circuit 2574 may determine a temperature induced transceiver circuitry gain change based on the transceiver temperature delta and a known temperature dependent transceiver gain change characteristic/function for the transceiver circuitry 2512. (Step 2720.)

In some embodiments of the envelope tracking control system 2503, the pseudo-envelope follower gain control circuit 2574 may further compensate the transceiver frequency being used to generate the modulated radio frequency input signal 2504. In other embodiments, the envelope tracking control system 2503 may determine whether to compensate for the transceiver frequency. For example, the envelope tracking control system 2503 may determine whether the present transceiver frequency is substantially near a calibration transceiver frequency used during calibration of the iso-gain contours stored in the $V_{CC}$ look up table 2586. Based on a determination that the present transceiver frequency is substantially near the calibration transceiver frequency, the pseudo-envelope follower gain control circuit 2574 may determine to dispense with determining a compensation factor for a difference between the present transceiver frequency and the calibration transceiver frequency. In other embodiments, the pseudo-envelope follower gain control circuit 2574 may always generate a compensation factor for a difference between the present transceiver frequency and the calibration transceiver frequency. (Step 2722.)

Based on a determination to not generate a compensation factor for a difference between the present transceiver frequency and the calibration transceiver frequency, the pseudo-envelope follower gain control circuit 2574 may subtract the temperature induced transceiver circuitry gain change from the transceiver gain delta to generate the pseudo-envelope follower gain control signal. (Step 2724.)

Otherwise, based on a determination to generate a compensation factor for a difference between the present transceiver frequency and the calibration transceiver frequency, the pseudo-envelope follower gain control circuit 2574 may determine compensation value for transceiver frequency as a function of the transceiver frequency and the calibration transceiver frequency used during calibration of the iso-gain contours stored in the stored in the $V_{CC}$ look up table 2586. (Step 2726.)

The pseudo-envelope follower gain control circuit 2574 may obtain the transceiver frequency to be used during the data transmission. For example, in some embodiments, the pseudo-envelope follower gain control circuit 2574 may obtain or receive the transceiver frequency to be used during the data transmission from the baseband controller 2511, the controller 50, or the digital baseband circuit 2510. For example, the transceiver frequency may be based on the band of operation of the communication device. The controller 50 or the baseband controller 2511 may configure the oscillator 2558 to generate a carrier signal 2558A having a transceiver frequency substantially equal to the transceiver frequency to be used during the data transmission. (Step 2728.)

The pseudo-envelope follower gain control circuit 2574 may obtain the calibration transceiver frequency used during calibration of the iso-gain contours stored in the $V_{CC}$ look up table 2586. For example, the pseudo-envelope follower gain control circuit 2574 may obtain or receive the calibration transceiver frequency used during calibration of the iso-gain contours from the controller 50, the baseband controller 2511, or from a memory local to the digital baseband circuit 2510. In some embodiments, the pseudo-envelope follower gain control circuit 2574 may receive the calibration transceiver frequency used during calibration of the iso-gain contours prior to initiation of a data transmission. (Step 2730.) The pseudo-envelope follower gain control circuit 2574 may subtract the calibration transceiver frequency from the transceiver frequency to be used during transmission to determine a transceiver frequency delta. (Step 2732.)

Thereafter, the pseudo-envelope follower gain control circuit 2574 may determine a transceiver frequency induced gain change based on the transceiver frequency delta and a known transceiver gain change characteristic/function for the transceiver circuitry with respect to a change in the transceiver frequency. (Step 2734.) The pseudo-envelope follower gain control circuit 2574 may subtract the temperature induced transceiver circuitry gain change and the transceiver frequency induced gain change from the transmit-gain setting delta to generate the pseudo-envelope follower gain control signal. (Step 2736.)

The pseudo-envelope follower gain control circuit 2574 may scale the envelope magnitude as a function of the pseudo gain control signal to generate an index input signal for the $V_{CC}$ look up table 2586 that provides an emulation of the input power $P_{IN}$ of the modulated radio frequency input signal provided to the radio frequency power amplifier. (Step 2738.)

The pseudo-envelope follower gain control circuit 2574 may generate a control signal to substantially operate on a single iso-gain contour related to the transmit-target output power setting parameter to minimize distortion in response to an increase in the input power $P_{IN}$ of the modulated radio frequency input signal provided to the radio frequency power amplifier (Step 2740.). Thereafter, the digital baseband circuit 2510 may commence the data transmission. (Step 2742.)

Those skilled in the art will recognize improvements and modifications to the embodiments of the present disclosure. All such improvements and modifications are considered within the scope of the concepts disclosed herein and the claims that follow.

What is claimed is:

1. Circuitry comprising:
   configuration-feedback circuitry configured to regulate an output power from a radio frequency power amplifier based on a difference between a target output power from the radio frequency power amplifier and a measured output power from the radio frequency power amplifier; and
   transceiver circuitry configured to regulate a modulated power supply voltage, which is used by the radio frequency power amplifier to provide power for amplification, based on the difference between the target output power from the radio frequency power amplifier and the measured output power from the radio frequency power amplifier, wherein:
      the transceiver circuitry is further configured to provide a modulated radio frequency input signal to the radio frequency power amplifier;
      the transceiver circuitry comprises a $V_{CC}$ look up table;
      the modulated power supply voltage is based on the $V_{CC}$ look up table; and
      a $V_{CC}$ look up table index signal is configured to provide an index signal into the $V_{CC}$ look up table that substantially emulates an input power of the modulated radio frequency input signal.

2. The circuitry of claim 1 wherein the configuration-feedback circuitry is further configured to regulate the output power from the radio frequency power amplifier, such that the measured output power from the radio frequency power amplifier is about equal to the target output power from the radio frequency power amplifier.

3. The circuitry of claim 1 wherein:
   the transceiver circuitry is further configured to provide a modulated radio frequency input signal having an input power to the radio frequency power amplifier;
   the radio frequency power amplifier is configured to generate an amplified radio frequency output signal based on the input power of the modulated radio frequency input signal and the modulated power supply voltage;
   the measured output power from the radio frequency power amplifier is representative of the output power from the radio frequency power amplifier; and
   a measured amplified radio frequency output signal is representative of the measured output power from the radio frequency power amplifier.

4. The circuitry of claim 1 further comprising the radio frequency power amplifier.

5. The circuitry of claim 1 wherein the configuration-feedback circuitry is further configured to:

receive a measured amplified radio frequency output signal;
provide a transmit-target power setting signal, which is based on a transmit-target power setting parameter; and
provide a transmit-gain setting signal, which is based on a transmit-gain setting parameter.

6. The circuitry of claim 5 wherein:
the transmit-target power setting parameter is representative of the target output power from the radio frequency power amplifier; and
the transmit-gain setting parameter is representative of a transmit-gain setting of the transceiver circuitry.

7. The circuitry of claim 5 wherein the transmit-gain setting parameter is based on the measured amplified radio frequency output signal and the transmit-target power setting parameter.

8. The circuitry of claim 5 wherein the transceiver circuitry is further configured to provide and adjust an input power of a modulated radio frequency input signal to the radio frequency power amplifier based on the transmit-target power setting parameter and the transmit-gain setting parameter.

9. The circuitry of claim 5 wherein the transceiver circuitry is further configured to adjust the transmit-gain setting parameter in response to changes in bias settings of the transceiver circuitry.

10. The circuitry of claim 5 wherein the transceiver circuitry is further configured to adjust the transmit-gain setting parameter in response to temperature changes of the transceiver circuitry.

11. The circuitry of claim 5 wherein the transceiver circuitry is further configured to adjust the transmit-gain setting parameter in response to changes in a voltage standing wave ratio associated with the radio frequency power amplifier.

12. The circuitry of claim 5 wherein the transceiver circuitry is further configured to adjust the transmit-gain setting parameter in response to changes in a transmit frequency of the radio frequency power amplifier.

13. The circuitry of claim 1 wherein an envelope tracking power converter system is configured to generate the modulated power supply voltage based on a control signal.

14. The circuitry of claim 13 further comprising the envelope tracking power converter system.

15. The circuitry of claim 1 wherein:
the transceiver circuitry is further configured to receive an I/Q signal and provide a modulated radio frequency input signal to the radio frequency power amplifier;
the modulated power supply voltage is based on the I/Q signal; and
the modulated radio frequency input signal is based on the I/Q signal.

16. The circuitry of claim 1 wherein:
the modulated power supply voltage is based on a control signal; and
the transceiver circuitry is further configured to adjust the modulated power supply voltage via the control signal to compensate for changes of a transmit-gain setting of the transceiver circuitry.

17. The circuitry of claim 1 wherein the transceiver circuitry is further configured to adjust the $V_{CC}$ look up table index signal in response to changes in bias settings of the transceiver circuitry.

18. The circuitry of claim 1 wherein the transceiver circuitry is further configured to adjust the $V_{CC}$ look up table index signal in response to temperature changes of the transceiver circuitry.

19. The circuitry of claim 1 wherein the transceiver circuitry is further configured to adjust the $V_{CC}$ look up table index signal in response to changes in a voltage standing wave ratio associated with the radio frequency power amplifier.

20. The circuitry of claim 1 wherein the transceiver circuitry is further configured to adjust the $V_{CC}$ look up table index signal in response to changes in a transmit frequency of the radio frequency power amplifier.

21. The circuitry of claim 1 wherein the transceiver circuitry is further configured to adjust the $V_{CC}$ look up table index signal in response to changes of a transmit-gain setting of the transceiver circuitry.

22. The circuitry of claim 1 wherein the transceiver circuitry further comprises a pseudo-envelope follower gain control circuit, which is configured to provide a gain control signal based on a transmit-gain setting of the transceiver circuitry, such that the $V_{CC}$ look up table index signal is based on the gain control signal.

23. The circuitry of claim 22 wherein the gain control signal is further based on a difference between a calibration transmit-gain setting of the transceiver circuitry and the transmit-gain setting of the transceiver circuitry.

24. The circuitry of claim 22 wherein the gain control signal is further based on a difference between a calibration temperature of the transceiver circuitry and a measured temperature of the transceiver circuitry.

25. The circuitry of claim 22 wherein the gain control signal is further based on a difference between a calibration transmit frequency of the radio frequency power amplifier and a transmit frequency of the radio frequency power amplifier.

26. The circuitry of claim 22 wherein the gain control signal is further based on at least one of a difference between a calibration transmit-gain setting of the transceiver circuitry and the transmit-gain setting of the transceiver circuitry, the difference between a calibration temperature of the transceiver circuitry and a measured temperature of the transceiver circuitry, and a difference between a calibration transmit frequency of the radio frequency power amplifier and a transmit frequency of the radio frequency power amplifier.

27. A method comprising:
regulating an output power from a radio frequency power amplifier based on a difference between a target output power from the radio frequency power amplifier and a measured output power from the radio frequency power amplifier;
regulating a modulated power supply voltage, which is used by the radio frequency power amplifier to provide power for amplification, based on the difference between the target output power from the radio frequency power amplifier and the measured output power from the radio frequency power amplifier;
providing a modulated radio frequency input signal to the radio frequency power amplifier;
providing a $V_{CC}$ look up table, wherein the modulated power supply voltage is based on the $V_{CC}$ look up table; and
providing an index signal into the $V_{CC}$ look up table that substantially emulates an input power of the modulated radio frequency input signal.

* * * * *